(12) United States Patent
Schmidhammer et al.

(10) Patent No.: US 12,231,112 B2
(45) Date of Patent: Feb. 18, 2025

(54) BRIDGE-TYPE FILTERS

(71) Applicant: RF360 EUROPE GMBH, Munich (DE)

(72) Inventors: Edgar Schmidhammer, Stein an der Traun (DE); Marc Esquius Morote, Munich (DE); Juha Sakari Ella, Salo (FI)

(73) Assignee: RF360 Singapore Pte. Ltd., Singapore (SG)

( * ) Notice: Subject to any disclaimer, the term of this patent is extended or adjusted under 35 U.S.C. 154(b) by 0 days.

(21) Appl. No.: 17/934,414

(22) Filed: Sep. 22, 2022

(65) Prior Publication Data

US 2023/0299741 A1   Sep. 21, 2023

Related U.S. Application Data

(60) Provisional application No. 63/269,441, filed on Mar. 16, 2022.

(51) Int. Cl.
*H03H 9/54* (2006.01)
*G06F 3/14* (2006.01)
(Continued)

(52) U.S. Cl.
CPC ............. *H03H 9/542* (2013.01); *G06F 3/14* (2013.01); *H03H 9/205* (2013.01); *H03H 9/60* (2013.01); *H03H 9/70* (2013.01)

(58) Field of Classification Search
CPC .......... H03H 9/542; H03H 9/205; H03H 9/60; H03H 9/70; H03H 9/009; H03H 9/6483;
(Continued)

(56) References Cited

U.S. PATENT DOCUMENTS 3,344,368 A   9/1967   Alfred
9,240,622 B2  1/2016   Schmidhammer et al.
(Continued)

FOREIGN PATENT DOCUMENTS

DE   10234686 A1   9/2003
WO   03071677 A1   8/2003
(Continued)

OTHER PUBLICATIONS

International Search Report and Written Opinion—PCT/EP2023/054788—ISA/EPO—Jun. 9, 2023.
(Continued)

*Primary Examiner* — Wesner Sajous
(74) *Attorney, Agent, or Firm* — Colby Nipper

(57) ABSTRACT

An apparatus is disclosed for a lattice-type filter. In example aspects, the apparatus includes a filter circuit having a first port that is single-ended and a second port that is single-ended. The filter circuit also includes a transformer, a first resonator, a second resonator, a third resonator, and a fourth resonator. The transformer includes a first terminal, a second terminal, and a third terminal, with the third terminal coupled to the second port. The first resonator is coupled between the first port and the first terminal of the transformer. The second resonator is coupled between the first port and the second terminal of the transformer. The third resonator is coupled between the first terminal of the transformer and a ground. The fourth resonator is coupled between the second terminal of the transformer and the ground.

46 Claims, 50 Drawing Sheets

(51) Int. Cl.
*H03H 9/00* (2006.01)
*H03H 9/205* (2006.01)
*H03H 9/60* (2006.01)
*H03H 9/70* (2006.01)
*H04B 1/52* (2015.01)
*H04B 1/71* (2011.01)

(58) Field of Classification Search
CPC ...... H03H 9/0028; H03H 9/547; H03H 9/605; H03H 9/6409; H03H 9/0095; H03H 9/72; H03H 9/706; H03H 7/42; H03H 7/0138; H03H 7/38; H03H 7/09; H03H 7/1775; H04B 1/40; G06F 3/14
See application file for complete search history.

(56) References Cited

U.S. PATENT DOCUMENTS

| | | | | |
|---|---|---|---|---|
| 9,948,278 | B2* | 4/2018 | Okuda | H03H 9/0576 |
| 10,484,022 | B2 | 11/2019 | Nilsson et al. | |
| 11,750,174 | B2* | 9/2023 | Ando | H03H 9/725 |
| | | | | 370/277 |
| 11,881,834 | B2* | 1/2024 | Yandrapalli | H03H 9/02031 |
| 2003/0042995 | A1 | 3/2003 | Ella | |
| 2003/0128081 | A1 | 7/2003 | Ella et al. | |
| 2003/0197578 | A1 | 10/2003 | Shibahara | |
| 2004/0140866 | A1 | 7/2004 | Taniguchi | |
| 2005/0212619 | A1 | 9/2005 | Aigner et al. | |
| 2008/0101263 | A1* | 5/2008 | Barber | H04B 1/52 |
| | | | | 370/282 |
| 2009/0315640 | A1* | 12/2009 | Umeda | H03H 9/725 |
| | | | | 333/133 |
| 2013/0090080 | A1 | 4/2013 | Schmidt | |
| 2013/0169378 | A1 | 7/2013 | Kim et al. | |
| 2015/0236842 | A1 | 8/2015 | Goel et al. | |
| 2017/0070205 | A1 | 3/2017 | Hashemi et al. | |
| 2017/0141757 | A1 | 5/2017 | Schmidhammer | |
| 2018/0076793 | A1 | 3/2018 | Khlat et al. | |
| 2018/0123555 | A1 | 5/2018 | Lee | |
| 2018/0331671 | A1 | 11/2018 | Jian et al. | |
| 2018/0358947 | A1 | 12/2018 | Mateu et al. | |
| 2020/0287520 | A1 | 9/2020 | Kamgaing et al. | |
| 2021/0384890 | A1 | 12/2021 | Schmidhammer | |
| 2022/0247385 | A1* | 8/2022 | Esquius Morote | H03H 9/25 |
| 2023/0093885 | A1 | 3/2023 | Ella et al. | |
| 2023/0318574 | A1 | 10/2023 | Damy et al. | |
| 2023/0353117 | A1 | 11/2023 | Schmidhammer et al. | |
| 2024/0007075 | A1 | 1/2024 | Tabrizian et al. | |
| 2024/0014803 | A1 | 1/2024 | Khlat | |
| 2024/0039576 | A1 | 2/2024 | Elaasar et al. | |
| 2024/0105718 | A1 | 3/2024 | Chu et al. | |

FOREIGN PATENT DOCUMENTS

| | | |
|---|---|---|
| WO | 2019185285 A1 | 10/2019 |
| WO | 2020114849 A1 | 6/2020 |

OTHER PUBLICATIONS

Sauerland F., et al., "Ceramic IF Filters for Consumer Products", IEEE Spectrum, IEEE Inc, New York, US, vol. 5, No. 11, Nov. 30, 1968, pp. 112-126, XP008090908, ISSN: 0018-9235, p. 10, col. 1, Line 7-Line 45, Figure 20B, paragraph [0068], figure 6.

Arrawatia M., et al., "A CMOS Power Amplifier with 180° Hybrid On-Chip Coupler for 4G Applications", IEEE 58th International Midwest Symposium on Circuits and Systems (MWSCAS), 2015, 4 pages.

Constantinescu F., et al., "Behavioral Circuit Models of Power BAW Resonators and Filters", DOI: 10.1007/s10470-011-9758-7, Analog Integrated Circuits and Signal Processing, Oct. 2012, 9 Pages.

Hartmann C.S., et al., "Modeling of Saw Transversely Coupled Resonators Filters using Coupling-of-Modes Modeling Technique", IEEE Ultrasonics Symposium, 1992, pp. 39-43.

Kerherve., et al., "BAW Technologies: Development and Applications within MARTINA, MIMOSA and MOBILIS IST European Projects", Oct. 2006, pp. 341-350.

Co-pending U.S. Appl. No. 17/934,414, inventor Schmidhammer; Edgar, filed Sep. 22, 2022.

Lin S-C., "Microstrip Dual/Quad-Band Filters with Coupled Lines and Quasi-Lumped Impedance Inverters Based on Parallel-Path Transmission", IEEE Transactions on Microwave Theory and Techniques, USA, vol. 59, No. 8, Aug. 31, 2011, pp. 1937-1946, XP011349988, figures 1, 2.

Yang Q., et al., "A Wideband Bulk Acoustic Wave Filter with Modified Lattice Configuration", 2015 IEEE MTT-S International Microwave Symposium, May 17, 2015, 4 pages, XP033181252, figure 4.

Pursuant to MPEP § 2001.6(b) the applicant brings the following co-pending application to the Examiner's attention: U.S. Appl. No. 17/934,437.

* cited by examiner

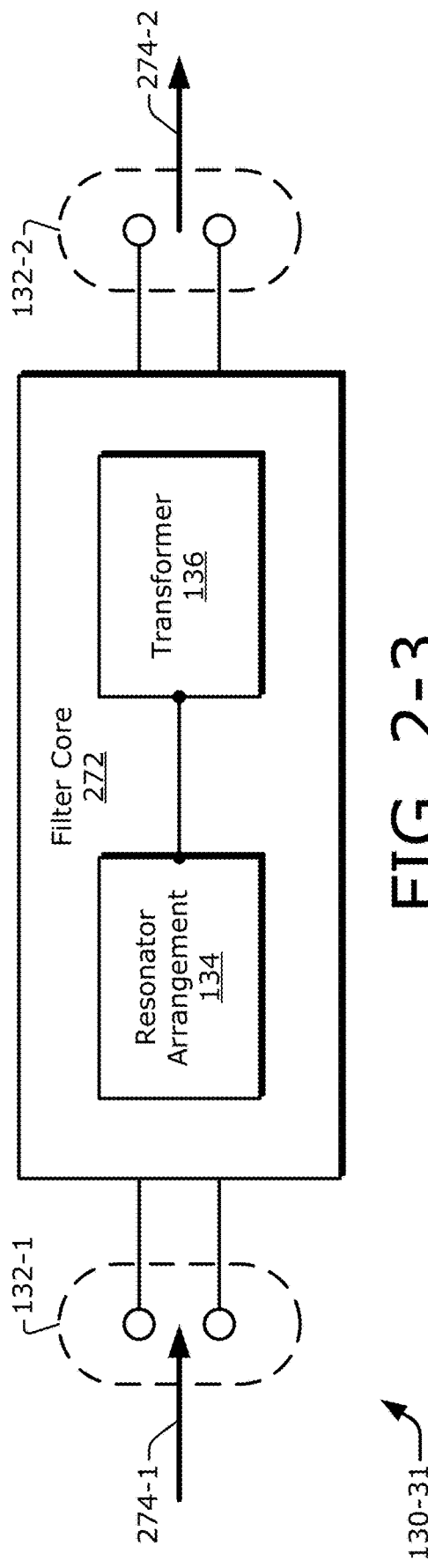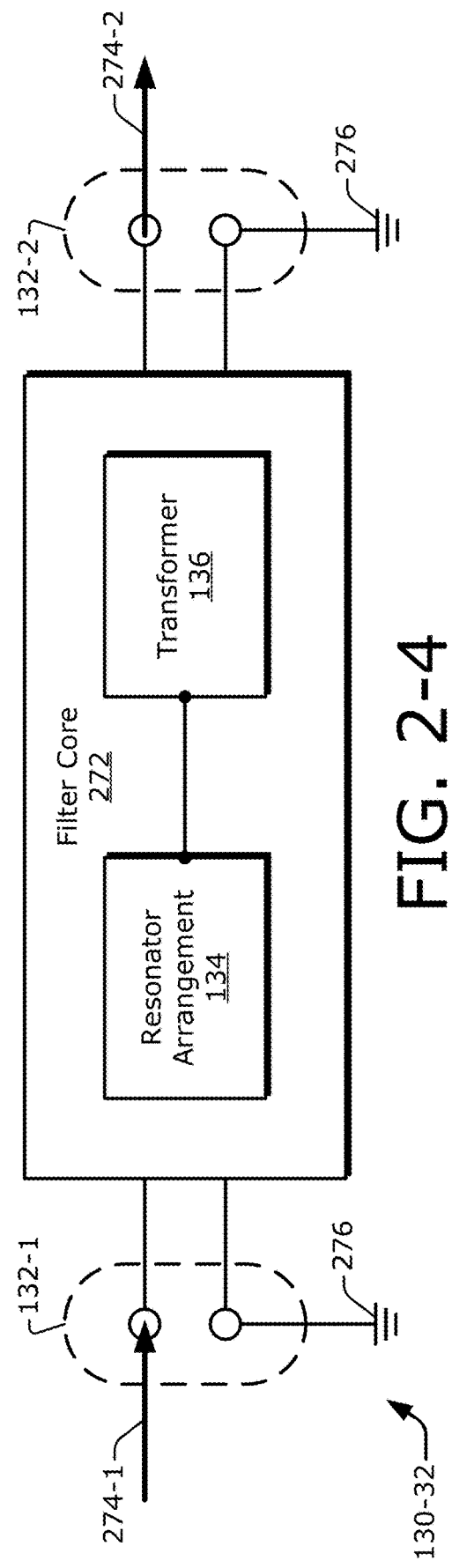

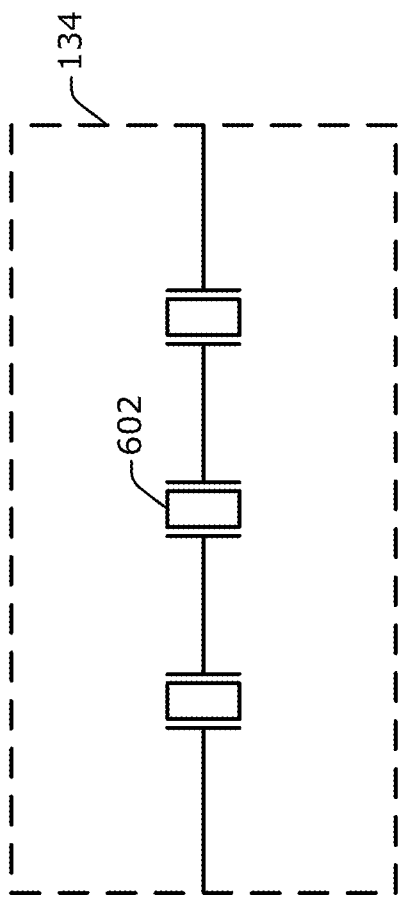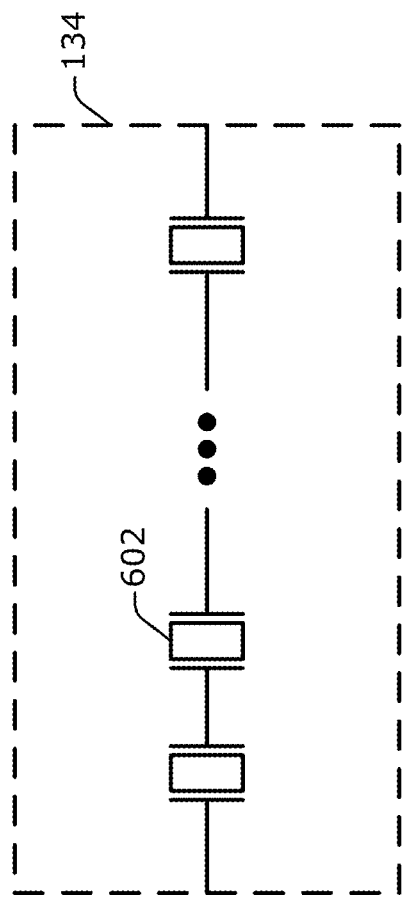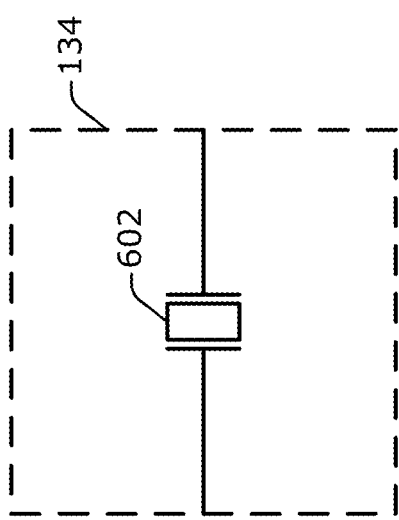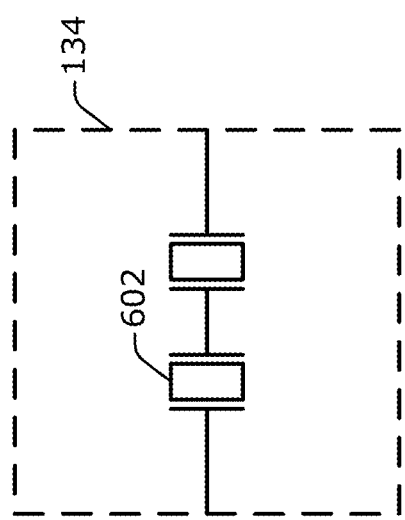
FIG. 14-4

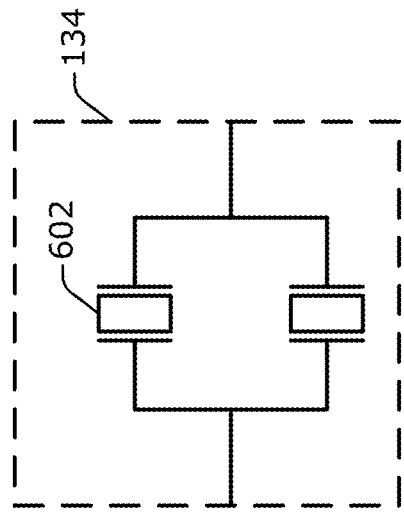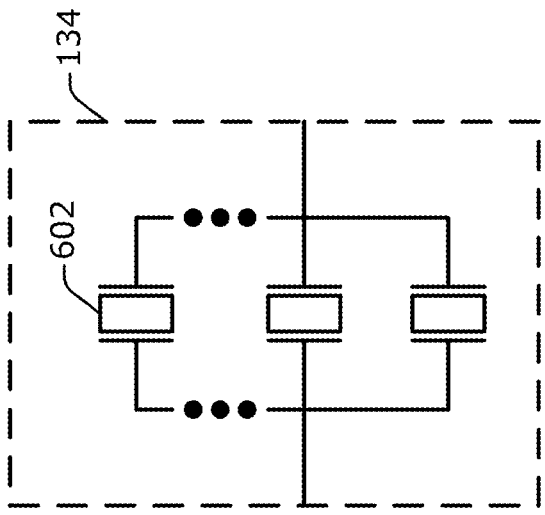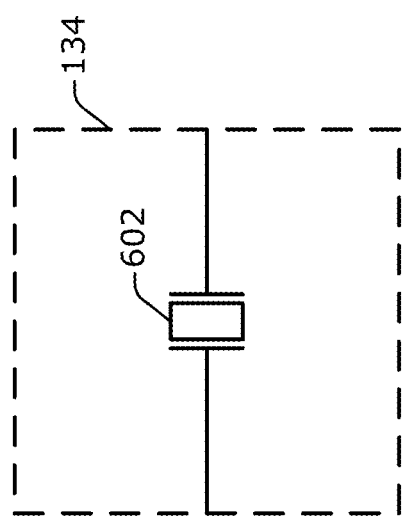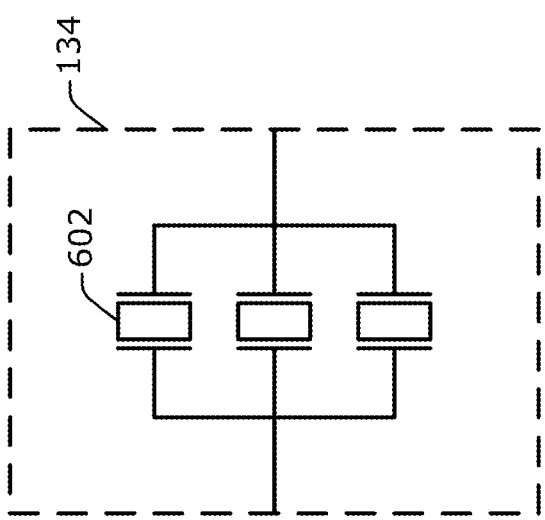
FIG. 14-5

BRIDGE-TYPE FILTERS

CROSS-REFERENCE TO OTHER APPLICATION(S)

This application claims the benefit of U.S. Provisional Patent Application No. 63/269,441, filed 16 Mar. 2022, the disclosure of which is hereby incorporated by reference in its entirety herein.

TECHNICAL FIELD

This disclosure relates generally to signal communication or signal processing using an electronic device and, more specifically, to employing a bridge-type filter for signal communication or processing.

BACKGROUND

Electronic devices include traditional computing devices such as desktop computers, notebook computers, smartphones, wearable devices like a smartwatch, internet servers, and so forth. Electronic devices also include other types of computing devices such as personal voice assistants (e.g., smart speakers), wireless access points or routers, thermostats and other automated controllers, robotics, automotive electronics, devices embedded in other machines like refrigerators and industrial tools, Internet of Things (IoT) devices, medical devices, and so forth. These various electronic devices provide services relating to productivity, communication, social interaction, security, health and safety, remote management, entertainment, transportation, and information dissemination. Thus, electronic devices play crucial roles in modern society.

Many of the services provided by electronic devices in today's interconnected world depend at least partly on electronic communications. Electronic communications can include, for example, those exchanged between two or more electronic devices using wireless or wired signals that are transmitted over one or more networks, such as the Internet, a Wi-Fi® network, or a cellular network. Electronic communications can therefore include wireless or wired transmissions and receptions. To transmit and receive communications, an electronic device can use a transceiver, such as a wireless transceiver that is designed for wireless communications.

Electronic communications can therefore be realized by propagating signals between two wireless transceivers at two different electronic devices. For example, using a wireless transmitter, a smartphone can transmit a wireless signal to a base station over the air as part of an uplink communication to support mobile services. Using a wireless receiver, the smartphone can receive a wireless signal that is transmitted from the base station via the air medium as part of a downlink communication to enable mobile services. With a smartphone, mobile services can include making voice and video calls, participating in social media interactions, sending messages, watching movies, sharing videos, and performing searches. Other mobile services can include using map information or navigational instructions, finding friends, engaging in location-based services generally, transferring money, obtaining another service like a car ride, and so forth.

Many of these mobile services depend at least partly on the transmission or reception of wireless signals between two or more electronic devices. Consequently, researchers, electrical engineers, and designers of electronic devices strive to develop wireless transceivers that can use wireless signals effectively to provide these and other mobile services.

SUMMARY

A wireless transceiver or a radio-frequency (RF) front-end can include a filter that passes the desired frequencies of a signal but suppresses the undesired ones. An example type of filter is the bridge filter, which can include lattice-type filters. This document describes, for example, a lattice filter that can operate with one transformer, which saves space and reduces costs relative to filters having multiple transformers. A lattice-type filter example includes a common node and two signal paths coupled between the common node and two terminals of a transformer. Each respective path can have a series resonator and a shunt resonator. Described implementations of this lattice-type filter can operate as being singled-ended at two ports or as being singled-ended at one port and differential at another port. In some implementations, each resonator can be realized with an acoustic resonator arrangement including multiple acoustic resonators. At least two acoustic resonators within a given acoustic resonator arrangement may have different characteristics from one another. In other implementations, a capacitor can be coupled across two terminals of the transformer of the lattice-type filter. The two terminals of the transformer may be the same terminals to which the first and second paths are coupled. In further implementations, an inductor can be asymmetrically coupled to a terminal of the transformer of the lattice-type filter. The terminal to which the asymmetric inductor is coupled may be one of the of the two terminals to which the first and second paths are coupled, and an inductor can be omitted from the other of these two terminals of the transformer.

In an example aspect, an apparatus is disclosed. The apparatus includes a filter circuit. The filter circuit includes a first port that is single-ended and a second port that is single-ended. The filter circuit also includes a transformer having a first terminal, a second terminal, and a third terminal, with the third terminal coupled to the second port. The filter circuit further includes: a first resonator coupled between the first port and the first terminal of the transformer, a second resonator coupled between the first port and the second terminal of the transformer, a third resonator coupled between the first terminal of the transformer and a ground, and a fourth resonator coupled between the second terminal of the transformer and the ground.

In an example aspect, an apparatus for filtering signals is disclosed. The apparatus includes a filter circuit. The filter circuit includes a first port and a second port having a terminal that is coupled to a ground. The filter circuit also includes a transformer having a first terminal, a second terminal, and a third terminal, with the third terminal coupled to another terminal of the second port. The filter circuit further includes: first means for resonating coupled between the first port and the first terminal of the transformer, second means for resonating coupled between the first port and the second terminal of the transformer, third means for resonating coupled between the first terminal of the transformer and the ground, and fourth means for resonating coupled between the second terminal of the transformer and the ground.

In an example aspect, a method for filtering signals and/or operating a lattice-type filter is disclosed. The method includes converting between a first signal and a first signal component and a second signal component. The method also includes propagating the first signal component through a first resonator and across a third resonator and propagating the second signal component through a second resonator and across a fourth resonator. The method additionally includes routing the first signal component between the third resonator and a first terminal of a transformer and routing the second signal component between the fourth resonator and a second terminal of the transformer. The method further includes converting, using the transformer, between differential signaling of the first signal component and the second signal component and single-ended signaling of a second signal.

In an example aspect, an apparatus is disclosed. The apparatus includes a filter circuit. The filter circuit includes a first port that is single-ended and a second port that is single-ended. The filter also includes a transformer having a first terminal, a second terminal, and a third terminal, with the third terminal coupled to the second port. The filter additionally includes: a first resonator coupled between the first port and the first terminal of the transformer, a second resonator coupled between the first port and the second terminal of the transformer, a third resonator coupled between the first terminal of the transformer and a ground, and a fourth resonator coupled between the second terminal of the transformer and the ground. The filter further includes an inductor coupled to the second terminal of the transformer.

In an example aspect, an apparatus is disclosed. The apparatus includes a filter circuit. The filter circuit includes a transformer having a first inductor and a second inductor electromagnetically coupled to the first inductor. A first terminal of the second inductor coupled to an output port of the filter circuit, and a second terminal of the second inductor coupled to a ground. The filter circuit also includes a first resonator arrangement, a second resonator arrangement, a third resonator arrangement, and a fourth resonator arrangement. The first resonator arrangement is coupled between an input port of the filter circuit and a first terminal of the first inductor of the transformer. The second resonator arrangement is coupled between the input port and a second terminal of the first inductor. The third resonator arrangement is coupled between the first terminal of the first inductor and the ground. The fourth resonator arrangement is coupled between the second terminal of the first inductor and the ground.

In an example aspect, an apparatus is disclosed. The apparatus includes a filter circuit. The filter circuit includes a first port and a second port. The filter circuit also includes a transformer having a first terminal, a second terminal, a third terminal, and a fourth terminal. The third terminal is coupled to the second port, and the fourth terminal is coupled to a ground. The filter circuit additionally includes a first resonator coupled between the first port and the first terminal of the transformer and a second resonator coupled between the first port and the second terminal of the transformer. The filter circuit further includes a third resonator coupled between the first terminal of the transformer and the ground and a fourth resonator coupled between the second terminal of the transformer and the ground.

BRIEF DESCRIPTION OF DRAWINGS

FIG. 2-1 is a schematic diagram illustrating an example radio-frequency (RF) front-end and an example transceiver that can each include at least one filter circuit.

FIG. 2-2 is a schematic diagram illustrating an example RF front-end (RFFE) that can include one or more filter circuits coupled between at least one antenna and one or more amplifiers.

FIGS. 2-3 and 2-4 are schematic diagrams illustrating filter circuits having example filter cores and two example signaling schemes for ports of the filter circuits.

FIGS. 3-1 to 3-7 are circuit diagrams illustrating example bridge-type filter architectures that are realized using multiple acoustic resonators and at least one transformer or phase shifter.

FIG. 4 is a schematic diagram illustrating an example lattice-type filter having two transformers.

FIG. 5-1 is a schematic diagram illustrating an example lattice-type filter including one transformer, multiple resonator arrangements, and two single-ended ports.

FIG. 5-2 is a schematic diagram illustrating an example lattice-type filter including one transformer, multiple resonator arrangements, a single-ended port, and a differential port.

FIG. 6 is a circuit diagram illustrating an example lattice-type filter core in which each resonator arrangement is realized with an example of one acoustic resonator.

FIGS. 7-1 and 7-2 are circuit diagrams illustrating example lattice-type filter cores in which each resonator arrangement is realized with an example of two acoustic resonators in a series and parallel coupling, respectively.

FIGS. 8-1 and 8-2 are circuit diagrams illustrating example lattice-type filter cores in which each resonator arrangement is realized with an example of three acoustic resonators in a series and parallel coupling, respectively.

FIGS. 9-1 and 9-2 are circuit diagrams illustrating example lattice-type filter cores in which each resonator arrangement is realized with an example of four acoustic resonators in different combinations of series and parallel couplings.

FIG. 14-1 is a schematic diagram illustrating a filter core that has an example resonator arrangement including multiple acoustic resonators that can be coupled together in series, in parallel, or in a combination of series and parallel couplings.

FIGS. 14-2 and 14-3 are circuit diagrams illustrating example lattice-type filter architectures with multiple series couplings of acoustic resonators.

FIGS. 14-4 to 14-6 are circuit diagrams of example resonator arrangements that each include one or more acoustic resonators to illustrate how each bridge-type filter architecture (e.g., of FIGS. 3-1 to 3-7) can employ multiple acoustic resonators per resonator arrangement.

FIG. 14-7 depicts a circuit diagram illustrating relationships of static capacitances between a given acoustic resonator and a realization thereof that includes a series coupling or a parallel coupling of multiple acoustic resonators.

FIG. 15-1 is a schematic diagram illustrating an example of multiple acoustic filter cores cascaded together in series between two ports using coupling circuitry.

FIG. 15-2 is a circuit diagram illustrating an example of two second-order filter cores, which have a lattice architecture, cascaded together in series.

FIGS. 15-3 and 15-4 are circuit diagrams illustrating examples of two fourth-order filter cores, which have a lattice architecture, cascaded together in series with the acoustic resonators of each resonator arrangement coupled together in parallel and in series, respectively.

FIG. 15-5 is a circuit diagram illustrating an example of two second-order filter cores, which have different lattice-type architectures, cascaded together in series.

FIGS. 15-6 and 15-7 are circuit diagrams illustrating examples of two second-order filter cores, which each have a lattice architecture, cascaded together in series with the inclusion of one or more additional acoustic resonators in a parallel or a series connection, respectively.

FIG. 16-1 is a schematic diagram illustrating an example of an impedance inverter coupled to a filter core, such as one of a bridge-type filter architecture that employs one or more acoustic resonators.

FIGS. 16-2 and 16-3 are circuit diagrams illustrating examples of two second-order filter cores, which have two different respective lattice-type architectures, that are coupled to an impedance inverter.

FIG. 16-4 is a circuit diagram illustrating an example of a second-order filter core, which has another bridge-type architecture, that is coupled to an impedance inverter.

FIG. 17-1 is a schematic diagram illustrating an example of a bridge filter having a filter core with a serial resonator arrangement and a parallel resonator arrangement to provide a band-stop filter response.

FIGS. 17-2 to 17-7 are circuit diagrams illustrating examples of how each bridge-type filter architecture (e.g., of FIGS. 3-1 to 3-6, respectively) can employ a serial resonator arrangement and a parallel resonator arrangement to provide a band-stop filter response.

DETAILED DESCRIPTION

Introduction and Overview

Figure 1:
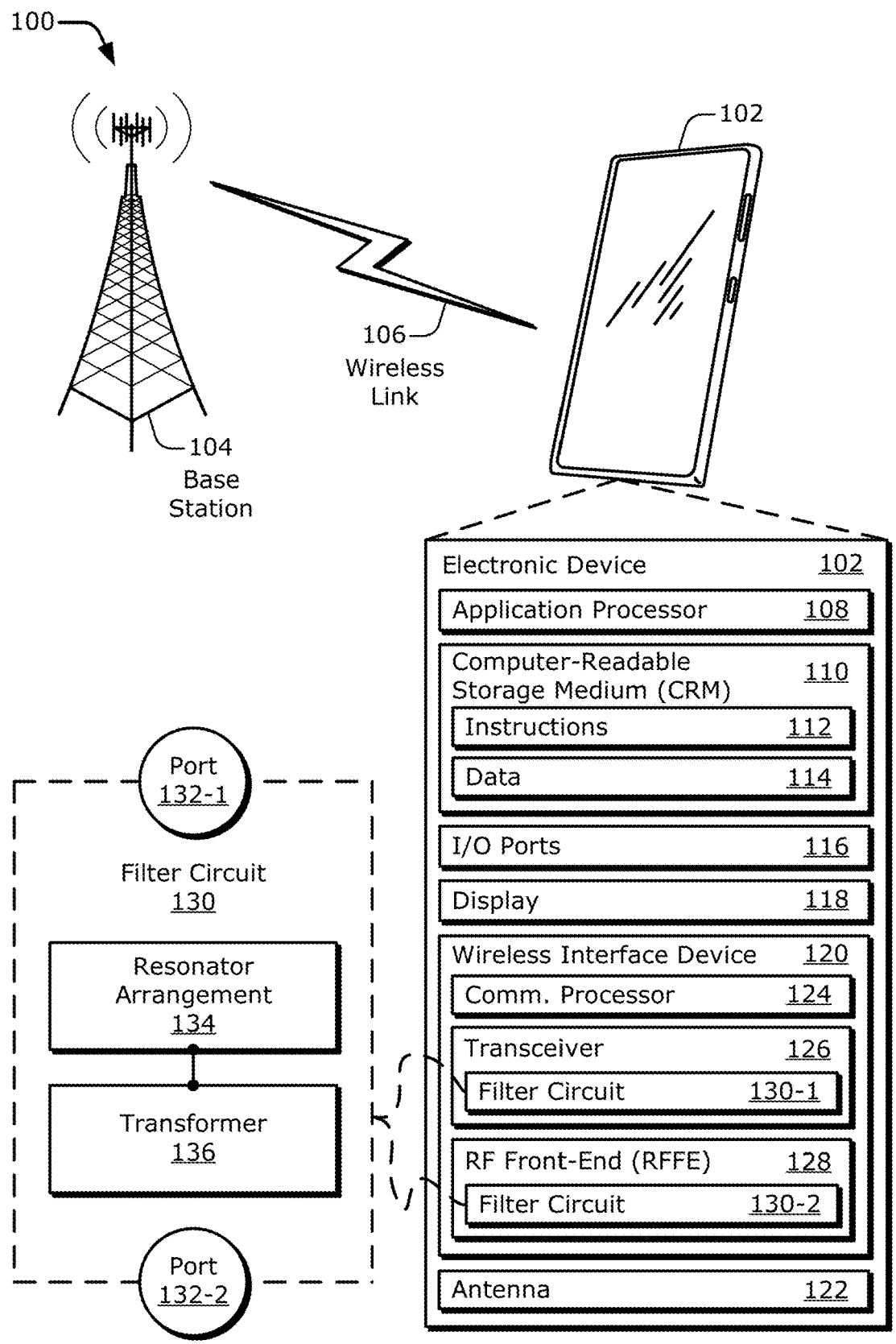
FIG. 1 illustrates an environment with an example electronic device that has a wireless interface device, which includes at least one example filter circuit.

To facilitate transmission and reception of wireless signals, an electronic device can use a wireless interface device that includes a wireless transceiver and/or a radio-frequency (RF) front-end. Electronic devices communicate with wireless signals using electromagnetic (EM) signals in various frequencies that exist on a portion of the EM spectrum. These wireless signals may travel between two electronic devices at a particular frequency, such as a kilohertz (kHz) frequency, a megahertz (MHz) frequency, or a gigahertz (GHz) frequency. The EM spectrum is, however, a finite resource that limits how many signals can be simultaneously communicated in any given spatial area. There are already billions of electronic devices that use this limited resource. To enable a greater number of simultaneous communications using EM signaling, the finite EM spectrum can be shared among electronic devices. The EM spectrum can be shared using, for instance, frequency division multiplexing (FDM) and/or time division multiplexing (TDM) techniques.

Techniques for FDM or TDM can entail separating the EM spectrum into different frequency bands and constraining communications to occur within an assigned frequency band. Signals in different frequency bands can be communicated at the same time in a same area without significantly interfering with each other. To transmit a signal within a target frequency band, a transmitter can apply a filter to the signal. The filter passes the frequencies of the target frequency band and suppresses (e.g., attenuates, reduces, or blocks) other frequencies. Although filters support FDM and/or TDM techniques to facilitate efficient sharing of the EM spectrum, filters can create difficulties with electronic devices that communicate wirelessly, e.g., in terms of increasing the cost or size of electronic devices.

A wireless transceiver or an RF front-end of an electronic device can include a filter that passes the desired frequencies of a signal within a target frequency band but suppresses the undesired ones outside of the band. Some filters use combinations of inductors and capacitors to suppress frequencies. Other filters use acoustic resonators, like a bulk acoustic wave (BAW) resonator or a surface acoustic wave (SAW) resonator, to filter frequencies using a piezoelectric material. Each acoustic resonator may be associated with a resonant frequency that corresponds to which frequency or frequencies can be passed or suppressed using the acoustic resonator. Filters can also include one or more transformers to act as a balun to process balanced and unbalanced signals.

Thus, filters can use transformers, acoustic resonators, capacitors, and/or inductors to achieve a desired filter response. Further, some electronic devices have multiple instances of such filters to enable communication across different frequency bands. Consequently, an electronic device can include numerous instances of any of these components. Each of these components, however, has an associated financial cost in terms of manufacturing, such as fabrication or assembly efforts. Each component also has a corresponding spatial cost in terms of a physical size that occupies a volume within a housing of an electronic device. Additional expense or increased size may be particularly relevant factors for price-sensitive or mobile devices.

Reducing a quantity of filter-related components that are employed within an electronic device can therefore lower the cost of an electronic device and enable it to have a smaller form factor for easer portability. Nonetheless, cost and size are not the only factors to be considered when designing filters. Filters are also expected to meet certain other parameters to achieve a desired level of filter performance. Such other parameters can include frequency response, noise suppression, in-band performance, out-of-band suppression, combinations thereof, and so forth. Implementations for filters are described below that can balance these various factors of cost, size, and filter performance to meet various specifications for wireless electronic devices, such as mobile devices and base stations.

With Fifth-Generation (5G) and forthcoming Sixth-Generation (6G) technologies, filters providing relatively wide bandwidths are to be used. Generally, a wireless transceiver or an RF front-end can include a filter that passes the desired frequencies of a signal but suppresses the undesired ones. It is challenging, however, to attain the expected wide bandwidths of 5G and 6G technologies given that commonly employed ladder filters offer a bandwidth that is limited by existing resonator technology. With ladder-type filter designs, it is also difficult to select the number and position of finite transmission zeros (FTZs), which can control the frequencies that are blocked by a filter. Further, the expected linearity and power handling specifications for 5G and 6G devices may not be achievable with ladder filters.

Bridge filters, in contrast, can provide wide bandwidths combined with superior out-of-band attenuation levels using existing resonator technology (e.g., employing micro-acoustic resonators). With a given micro-acoustic resonator technology, the large-signal capabilities (e.g., power handling and linearity) of a bridge filter are superior compared to those of widely used ladder-type architectures. An example type of a bridge filter architecture is a lattice filter. Lattice-type filters can operate with good linearity. Some lattice filters employ a cross-over, or "X-shaped," circuit architecture that is bookended by two transformers. This lattice circuit architecture with cross-over couplings can also be depicted in a box shape. Generally, relative to some other types of bridge filters, a lattice filter may employ a single category of balun (e.g., a transformer) across at least two baluns to increase a symmetry of the signal processing of the filter. This symmetry can involve manufacturing two quite similar transformers, which is difficult to achieve using cost-effective fabrication techniques.

Additionally, transformers, which include two electromagnetically coupled inductors, are relatively large components in some filters. The inductors can be implemented in many different manners, such as coupled coils, coupled lines, and so forth. For example, two transformers may consume over two-thirds of the space occupied by a fourth-order lattice filter. This means that the acoustic resonators of such a lattice filter may occupy less than one-third of the total space consumed by the filter. Although lattice filters can meet some of the expectations for 5G and future 6G technologies, two-transformer lattice filters can occupy an appreciable area of a transceiver or an RFFE of a wireless interface device due in large part to the multiple transformers of such lattice filters.

Lattice-type filter examples that are described herein, however, can operate with one transformer, which saves space and reduces costs. A described lattice filter has an architecture that includes multiple ports and a filter core, which can include resonator circuitry and a transformer. The filter core can include a common node proximate to a port that is "opposite" another port that is near the transformer. The filter core can also include two signal paths, or "paths," that extend between the common node and the transformer. In some cases, each path includes a series or inline resonator and a parallel or shunt resonator. The lattice-type filter can operate as being singled-ended at two ports or as being singled-ended at the port proximate the common node and differential at the other port nearer the transformer. The two paths with inline and shunt resonators can replace the "X-shaped" architecture of some other lattice filters and thereby save space by reducing by 50% the amount of space consumed by the inductors used to form the transformer(s).

In some implementations, each resonator can be realized with an acoustic resonator arrangement including one or more acoustic resonators. With multiple (e.g., two, three, or more) acoustic resonators within an acoustic resonator arrangement, the multiple acoustic resonators may be arranged in series, in parallel, or in a series-parallel combination. For a given acoustic resonator arrangement having multiple acoustic resonators, each respective acoustic resonator can have different characteristics, such as impedances or resonant frequencies, relative to other acoustic resonators within the given acoustic resonator arrangement. By employing different acoustic resonator characteristics within a single acoustic resonator arrangement, the filter response can be established more finely as compared to employing the same characteristics across each acoustic resonator of the single acoustic resonator arrangement. Further, an inline resonator in a first path can have substantially similar characteristics to those of a shunt resonator in a second path.

This enables, in part, the dual-path architecture with shunt resonators to match or mimic the voltages and currents, and thus the frequency response, of the "X-shaped" lattice-type filter that is mentioned above.

In other implementations, a capacitor can be coupled across two terminals of a transformer of the described lattice-type filter. The two terminals of the transformer may be the same terminals to which the first and second paths are coupled. Additionally, the shunt resonator of each respective path may be coupled to the transformer via a respective terminal of the two terminals that the capacitor is coupled across. This capacitor can at least partially compensate for a non-ideal characteristic (e.g., a coupling coefficient, K, that is less than one (K<1)) of a physical transformer.

In further implementations, an inductor can be asymmetrically coupled to a terminal of the transformer. The terminal may be one of the same two terminals to which the first and second signal paths are coupled. Additionally, a shunt resonator of one of the signal paths may be coupled to the transformer via the same terminal to which the asymmetric inductor is coupled. This asymmetric inductor may be coupled between the terminal of the transformer and a ground, but such an inductor may be omitted from the other terminal of the transformer to which a signal path is coupled.

Filters can benefit from producing low errors in terms of the phase and amplitude of propagating signals to provide a defined passband for in-band performance and good frequency rejection for out-of-band performance. Transformer baluns, which may be realized using two inductors, can create a capacitive effect that generates a phase error on at least one side of the transformer (e.g., on the balanced or differential side). This capacitive aspect of the transformer may be counterbalanced using an asymmetrically deployed inductor at a single terminal of a pair of terminals on one side of the transformer. Thus, an asymmetric inductor can at least decrease a phase error that would otherwise be present due to the capacitive coupling between two inductive elements (e.g., two coupled lines) of the transformer.

This document also describes multiple bridge-type filter architectures that can employ acoustic wave resonators. In example implementations, each architecture includes multiple acoustic resonator positions that can be realized with a respective resonator arrangement. These resonator arrangements can be diversified by including multiple acoustic resonators per resonator arrangement. The multiple acoustic resonators of a given resonator arrangement can be coupled together in series, in parallel, or in a combination thereof to tailor the filter for different applications. The multiple acoustic resonators may be coupled together in parallel to lower insertion loss for a receive chain application, or the acoustic resonators may be coupled together in series to increase power handling capabilities for a transmit chain application. Additionally or alternatively, each of the multiple acoustic resonators within a given resonator arrangement can have a different resonant frequency to increase the order of the filter. The higher filter order can increase the selectivity of the filter, such as by producing a more finely tuned frequency response.

In other example implementations, a selectivity of a filter can be increased by cascading in series two filter cores without increasing the order of the filter. Two acoustic cores including at least multiple acoustic resonators per core can be coupled together in series between first and second ports of a filter circuit. The two filter cores can increase the filter selectivity without requiring another different or additional resonance frequency in the second filter core of the two filter cores, which involves increased cost and manufacturing complexity. In some cases, at least one inductor is coupled between the two cascaded filter cores. One or more "additional" resonators can also be employed between the first and second ports, such as in conjunction with the cascaded filter cores, to increase the filter order. For example, an additional resonator, which may be separate from the acoustic cores of the two cascaded cores, can be coupled in parallel with an inductor that is coupled between the two cascaded cores. The additional resonator can be included in other implementations besides those with cascaded cores.

In still other example implementations, a filter order can be increased by coupling an impedance inverter to a filter core. The impedance inverter (or admittance inverter) can be realized as a Pi network or T network. In some cases, an inductor of a Pi network is coupled in parallel with a filter core between first and second ports of a filter circuit. For instance, an inductor may be coupled at respective external, or outward-facing, terminals of two inductors of two transformers of a filter core.

In yet still other example implementations, a stop-band filter can be realized by mixing a serial resonator arrangement with a parallel resonator arrangement in a given acoustic core of a filter. If a filter core includes four resonator arrangements, then two can be serial resonator arrangements and two can be parallel resonator arrangements. The mixture of serial and parallel resonator arrangements within an acoustic core can produce a notch or stop-band filter response.

Although certain implementations of bridge-type filter architectures may be depicted or described herein somewhat separately, each technique may be employed with one or more other techniques. For example, an order of a stop-band filter can be increased by coupling an impedance inverter to a filter core of the stop-band filter. As another example, two filter cores that each include multiple acoustic resonators per resonator arrangement may be cascaded to further increase a selectivity of a filter circuit.

Description Examples

FIG. 1 illustrates an example environment 100 with an electronic device 102 that has a wireless interface device 120, which includes at least one example filter circuit 130. This document describes example implementations of the filter circuit 130, which may be part of a transceiver, a radio-frequency front-end (RFFE), and so forth of an apparatus. In the environment 100, the example electronic device 102 communicates with a base station 104 through a wireless link 106. In FIG. 1, the electronic device 102 is depicted as a smartphone. The electronic device 102, however, may be implemented as any suitable computing or other electronic device. Examples of an apparatus that can be realized as an electronic device 102 include a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, fitness management device, wearable device such as intelligent glasses or smartwatch, wireless power device (transmitter or receiver), medical device, and so forth.

The base station 104 communicates with the electronic device 102 via the wireless link 106, which may be implemented as any suitable type of wireless link that carries a communication signal. Although depicted as a base station tower of a cellular radio network, the base station 104 may represent or be implemented as another device, such as a satellite, terrestrial broadcast tower, access point, peer-to-peer device, mesh network node, fiber optic line interface, another electronic device as described above generally, and so forth. Hence, the wireless link 106 can extend between the electronic device 102 and the base station 104 in any of various manners.

The wireless link 106 can include a downlink of data or control information communicated from the base station 104 to the electronic device 102. The wireless link 106 can also include an uplink of other data or control information communicated from the electronic device 102 to the base station 104. The wireless link 106 may be implemented using any suitable wireless communication protocol or standard. Examples of such protocols and standards include a $3^{rd}$ Generation Partnership Project (3GPP) Long-Term Evolution (LTE) standard, such as a $4^{th}$ Generation (4G), a $5^{th}$ Generation (5G), or a $6^{th}$ Generation (6G) cellular standard; an IEEE 802.11 standard, such as 802.11g, ac, ax, ad, aj, or ay standard (e.g., Wi-Fi® 6 or WiGig®); an IEEE 802.16 standard (e.g., WiMAX®); a Bluetooth® standard; an ultra-wideband (UWB) standard (e.g., IEEE 802.15.4); and so forth. In some implementations, the wireless link 106 may provide power wirelessly, and the electronic device 102 or the base station 104 may comprise a power source.

As shown for some implementations, the electronic device 102 can include at least one application processor 108 and at least one computer-readable storage medium 110 (CRM 110). The application processor 108 may include any type of processor, such as a central processing unit (CPU) or a multi-core processor, that is configured to execute processor-executable instructions (e.g., code) stored by the CRM 110. The CRM 110 may include any suitable type of data storage media, such as volatile memory (e.g., random-access memory (RAM)), non-volatile memory (e.g., Flash memory), optical media, magnetic media (e.g., disk or tape), and so forth. In the context of this disclosure, the CRM 110 is implemented to store Instructions 112, data 114, and other information of the electronic device 102, and thus the CRM 110 does not include transitory propagating signals or carrier waves.

The electronic device 102 may also include one or more input/output ports 116 (I/O ports 116) and at least one display 118. The I/O ports 116 enable data exchanges or interaction with other devices, networks, or users. The I/O ports 116 may include serial ports (e.g., universal serial bus (USB®) ports), parallel ports, audio ports, infrared (IR) ports, cameras or other sensor ports, and so forth. The display 118 can be realized as a display screen or a projection that presents graphical images provided by other components of the electronic device 102, such as a user interface (UI) associated with an operating system, program, or application. Alternatively or additionally, the display 118 may be implemented as a display port or virtual interface through which graphical content of the electronic device 102 is communicated or presented.

The electronic device 102 further includes at least one wireless interface device 120 and at least one antenna 122. The example wireless interface device 120 provides connectivity to respective networks and peer devices via a wireless link, which may be configured similarly to or differently from the wireless link 106. The wireless interface device 120 may facilitate communication over any suitable type of wireless network, such as a wireless local area network (LAN) (WLAN), wireless personal-area-network (PAN) (WPAN), peer-to-peer (P2P) network, mesh network, cellular network, wireless wide-area-network (WAN)

(WWAN), and/or navigational network (e.g., the Global Positioning System (GPS) of North America or another Satellite Positioning System (SPS) or Global Navigation Satellite System (GNSS)). In the context of the example environment 100, the electronic device 102 can communicate various data and control information bidirectionally with the base station 104 via the wireless interface device 120. The electronic device 102 may, however, communicate directly with other peer devices, an alternative wireless network, and the like. Also, as described above, an electronic device 102 may alternatively be implemented as a base station 104 or another apparatus as set forth herein.

As shown, the wireless interface device 120 can include at least one communication processor 124, at least one transceiver 126, and at least one radio-frequency front-end 128 (RFFE 128). These components process data information, control information, and signals associated with communicating information for the electronic device 102 via the antenna 122. The communication processor 124 may be implemented as at least part of a system-on-chip (SoC), as a modem processor, or as a baseband radio processor (BBP) that enables a digital communication interface for data, voice, messaging, or other applications of the electronic device 102. The communication processor 124 can include a digital signal processor (DSP) or one or more signal-processing blocks (not shown) for encoding and modulating data for transmission and for demodulating and decoding received data. Additionally, the communication processor 124 may also manage (e.g., control or configure) aspects or operation of the transceiver 126, the RF front-end 128, and other components of the wireless interface device 120 to implement various communication protocols or communication techniques.

In some cases, the application processor 108 and the communication processor 124 can be combined into one module or integrated circuit (IC), such as an SoC. Regardless, the application processor 108, the communication processor 124, or a processor generally can be operatively coupled to one or more other components, such as the CRM 110 or the display 118, to enable control of, or other interaction with, the various components of the electronic device 102. For example, at least one processor 108 or 124 can present one or more graphical images on a display screen implementation of the display 118 based on one or more wireless signals transmitted or received via the at least one antenna 122 using components of the wireless interface device 120. Further, the application processor 108 or the communication processor 124, including a combination thereof, can be realized using digital circuitry that implements logic or functionality that is described herein. Additionally, the communication processor 124 may also include or be associated with a memory (not separately depicted) to store data and processor-executable instructions (e.g., code), such as the same or another CRM 110.

As shown, the wireless interface device 120 can include at least one filter circuit 130, which is described below. More specifically, the transceiver 126 can include at least one filter circuit 130-1, or the RF front-end 128 can include at least one filter circuit 130-2 (including both components can have at least one filter circuit 130 in accordance with an optional but permitted inclusive-or interpretation of the word "or"). The transceiver 126 can also include circuitry and logic for filtering, switching, amplification, channelization, frequency translation, and so forth. Frequency translation functionality may include an up-conversion or a down-conversion of frequency that is performed through a single conversion operation (e.g., with a direct-conversion architecture) or through multiple conversion operations (e.g., with a super-heterodyne architecture). Generally, the transceiver 126 can include filters, switches, amplifiers, mixers, and so forth for routing and conditioning signals that are transmitted or received via the antenna 122.

In addition to the filter circuit 130-1, the transceiver 126 can include an analog-to-digital converter (ADC) or a digital-to-analog converter (DAC) (not shown in FIG. 1). In operation, an ADC can convert analog signals to digital signals, and a DAC can convert digital signals to analog signals. Generally, an ADC or a DAC can be implemented as part of the communication processor 124, as part of the transceiver 126, or separately from both (e.g., as another part of an SoC or as part of the application processor 108).

Figures 1, 2:
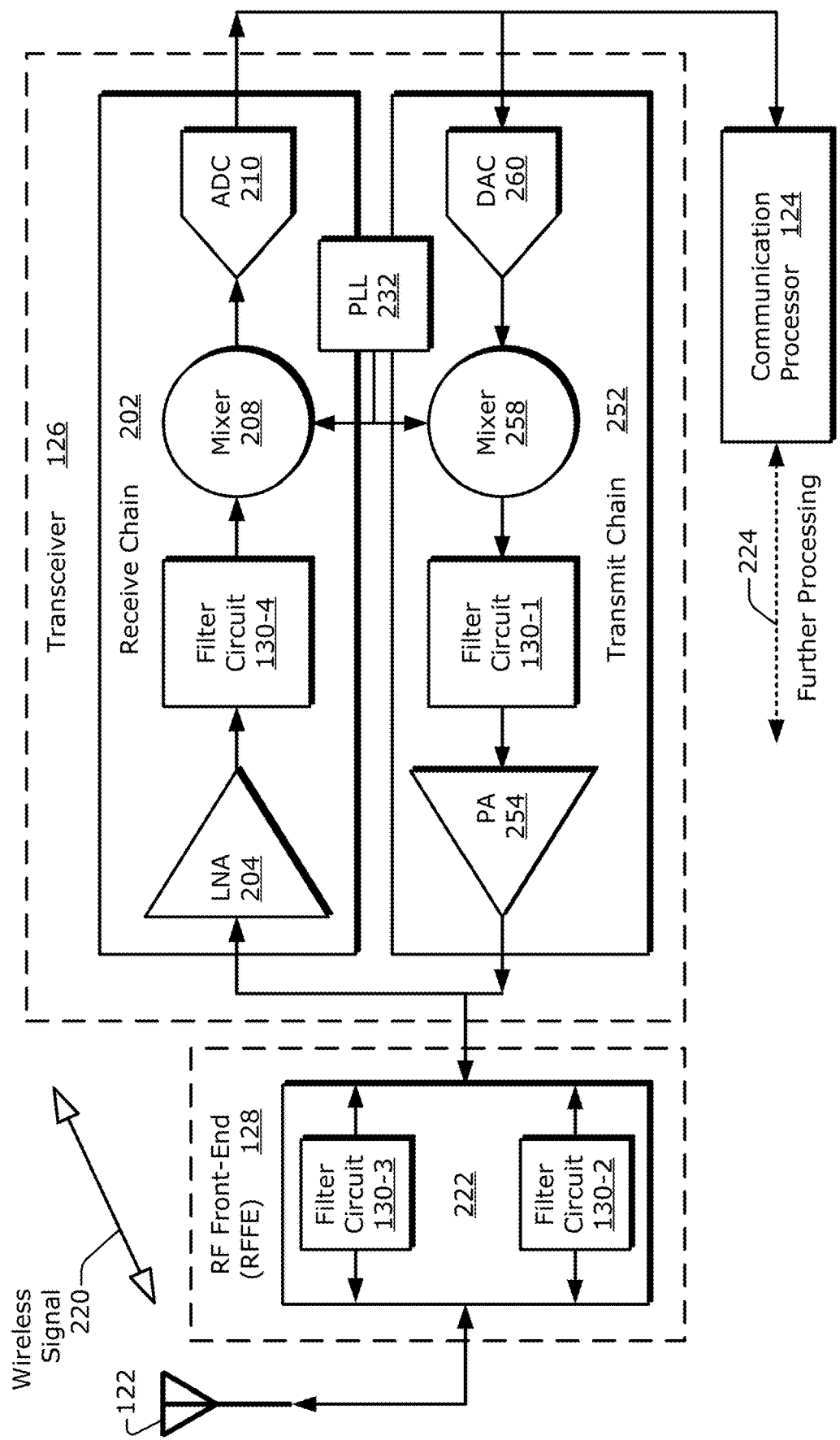
Figure 2:
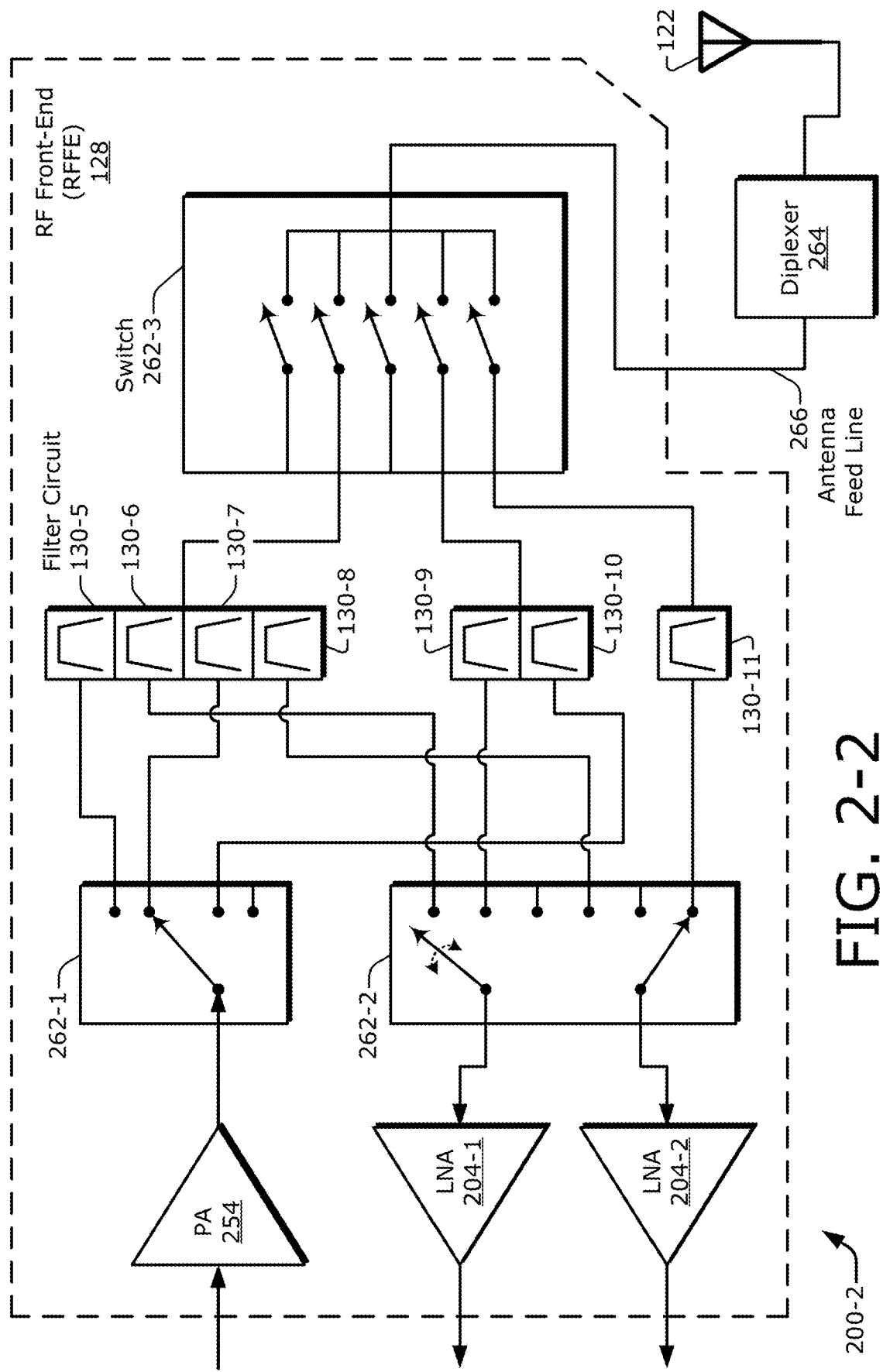

The components or circuitry of the transceiver 126 can be implemented in any suitable fashion, such as with combined transceiver logic or separately as respective transmitter and receiver entities. In some cases, the transceiver 126 is implemented with multiple or different sections to implement respective transmitting and receiving operations (e.g., with separate transmit and receive chains as depicted in FIG. 2). Although not shown in FIG. 1, the transceiver 126 may also include logic to perform in-phase/quadrature (I/Q) operations, such as synthesis, phase correction, modulation, demodulation, and the like.

The RF front-end 128 can include one or more filters—such as the filter circuit 130-2—multiple switches, or one or more amplifiers for conditioning signals received via the antenna 122 or for conditioning signals to be transmitted via the antenna 122. The RF front-end 128 may also include a phase shifter (PS), peak detector, power meter, gain control block, antenna tuning circuit, N-plexer, balun, and the like. Configurable components of the RF front-end 128, such as some phase shifters, an automatic gain controller (AGC), or a reconfigurable version of the filter circuit 130, may be controlled by the communication processor 124 to implement communications in various modes, with different frequency bands, or using beamforming. In some implementations, the antenna 122 is implemented as at least one antenna array that includes multiple antenna elements. Thus, as used herein, an "antenna" can refer to at least one discrete or independent antenna, to at least one antenna array that includes multiple antenna elements, or to a portion of an antenna array (e.g., an antenna element), depending on context or implementation.

In FIG. 1, an example filter circuit 130 is depicted as being part of a transceiver 126 as a filter circuit 130-1, as being part of an RF front-end 128 as a filter circuit 130-2, and so forth. Described implementations of a filter circuit 130 can, however, additionally or alternatively be employed in other portions of the wireless interface device 120 or in other portions of the electronic device 102 generally. As set forth above, a filter circuit 130 can be included in an electronic device other than a cell phone, such as a base station 104. With a base station (or a mobile phone), a filter of, e.g., an intermediate frequency (IF) section of a wireless interface device 120 and/or an RF front-end 128 may include a filter circuit 130 as described herein. Other electronic device apparatuses that can employ a filter circuit 130 include a laptop, communication hardware of a vehicle, a wireless access point, and so forth as described herein.

In example implementations, the filter circuit 130 can include at least one port 132, at least one resonator arrangement 134, and at least one transformer 136. As illustrated, the filter circuit 130 can includes a first port 132-1 and a second port 132-2. In some cases, one port can operate as an input port, and the other port can operate as an output port for the filter circuit 130. These input/output statuses may be switched during operation, however, for a bidirectional filter circuit 130. Although two ports 132-1 and 132-2, one resonator arrangement 134, and one transformer 136 are explicitly depicted in FIG. 1, the filter circuit 130 may include fewer or more of any of such components, as well as other components that are not shown.

Using a filter core architecture that is described herein, the filter circuit 130 can operate with a single transformer 136. This can lower costs or reduce a size of a wireless interface device 120 and thus an associated electronic device 102. Example implementations for such filter circuits are described below with reference to at least FIGS. 5-1 to 10. By employing multiple acoustic resonators having different characteristics from each other within a given acoustic-based implementation of a resonator arrangement 134, the frequency response of the filter circuit 130 can be established to meet more stringent performance specifications. Example implementations for filter circuits that can be realized in these manners are described below with reference to at least FIGS. 5-1, 5-2, and 7-1 to 12.

The effects of a non-ideal characteristic of a physical transformer (e.g., as represented by a coupling coefficient of less than one (K<1)) can be at least partially ameliorated by employing a capacitor across two terminals of the transformer 136. Example implementations for such filter circuits are described below with reference to at least FIG. 11. Further, coupling an "asymmetric inductor" to one of two "internal" terminals of the transformer 136 can at least partly reduce a phase error caused by parasitic capacitance arising from two coupled conductors forming the transformer 136. Example implementations for such filter circuits are described below with reference to at least FIG. 12. Various example implementations relating to bridge-type filter architectures, some of which can increase the order of a filter, are also described below with reference to FIGS. 14-1 to 17-7. Next, however, this document describes example implementations of a transceiver and an RF front-end with reference to FIGS. 2-1 and 2-2.

FIG. 2-1 is a schematic diagram 200-1 illustrating an example RF front-end 128 and an example transceiver 126 that can each include at least one filter circuit 130. FIG. 2-1 also depicts an antenna 122 and a communication processor 124. The communication processor 124 communicates one or more data signals to other components, such as the application processor 108 of FIG. 1, for further processing at 224 (e.g., for processing at an application level). As shown, the circuitry 200-1 can include a filter circuit 130-1, a filter circuit 130-2, a filter circuit 130-3, or a filter circuit 130-4, including one to four of such filter circuits. The circuitry 200-1, however, may include a different quantity of filters (e.g., more or fewer), may include filters that are coupled together differently, may include filters in different locations, may include filters that are implemented as a duplexer or quadplexer, and so forth.

As illustrated from left to right, in example implementations, the antenna 122 is coupled to the RF front-end 128, and the RF front-end 128 is coupled to the transceiver 126. The transceiver 126 is coupled to the communication processor 124. The example RF front-end 128 includes at least one signal propagation path 222. The at least one signal propagation path 222 can include at least one filter circuit 130, such as the filter circuit 130-2 and the filter circuit 130-3. The example transceiver 126 includes at least one receive chain 202 (or receive path 202) and at least one transmit chain 252 (or transmit path 252). Although only one RF front-end 128, one transceiver 126, and one communication processor 124 are shown at the circuitry 200-1, an electronic device 102, or a wireless interface device 120 thereof, can include multiple instances of any or all such components. Also, although only certain components are explicitly depicted in FIG. 2 and are shown coupled together in a particular manner, the transceiver 126 or the RF front-end 128 may include other non-illustrated components (e.g., switches or diplexers), more or fewer components, differently coupled arrangements of components, and so forth.

In some implementations, the RF front-end 128 couples the antenna 122 to the transceiver 126 via the signal propagation path 222. In operation, the signal propagation path 222 carries a signal between the antenna 122 and the transceiver 126. During or as part of the signal propagation, the signal propagation path 222 conditions the propagating signal, such as with the filter circuit 130-2 or the filter circuit 130-3. This enables the RF front-end 128 to couple a wireless signal 220 from the antenna 122 to the transceiver 126 as part of a reception operation. The RF front-end 128 also enables a transmission signal to be coupled from the transceiver 126 to the antenna 122 as part of a transmission operation to emanate a wireless signal 220. Although not explicitly shown in FIG. 2, an RF front-end 128, or a signal propagation path 222 thereof, may include one or more other components, such as another filter, an amplifier (e.g., a power amplifier or a low-noise amplifier), an N-plexer, a phase shifter, a diplexer, one or more switches, and so forth.

In some implementations, the transceiver 126 can include at least one receive chain 202, at least one transmit chain 252, or at least one receive chain 202 and at least one transmit chain 252. From left to right, the receive chain 202 can include a low noise amplifier 204 (LNA 204), the filter circuit 130-4, a mixer 208 for frequency down conversion, and an ADC 210. The transmit chain 252 can include a power amplifier 254 (PA 254), the filter circuit 130-1, a mixer 258 for frequency up-conversion, and a DAC 260. However, the receive chain 202 or the transmit chain 252 can include other components—for example, additional amplifiers or filters, multiple mixers, one or more buffers, or at least one local oscillator—that are electrically or electromagnetically disposed anywhere along the depicted receive and transmit chains.

The receive chain 202 is coupled between the signal propagation path 222 of the RF front-end 128 and the communication processor 124—e.g., via the low-noise amplifier 204 and the ADC 210, respectively. The transmit chain 252 is coupled between the signal propagation path 222 and the communication processor 124—e.g., via the power amplifier 254 and the DAC 260, respectively. The transceiver 126 can also include at least one phase-locked loop 232 (PLL 232) that is coupled to the mixer 208 or the mixer 258. For example, the transceiver 126 can include one PLL 232 for each transmit/receive chain pair, one PLL 232 per transmit chain and one PLL 232 per receive chain, multiple PLLs 232 per chain, and so forth.

As shown along a signal propagation direction for certain example implementations of the receive chain 202, the antenna 122 is coupled to the low noise amplifier 204 via the signal propagation path 222 and the filter circuit 130-3 thereof, and the low noise amplifier 204 is coupled to the filter circuit 130-4. The filter circuit 130-4 is coupled to the mixer 208, and the mixer 208 is coupled to the ADC 210. The ADC 210 is in turn coupled to the communication processor 124. As shown along a signal propagation direction for certain example implementations of the transmit chain 252, the communication processor 124 is coupled to the DAC 260, and the DAC 260 is coupled to the mixer 258. The mixer 258 is coupled to the filter circuit 130-1, and the filter circuit 130-1 is coupled to the power amplifier 254. The power amplifier 254 is coupled to the antenna 122 via the signal propagation path 222 using the filter circuit 130-2 thereof. Although only one receive chain 202 and one transmit chain 252 are explicitly shown, an electronic device 102, or a transceiver 126 thereof, can include multiple instances of either or both components. Although the ADC 210 and the DAC 260 are illustrated as being separately coupled to the communication processor 124, they may share a bus or other means for communicating with the processor 124.

As part of an example signal-receiving operation, the filter circuit 130-3 of the signal propagation path 222 filters a received signal and forwards the filtered signal to the low-noise amplifier 204. The low-noise amplifier 204 accepts the filtered signal from the RF front-end 128 and provides an amplified signal to the filter circuit 130-4 based on the accepted signal. The filter circuit 130-4 filters the amplified signal and provides another filtered signal to the mixer 208. The mixer 208 performs a frequency conversion operation on the other filtered signal to down-convert from one frequency to a lower frequency (e.g., from a radio frequency (RF) to an intermediate frequency (IF) or to a baseband frequency (BBF)). The mixer 208 can perform the frequency down-conversion in a single conversion step or through multiple conversion steps using at least one PLL 232. The mixer 208 can provide a down-converted signal to the ADC 210 for conversion and forwarding to the communication processor 124 as a digital signal.

As part of an example signal-transmitting operation, the mixer 258 accepts an analog signal at BBF or IF from the DAC 260. The mixer 258 upconverts the analog signal to a higher frequency, such as to an RF frequency, to produce an RF signal using a signal generated by the PLL 232 to have a target synthesized frequency. The mixer 258 provides the RF or other unconverted signal to the filter circuit 130-1. The filter circuit 130-1 filters the RF signal and provides a filtered signal to the power amplifier 254. Thus, after the filtering by the filter circuit 130-1, the power amplifier 254 amplifies the filtered signal and provides an amplified signal to the signal propagation path 222 for signal conditioning. The RF front-end 128 can use, for instance, the filter circuit 130-2 of the signal propagation path 222 to provide a filtered signal to the antenna 122 for emanation as a wireless signal 220.

Example implementations of a filter circuit 130, as described herein, may be employed at any one or more of the example filter circuits 130-1, 130-2, 130-3, or 130-4 in the transceiver 126 and the RF front-end 128 or at other filters of an electronic device 102 (not shown in FIG. 2-1). The circuitry 200-1, however, depicts just some examples for a transceiver 126 and/or an RF front-end 128. In some cases, the various components that are illustrated in the drawings using separate schematic blocks or circuit elements may be manufactured or packaged in different discrete manners. For example, one physical module may include components of the RF front-end 128 and some components of the transceiver 126, and another physical module may combine the communication processor 124 with the remaining components of the transceiver 126. Further, in some cases, the antenna 122 may be co-packaged with at least some components of the RF front-end 128 or the transceiver 126.

In alternative implementations, one or more components may be physically or logically "shifted" to a different part of the wireless interface device 120 as compared to the illustrated circuitry 200-1 and/or may be incorporated into a different module. For example, a low-noise amplifier 204 or a power amplifier 254 may alternatively or additionally be deployed in the RF front-end 128. Examples of this alternative are described next with reference to FIG. 2-2.

FIG. 2-2 is a schematic diagram 200-2 illustrating an example RF front-end 128 that can include one or more filter circuits coupled between at least one antenna 122 and one or more amplifiers, such as at least one low-noise amplifier (LNA) or at least one power amplifier (PA). As illustrated, the RF front-end 128 is coupled to the antenna 122 via an antenna feed line 266. Between the RF front-end 128 and the antenna 122, the antenna feed line 266 may include one or more components, such as a diplexer 264 (or a duplexer in some implementations where transmit (Tx) and receive (Rx) operations share the antenna 122). The RF front-end 128 can include a power amplifier 254, a first low-noise amplifier 204-1, and a second low-noise amplifier 204-2.

The RF front-end 128 can also include multiple switches, such as a first switch 262-1, a second switch 262-2, and a third switch 262-3. The first switch 262-1 is coupled along a transmit path of a signal propagation path 222 (of FIG. 2-1) of the RF front-end 128, and the second switch 262-2 is coupled along a receive path of another signal propagation path 222. The third switch 262-3 is coupled along the transmit path and the receive path. Multiple transmit or receive signal propagation paths may be established at the same time or at different times using the switches.

In example implementations, the RF front-end 128 can further include multiple filter circuits, such as seven filter circuits 130-5 to 130-11. The three filter circuits 130-5, 130-7, and 130-10 can be used as part of a transmit path between the power amplifier 254 and the antenna 122, with the transmit path including the antenna feed line 266. The four filter circuits 130-6, 130-8, 130-9, and 130-11 can be used as part of a receive path between the antenna 122 and a low-noise amplifier 204, such as the first low-noise amplifier 204-1 or the second low-noise amplifier 204-2. Thus, the three filter circuits 130-5, 130-7, and 130-10 can filter a transmit signal that is output by the power amplifier 254. On the other hand, the four filter circuits 130-6, 130-8, 130-9, and 130-11 can filter a receive signal before the receive signal is input to the first or second low-noise amplifier 204-1 or 204-2.

Each filter circuit 130 can be realized as a standalone filter, a duplexer, a quadplexer, and so forth. As shown, the filter circuit 130-11 can operate as a standalone filter. The two filter circuits 130-9 and 130-10 can operate as a duplexer. The four filter circuits 130-5, 130-6, 130-7, and 130-8 can be configured as a quadplexer. By way of example only, the switch 262-2 is shown in a state in which the filter circuit 130-11 is coupled to an input of the second low-noise amplifier 204-2. The filter circuits, switches, amplifiers, and signal propagation paths can, however, be realized or operationally configured in different manners.

The transmit and receive paths can be established using one or more of the first, second, or third switches 262-1, 262-2, or 262-3. A controller (not shown), which may be part of the communication processor 124 (of FIGS. 1 and 2-1), can position or set the states of these switches based on transmit versus receive mode, a frequency being used for transmission or reception, and so forth. Although certain components are depicted in FIG. 2-2 in certain arrangements and described above in a particular manner, an RF front-end 128 can include different components, more or fewer components, different couplings or arrangements of the components, and so forth.

Figures 1, 3:
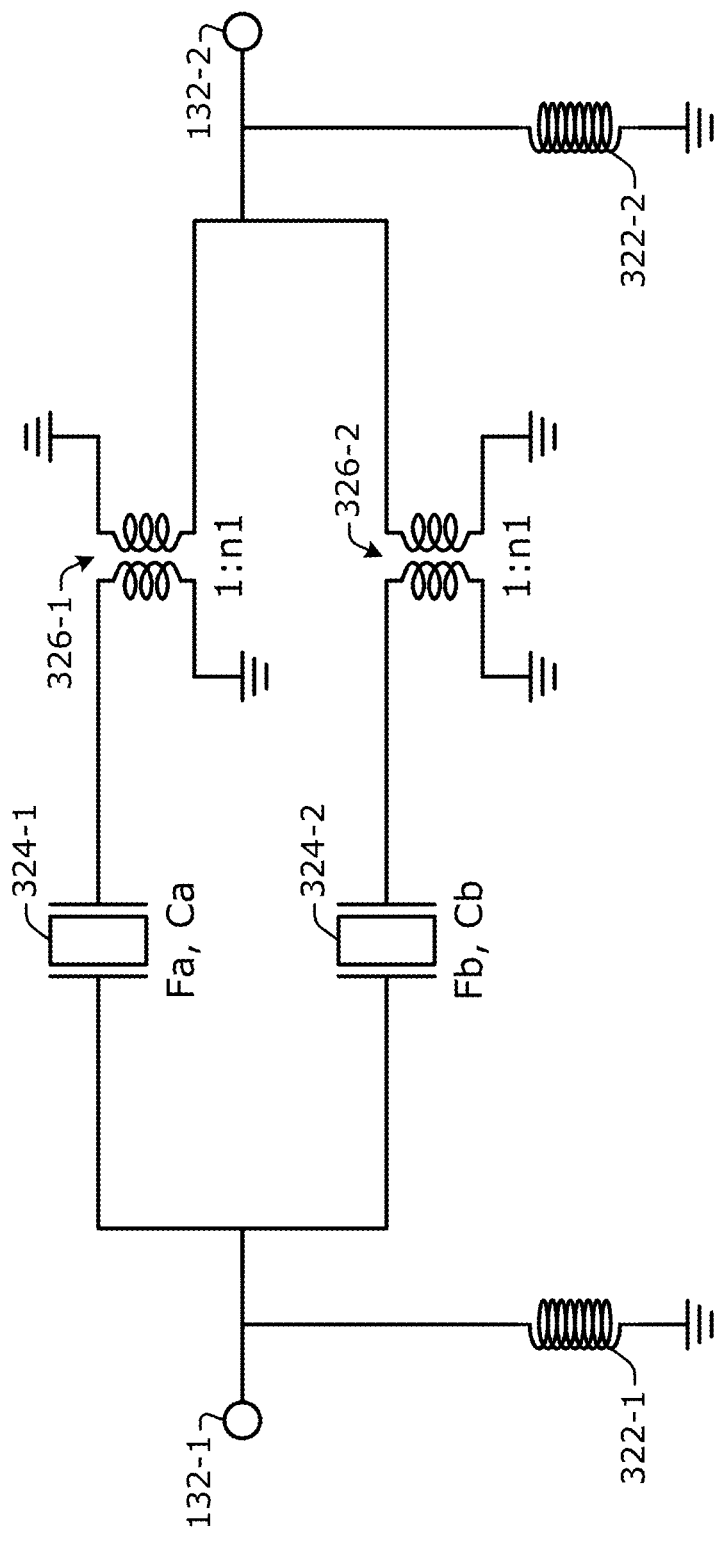
Figures 2, 3:
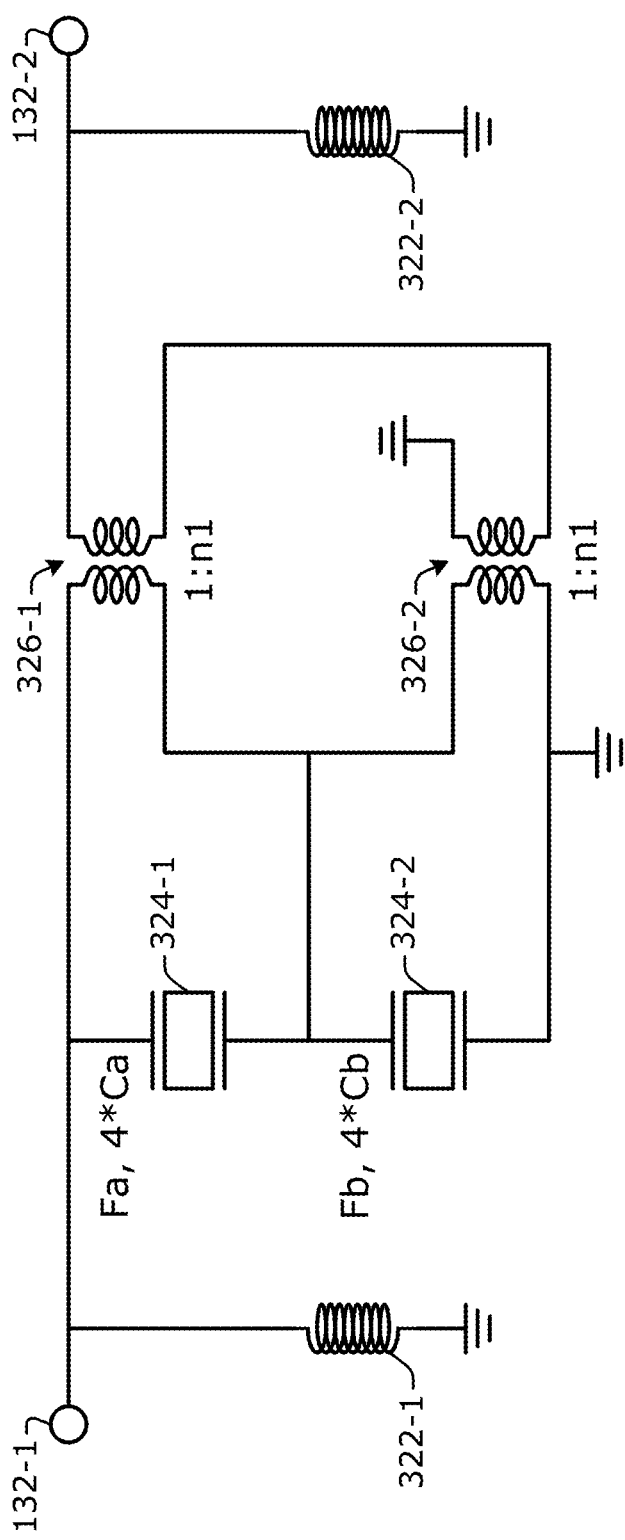
Figure 3:
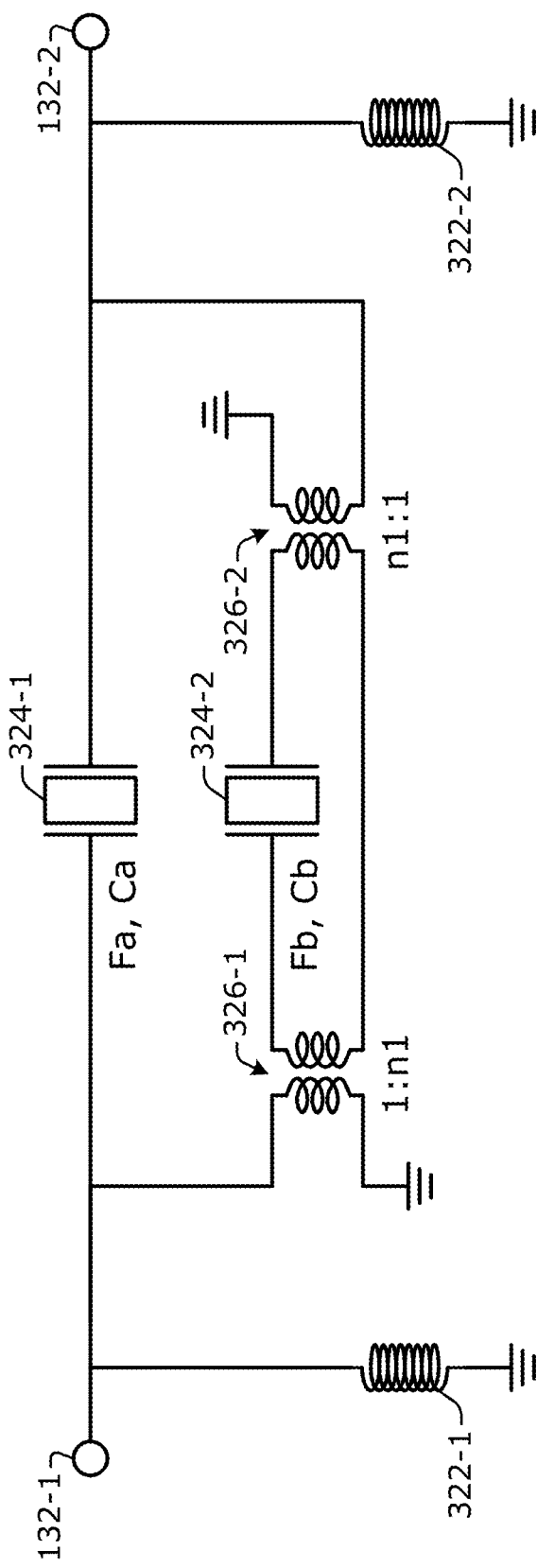
Figures 3, 4:
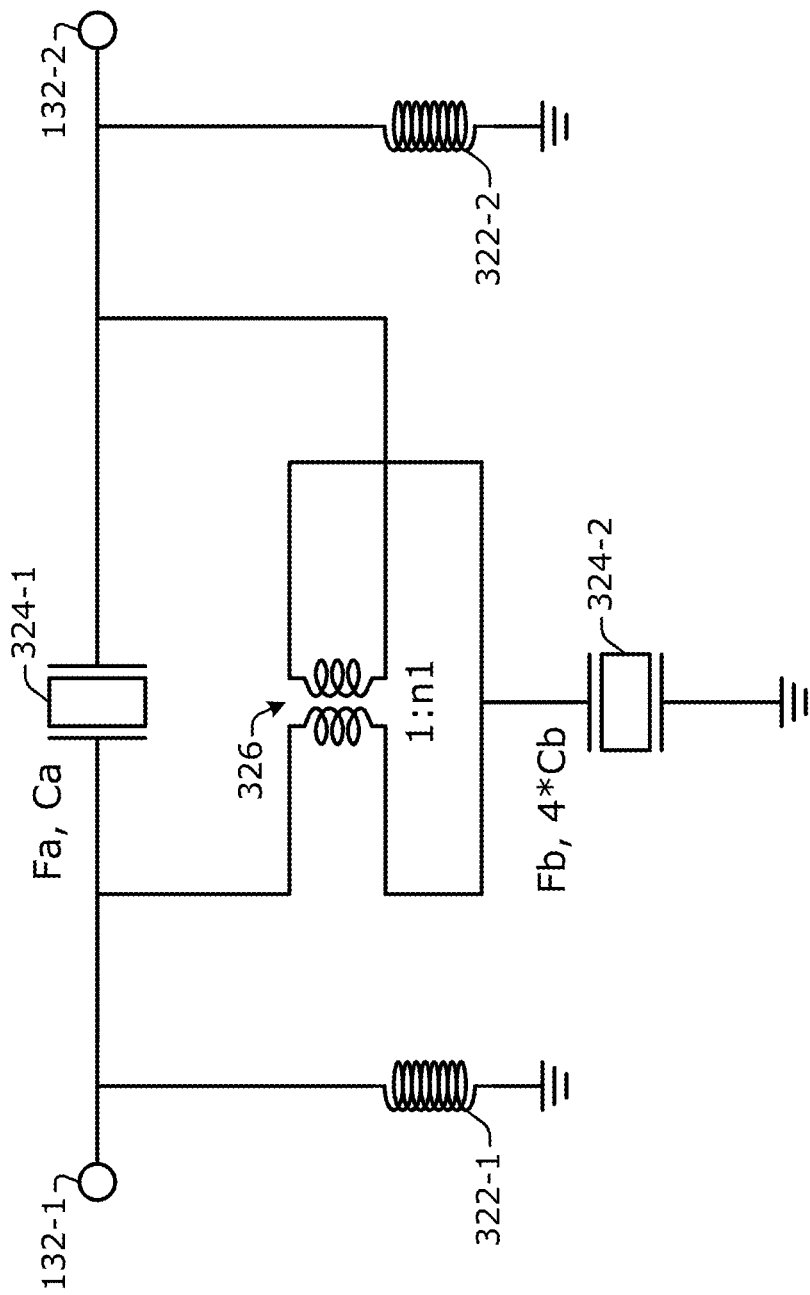

FIGS. 2-3 and 2-4 are schematic diagrams illustrating filter circuits 130-31 and 130-32, respectively, having example filter cores and two example signaling schemes for ports of the filter circuits. As shown, each filter circuit 130 can include at least one filter core 272 and at least two ports: a first port 132-1 and a second port 132-2. In example implementations, the filter core 272 includes at least one resonator arrangement 134 and at least one transformer 136. Each port 132 may include two terminals, which are depicted in FIGS. 2-3 and 2-4 as circles.

With the filter circuit 130-31, the first port 132-1 and the second port 132-2 are each implemented as a balanced or differential port. Thus, the two ports 132-1 and 132-2 can propagate (or couple) balanced or differential signals from another component to the filter core 272 or from the filter core 272 to another component. The two terminals of each differential implementation of a port 132 are used jointly to carry the differential signal to or from the filter core 272.

With the filter circuit 130-32, the first port 132-1 and the second port 132-2 are each implemented as an unbalanced or single-ended port. Thus, the two ports 132-1 and 132-2 can propagate (or couple) unbalanced or singled-ended signals from another component to the filter core 272 or from the filter core 272 to another component. One terminal of each port 132 in FIG. 2-4 is used to carry the single-ended signal. The other terminal of each port 132 can be coupled to a ground 276. In other port-related implementations of a filter circuit 130 (not shown), one port 132 may be configured as a single-ended port (e.g., as shown for the ports of the filter circuit 130-32), and another port 132 may be configured as a differential port (e.g., as shown for the ports of the filter circuit 130-31). Example filter circuits with a single-ended port and a differential port are described below, e.g., with reference to FIG. 5-2.

In FIGS. 2-3 and 2-4, a signal 274 can enter or exit the respective filter circuit 130 via the first port 132-1 or the second port 132-2. As shown in FIG. 2-3, a first signal 274-1 enters the filter circuit 130-31 via the first port 132-1, and a second signal 274-2 exits the filter circuit 130-31 via the second port 132-2. Thus, the first port 132-1 accepts or receives the first signal 274-1 and provides the first signal 274-1 to the filter core 272. The filter core 272 filters the first signal 274-1 to produce the second signal 274-2. Accordingly, the second signal 274-2 can be or can include a filtered version of the first signal 274-1. The filter core 272 couples the second signal 274-2 to the second port 132-2. The second port 132-2 can forward or transmit the second signal 274-2 from the filter circuit 130-31 to a downstream component.

The filter circuit 130-32 can operate analogously to the operation described above for the filter circuit 130-31. For example, the first port 132-1 can accept or receive the first signal 274-1 from an upstream component. The filter core 272 of the filter circuit 130-32 can filter the first signal 274-1 to produce the second signal 274-2, and the second port 132-2 can transmit the second signal 274-2 to a downstream component.

Alternatively, a filter circuit 130 may accept a second signal 274-2 via the second port 132-2 and forward a first signal 274-1 as a filtered version of the second signal 274-2 from the first port 132-1. Further, although the filter circuits are depicted in FIGS. 2-3 and 2-4 with unidirectional signal flows, some described filter circuit implementations can be bidirectional. For example, in one direction of a given filter circuit 130, a first port 132-1 can receive a first signal, and a second port 132-2 can transmit a second signal, with the second signal based on filtering the first signal. In the other direction of the same filter circuit 130, the second port 132-2 can receive a signal, and the first port 132-1 can transmit another signal based on a filtering by the filter core 272 of the signal received by the second port 132-2.

Figures 3, 4, 5:
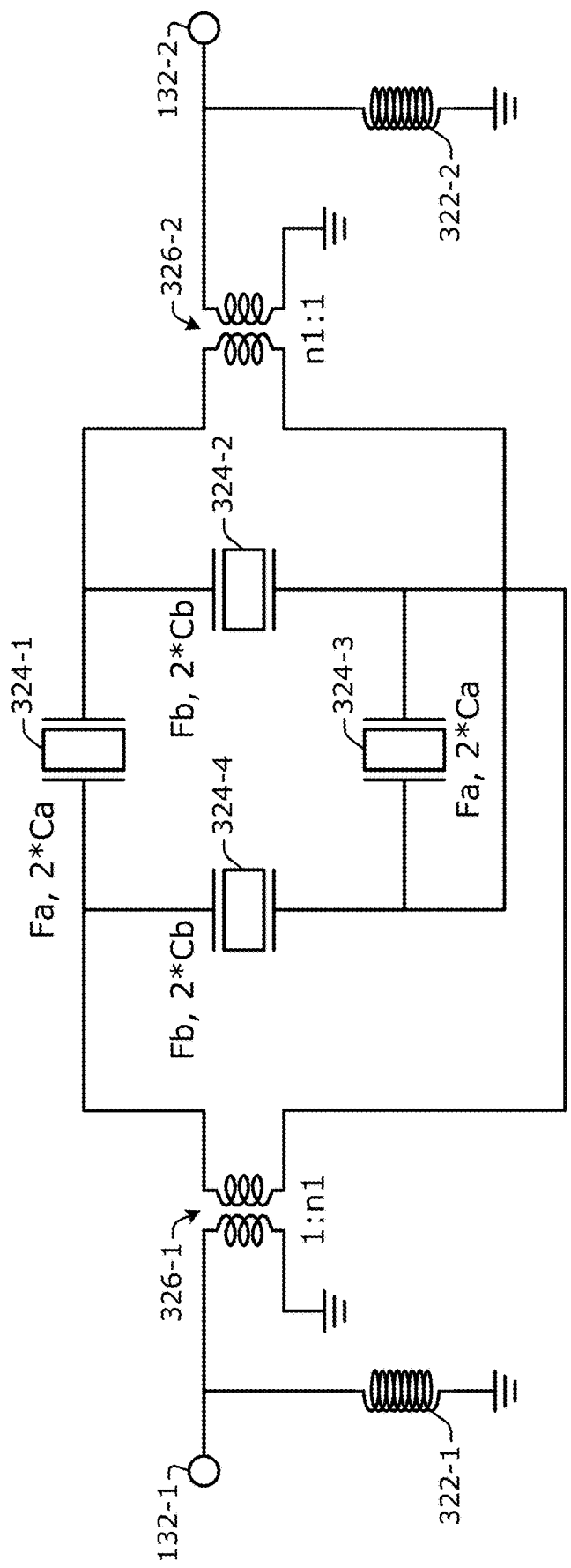

FIGS. 3-1 to 3-7 depict examples of bridge-type architectures of a filter circuit 130, such as a lattice filter. FIGS. 3-1 to 3-4 and 3-7 are circuit diagrams 300-1 to 300-4 and 300-7 illustrating examples of a half lattice-type filter architecture. FIG. 3-5 is a circuit diagram 300-5 illustrating an example of a full lattice-type filter architecture. FIG. 3-6 is a circuit diagram 300-6 illustrating an example of a full lattice-type filter architecture as described herein. Each lattice filter includes at least two acoustic resonators coupled between first and second ports 132-1 and 132-2. These two or more acoustic resonators can include, for example, a first acoustic resonator 324-1, a second acoustic resonator 324-2, a third acoustic resonator 324-3, and/or a fourth acoustic resonator 324-4. The various alternative lattice filter implementations may also include one or more transformers or at least one phase shifter. The windings of each transformer may have a ratio (e.g., "1:n1" or "n1:1") as indicated in the drawings.

Each of the at least two acoustic resonators can have one of two different resonance frequencies (e.g., Fa and Fb) and two different impedances, such as two different static capacitances (e.g., Ca and Cb). The capacitances Ca and Cb may be equal to each other to produce transmission zeros at 0 hertz (Hz) and infinity, or the capacitances Ca and Cb may be different from each other to produce finite transmission zeros in the response. The acoustic resonators can have a capacitance as indicated in the figures, such as Ca, Cb, or a multiple thereof (e.g., 4*Cb). Each lattice filter can also include a first inductor 322-1 coupled to the first port 132-1 and a second inductor 322-2 coupled to the second port 132-2. The two inductors 322-1 and 322-2 can be included to widen the passband of the lattice filter. Otherwise, the two inductors 322-1 and 322-2 may be omitted. Any of the example lattice filter implementations can be architected to provide substantially the same small signal response with appropriately dimensioned circuit elements.

In FIG. 3-1, a first example bridge-type filter architecture, which is a variant of a half lattice filter, is shown with two acoustic resonators 324-1 and 324-2 and two transformers 326-1 and 326-2. As illustrated in a circuit diagram 300-1, a first transformer 326-1 and a second transformer 326-2 are coupled to the second port 132-2. A first acoustic resonator 324-1 and a second acoustic resonator 324-2 are coupled to the first port 132-1. The first acoustic resonator 324-1 and the first transformer 326-1 are coupled together in series between the first and second ports 132-1 and 132-2. The second acoustic resonator 324-2 and the second transformer 326-2 are coupled together in series between the first and second ports 132-1 and 132-2. Thus, the series-connected first acoustic resonator 324-1 and first transformer 326-1 are coupled in parallel with the series-connected second acoustic resonator 324-2 and second transformer 326-2. In example operations, based on the illustrated connections of the transformers, the first transformer 326-1 implements a 180° phase shift, and the second transformer 326-2 implements a 0° (zero or no) phase shift.

In FIG. 3-2, a second example bridge-type filter architecture, which is a variant of a half lattice filter, is shown as a circuit diagram 300-2. This second example architecture, like the first one, also includes two acoustic resonators 324-1 and 324-2 and two transformers 326-1 and 326-2. In this architecture, a first acoustic resonator 324-1 and a second acoustic resonator 324-2 are coupled in series between the first port 132-1 and a ground. A first transformer 326-1 is coupled between the first and second ports 132-1 and 132-2. A second transformer 326-2 is coupled between the first transformer 326-1 and the ground via two terminals associated with separate inductors of the second transformer 326-2.

In FIG. 3-3, a third example bridge-type filter architecture, which is a variant of a half lattice filter, is shown as a circuit diagram 300-3. This third example architecture, like the first and second ones, includes two acoustic resonators 324-1 and 324-2 and two transformers 326-1 and 326-2. A first acoustic resonator 324-1 is coupled between the first and second ports 132-1 and 132-2. A second acoustic resonator 324-2 is coupled in series with, and in between, the first and second transformers 326-1 and 326-2. This series-connected set of three elements is also coupled between the first and second ports 132-1 and 132-2. Thus, the series-connected set of three elements and the first acoustic resonator 324-1 are coupled together in parallel between the first and second ports 132-1 and 132-2.

In FIG. 3-4, a fourth example bridge-type filter architecture, which is a variant of a half lattice filter, is shown as a circuit diagram 300-4. This fourth example architecture includes two acoustic resonators 324-1 and 324-2 and at least one transformer 326. Here, a first acoustic resonator 324-1 may be swapped with a second acoustic resonator 324-2. Although the first and second ports 132-1 and 132-2 may operate with single-ended signaling, no terminal of the transformer 326 need be coupled to a ground. Instead, two terminals of the transformer 326, which two terminals are associated with separate inductors of the transformer 326, are coupled to each other at a node. The second acoustic resonator 324-2 is coupled between this node and the ground.

In FIG. 3-5, a fifth example bridge-type filter architecture is shown. This fifth architecture corresponds to an example full lattice-type filter with four acoustic resonators 324-1, 324-2, 324-3, and 324-4 and two transformers 326-1 and 326-2 at a circuit diagram 300-5. A first transformer 326-1 is coupled to the first port 132-1, and a second transformer 326-2 is coupled to the second port 132-2. The four acoustic resonators 324-1, 324-2, 324-3, and 324-4 are coupled together into a square or loop. The square is coupled between the two transformers 326-1 and 326-2 with the acoustic resonator 324-3 being cross-coupled to the two transformers. If the full lattice filter 300-5 is connected to first and second differential ports, the filter can be operated without the transformers. An "X-shaped" appearance of a circuit diagram of a full lattice filter is depicted in FIG. 4 and described below.

In FIG. 3-6, a sixth example bridge-type filter architecture is shown. This sixth architecture operates as a full lattice-type filter using two signal paths. As illustrated, a circuit diagram 300-6 includes four acoustic resonators 324-1, 324-2, 324-3, and 324-4 and a transformer 326. Each path includes a respective "series" or "inline" acoustic resonator 324-1 or 324-2 that is coupled between the first port 132-1 and a respective terminal of an inductor of the transformer 326. Each path also includes a respective "parallel" or "shunt" acoustic resonator 324-4 or 324-3 that is coupled between the respective terminal of the inductor of the transformer 326 and a ground. The sixth bridge-type architecture is described further herein, such as with reference to FIGS. 5-1 to 13.

In FIG. 3-7, a seventh example bridge-type filter architecture is shown. This seventh architecture is a different version of the first example variant of a half lattice filter (of FIG. 3-1). As illustrated, a circuit diagram 300-7 includes two acoustic resonators 324-1 and 324-2 and at least one phase shifter 328. The two transformers of the circuit diagram 300-1 can be replaced with the phase shifter 328 of the circuit diagram 300-7. From a physical implementation perspective in which components are fabricated from non-ideal elements, the two transformers can be replaced with a single phase shifter if the phase shifter is frequency invariant across the frequency range of interest, but such a phase shifter may not be readily realizable using lumped elements or transmission lines if the desired frequency range is wide. In other words, using an inductive-capacitive based (L-C based) phase shifter can appreciably limit the maximum bandwidth and the out-of-band attenuation of the filter circuit. Accordingly, a more viable, relatively-frequency invariant phase shifter that operates at 180° is an ideal transformer. If using a non-ideal transformer, the smaller-than-one coupling can be compensated for by including another transformer with a nominal 0° phase shift, which is shown in FIG. 3-1.

However, it should be appreciated that there may be a variety of applications and/or implementations in which the half lattice filter may be implemented with a phase shifter as illustrated in FIG. 3-7 for the seventh bridge-type architecture. Further, although seven bridge-type filter architecture examples are depicted in FIGS. 3-1 to 3-7 and described herein, the principles set forth in this document are applicable to other bridge-type filter architectures.

FIG. 4 is a schematic diagram illustrating an example lattice-type filter 401 having two ports, two transformers, and multiple resonators. This lattice filter includes two transformers respectively corresponding to, and coupled to, two ports: a first transformer 136-1 at a first port 132-1 and a second transformer 136-2 at a second port 132-2. As shown, four resonators 403-1 to 403-4 are coupled between the two transformers 136-1 and 136-2. Each resonator 403 is depicted with single or double lines. In some cases, the resonators with single lines (e.g., a resonator 403-1 and a resonator 403-2) can have similar characteristics to each other, and the resonators with double lines (e.g., a resonator 403-3 and a resonator 403-4) can have characteristics that are similar to one other.

In the example lattice-type filter 401, there are two "straight" paths with each having a "single-lined" resonator 403-1 or 403-2 and two "cross-coupled" paths with each having a "double-lined" resonator 403-3 or 403-4. The two "cross-coupled" paths form an "X-shaped" architecture of the lattice-type filter 401. Each respective straight path is coupled between two corresponding respective terminals (e.g., upper terminal to upper terminal and lower terminal to lower terminal as depicted) of the first and second transformers 136-1 and 136-2. Each cross-coupled path is coupled between two non-corresponding terminals (e.g., upper terminal to lower terminal and lower terminal to upper terminal as depicted) of the first and second transformers 136-1 and 136-2.

Based on having one or more similar characteristics, the frequency response of the two "single-lined" resonators 403-1 and 403-2 can be at least approximately the same as each other. Analogously, the frequency response of the two "double-lined" resonators 403-3 and 403-4 can be at least approximately the same for each resonator.

Although the example lattice-type filter 401 can provide good performance as a type of bridge filter, the lattice-type filter 401 includes two transformers. Each transformer 136 can occupy a relatively significant area of the filter circuit. For example, for a fourth-order filter in which each resonator 403 is formed from two acoustic resonators, each transformer 136 may consume one-third of the "total" area of the filter circuit. This two-transformer lattice-type filter of FIG. 4 can be modified by eliminating half of the transformers (e.g., one of the two transformers) to produce a single-transformer lattice-type filter, which is described next with reference to FIGS. 5-1 and 5-2.

FIG. 5-1 is a schematic diagram illustrating an example lattice-type filter 500-1 including one transformer 136, multiple resonator arrangements 134-1 to 134-4, and two single-ended ports 132-1 and 132-2. These components correspond to an example filter circuit 130, such as those depicted in FIGS. 1 to 2-4. The filter circuit 130 includes a filter core 272 that is coupled between the two filter ports 132-1 and 132-2.

In example implementations, the filter circuit 130 includes a first port 132-1, a second port 132-2, and the filter core 272. Each of these two ports 132-1 and 132-2 is single ended with one terminal coupled to the filter core 272 and another terminal coupled to a ground 276, which may be a local or a global ground. In addition to the transformer 136, the filter core 272 includes a common node 504 and at least four resonator arrangements: a first resonator arrangement 134-1, a second resonator arrangement 134-2, a third resonator arrangement 134-3, and a fourth resonator arrangement 134-4. The transformer 136 includes four terminals: a first terminal 506-1, a second terminal 506-2, a third terminal 506-3, and a fourth terminal 506-4.

Thus, the transformer 136 may comprises a four-terminal transformer. The transformer 136 includes two coupled inductors (e.g., coils or lines) that are coupled to one another electromagnetically. In the example of FIG. 5-1, the transformer 136 operates as a balun that converts between differential signaling (e.g., on an "internal side" of the transformer 136 that is proximate to the multiple resonator arrangements 134-1 to 134-4 of the filter core 272) and single-ended signaling (e.g., on an "external side" of the transformer 136 that is proximate to the second port 132-2). The first and second terminals 506-1 and 506-2 are coupled to the resonator arrangements of the filter core 272. The third terminal 506-3 is coupled to the second port 132-2. The fourth terminal 506-4 is coupled to the ground 276.

In some implementations, the transformer 136 includes two inductors: a first inductor 510-1 and a second inductor 510-2. The first inductor 510-1 is magnetically or electromagnetically coupled to the second inductor 510-2. As shown, the first inductor 510-1 is coupled between the first terminal 506-1 and the second terminal 506-2. The second inductor 510-2 is coupled between the third terminal 506-3 and the fourth terminal 506-4. The inductors and the terminals of the transformer 136 may, however, be coupled together differently.

Each inductor 510 can be realized in many different manners. Examples for an inductor 510 include a coil, a conductive trace, a conductive line, a stripline, a microstrip, a transmission line, and so forth. These may variously be referred to as a coupled coil, a coupled line, and the like. A transformer 136 can be formed using, for instance, two coupled lines that are disposed on at least one substrate or substrate board; the coupled lines can be broad-side or edge-side coupled. The first and second inductors 510-1 and 510-2 are explicitly indicated in some of the associated drawings; however, a transformer 136 may generally include such first and second inductors 510-1 and 510-2. Alternatively, a transformer 136 may be fabricated in a different manner.

As shown, one terminal of the first port 132-1 is coupled to, and may correspond to, the common node 504. Another terminal of the first port 132-1 is coupled to the ground 276. On another side of the filter circuit 130, one terminal of the second port 132-2 is coupled to, and may correspond to, the third terminal 506-3 of the transformer 136. Another terminal of the second port 132-2 is coupled to the ground 276.

Each of the resonator arrangements is coupled along or to one of two signal paths or paths: a first path 502-1 and a second path 502-2. The first path 502-1 extends between, and is coupled between, the common node 504 and the first terminal 506-1 of the transformer 136. The first resonator arrangement 134-1 is coupled along the first path 502-1 as an "inline" resonator arrangement, and the third resonator arrangement 134-3 is coupled to the first path 502-1 as a "shunt" resonator arrangement. For example, the first resonator arrangement 134-1 can be coupled between the common node 504 and the first terminal 506-1 of the transformer 136. The third resonator arrangement 134-3 can be coupled between the first terminal 506-1 and the ground 276.

The second path 502-2 extends between, and is coupled between, the common node 504 and the second terminal 506-2 of the transformer 136. The second resonator arrangement 134-2 is coupled along the second path 502-2 as another inline resonator arrangement, and the fourth resonator arrangement 134-4 is coupled to the second path 502-2 as another shunt resonator arrangement. For example, the second resonator arrangement 134-2 can be coupled between the common node 504 and the second terminal 506-2 of the transformer 136. The fourth resonator arrangement 134-4 can be coupled between the second terminal 506-2 and the ground 276.

Each resonator arrangement 134 includes at least one component that can individually or jointly resonate at one or more frequencies. In other words, each resonator arrangement 134 can include one or more components to provide a filter or other frequency-based response. These components can be integrated or discrete, including a combination thereof. The components of each resonator arrangement 134 can include one or more inductors and capacitors or at least one acoustic resonator, including combinations thereof. An acoustic resonator may include a surface acoustic wave (SAW) resonator, a bulk acoustic wave (BAW) resonator, and so forth.

In example operations, with the first port 132-1 acting as an input port, the first port 132-1 receives a first signal 274-1 that is single ended. The single-ended first signal 274-1 is converted into a first signal component 508-1 and a second signal component 508-2. The common node 504, for instance, may perform the conversion. The first path 502-1 propagates the first signal component 508-1 through the first resonator arrangement 134-1 and across the third resonator arrangement 134-3 to the first terminal 506-1 of the transformer 136. The second path 502-2 propagates the second signal component 508-2 through the second resonator arrangement 134-2 and across the fourth resonator arrangement 134-4 to the second terminal 506-2 of the transformer 136.

The signal propagations across the first and second signal paths 502-1 and 502-2 can shift the relative phases of the first and second signal components 508-1 and 508-2. For example, the relative phases of the two signal components at the common node 504 may be approximately zero. In contrast, the relative phase difference between the first and second signal components 508-1 and 508-2 can be approximately one hundred and eighty degrees (180°) at the first and second terminals 506-1 and 506-2 of the transformer 136. Thus, the first and second signal components 508-1 and 508-2 can form differential signals at the transformer 136.

The transformer 136 converts the differential signaling of the first and second signal components 508-1 and 508-2 to a second signal 274-2 that is single ended.

On the other hand, with the second port 132-2 acting as an input port, the two conversion operations at the transformer 136 and the common node 504 may operate inversely to those described above. The propagation of the first and second signal components 508-1 and 508-2 may flow in the opposite direction from the transformer 136 to the common node 504. Further, the signal propagations across the first and second signal paths 502-1 and 502-2 can shift the relative phases of the first and second signal components 508-1 and 508-2 to substantially remove the 180° phase difference for signal component combining at the common node 504. Alternatively, as is described below with reference to FIG. 5-2, the transformer 136 may couple a differential signal, which is propagating with multiple signal components through the filter core 272, to the second port 132-2 as another differential signal with multiple components.

Each resonator arrangement 134 can include, have, or be associated with one or more characteristics. Examples of such characteristics can include an impedance, a resonant frequency, a physical structure, a frequency response, and so forth. The impedance may correspond, for instance, to a static capacitance of an acoustic resonator. The impedance may also or instead correspond to a capacitance of a capacitor, an inductance of an inductor, and combinations thereof. The physical structure may correspond, for example, to a size, a shape, or a quantity of components; an interconnection or architecture of the components; and/or a material of composition of the component(s).

One or more of these characteristics of one resonator arrangement 134 may be at least substantially similar to one or more of these characteristics of another resonator arrangement 134. Substantially similar can include, for instance, being at least substantially identical to one another or being architected to be the same. Here, components may be architected to be the same if they are designed or manufactured to be the same. Substantially similar may also or instead include having characteristics that are within 10%, within 5%, or even within 1% of each other.

In FIGS. 5-1 and 5-2, and certain other figures, the resonator arrangements are depicted using either a single line or a double line. Those resonator arrangements that are each depicted using a single line can have one or more characteristics that are substantially similar to each other. Likewise, those resonator arrangements that are each depicted using a double line can have one or more characteristics that are substantially similar to each other. In some implementations, and as shown in FIGS. 5-1 and 5-2, the first resonator arrangement 134-1 is substantially similar to the fourth resonator arrangement 134-4. Likewise, the second resonator arrangement 134-2 is substantially similar to the third resonator arrangement 134-3. In some cases, the substantial similarity may pertain to quantity of component(s), how components are interconnected, impedance(s) of component(s), resonant frequency or frequencies of component(s), and so forth. Thus, the substantial similarity may pertain to a quantity of components, such as by having an equal quantity of acoustic resonators in a set of acoustic resonators per resonator arrangement 134. Additionally or alternatively, the substantial similarity may pertain to having each acoustic resonator in a set of acoustic resonators of one resonator arrangement be associated with an impedance or resonant frequency that is substantially similar to that of a respective acoustic resonator in a set of acoustic resonators of a corresponding resonator arrangement.

FIG. 5-2 is a schematic diagram illustrating an example lattice-type filter 500-2 including one transformer 136, multiple resonator arrangements 134-1 to 134-4, a single-ended port 132-1, and a differential port 132-2. The example lattice-type filter 500-2 is comparable to the example lattice-type filter 500-1 of FIG. 5-1. The second port 132-2, however, is single ended in FIG. 5-1 and differential in FIG. 5-2. As shown, one terminal of the second port 132-2 is coupled to the third terminal 506-3 of the transformer 136, and the other terminal of the second port 132-2 is coupled to the fourth terminal 506-4 of the transformer 136.

Thus, in example implementations, the transformer 136 can receive a differential signal at one inductor of the transformer and forward a differential signal from another inductor of the transformer. If the first port 132-1 is an input port for the filter circuit 130 of FIG. 5-2, then the transformer 136 can receive a differential signal from the multiple resonator arrangements 134-1 to 134-4 and forward a differential signal to the second port 132-2 for outputting from the filter circuit 130. On the other hand, if the second port 132-2 is an input port for the filter circuit 130, then the transformer 136 can receive a differential signal from the second port 132-2. The transformer 136 can forward the differential signal to the multiple resonator arrangements 134-1 to 134-4 for propagation to the common node 504 and phase shifting during the signal propagation.

FIGS. 6 to 9-2 are circuit diagrams illustrating various examples of lattice-type filters. More specifically, with reference also to FIGS. 5-1 and 5-2, each figure depicts a filter core 272 including a transformer 136 and multiple resonator arrangements 134-1 to 134-4. Within a given filter core 272, the first and fourth resonator arrangements 134-1 and 134-4 can be substantially similar to each other as indicated by the single dashed lines outlining each component. Similarly, within a given filter core 272, the second and third resonator arrangements 134-2 and 134-3 can be substantially similar to each other as indicated by the double dashed lines outlining each component.

Figures 3, 4, 5, 6:
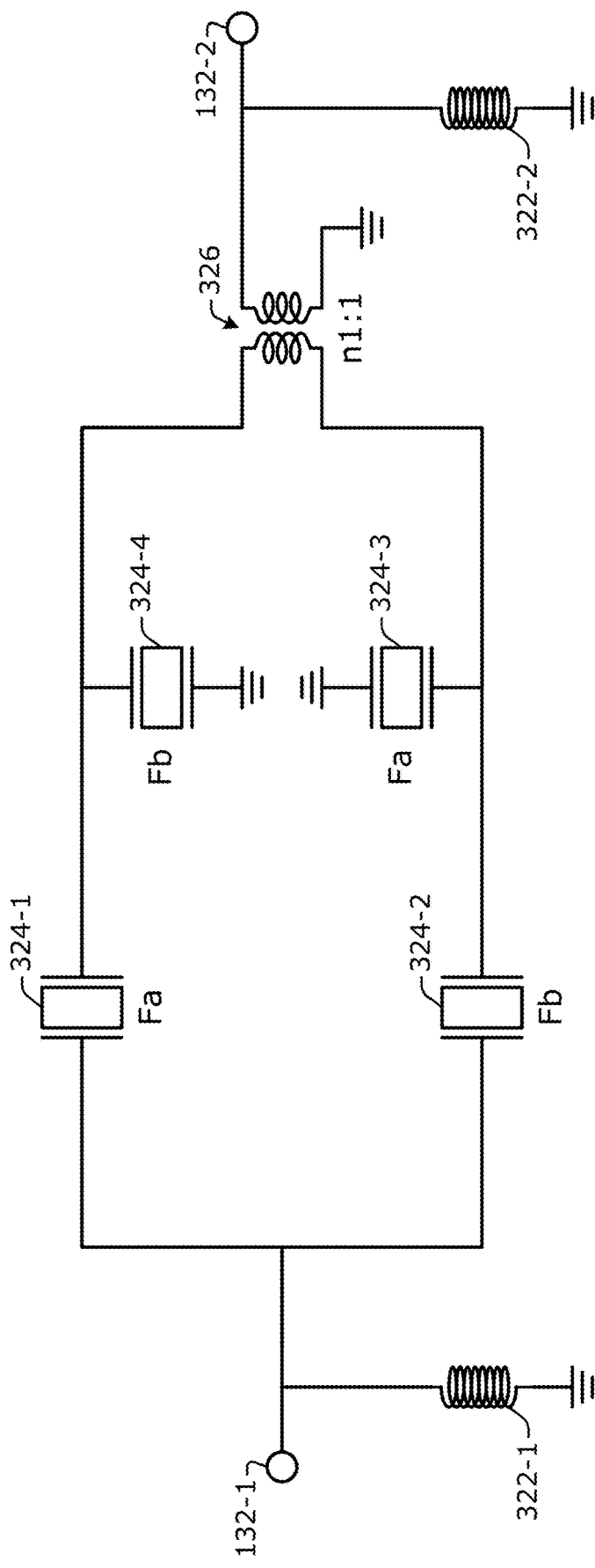
Figures 1, 8:
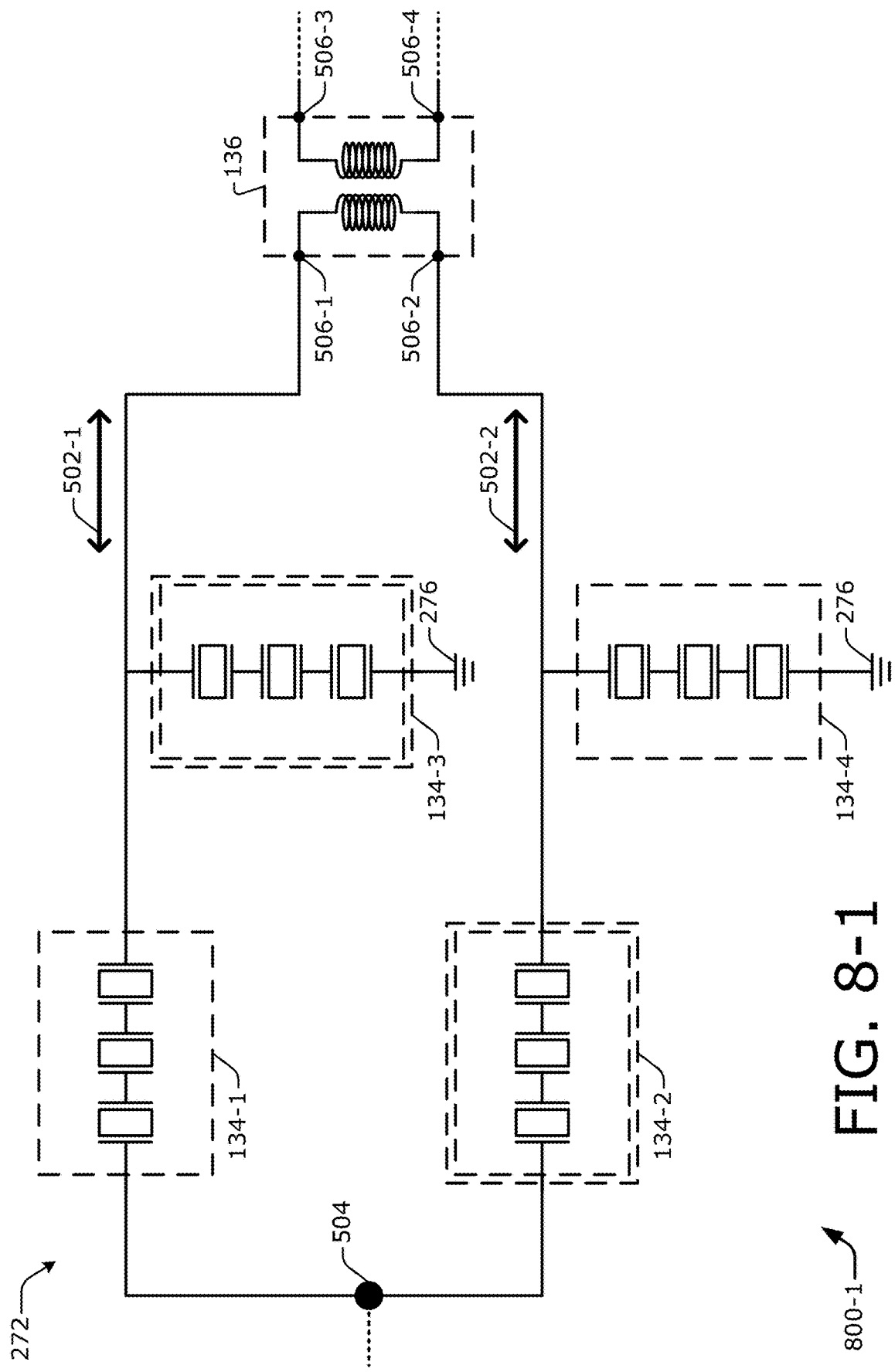
Figures 2, 8:
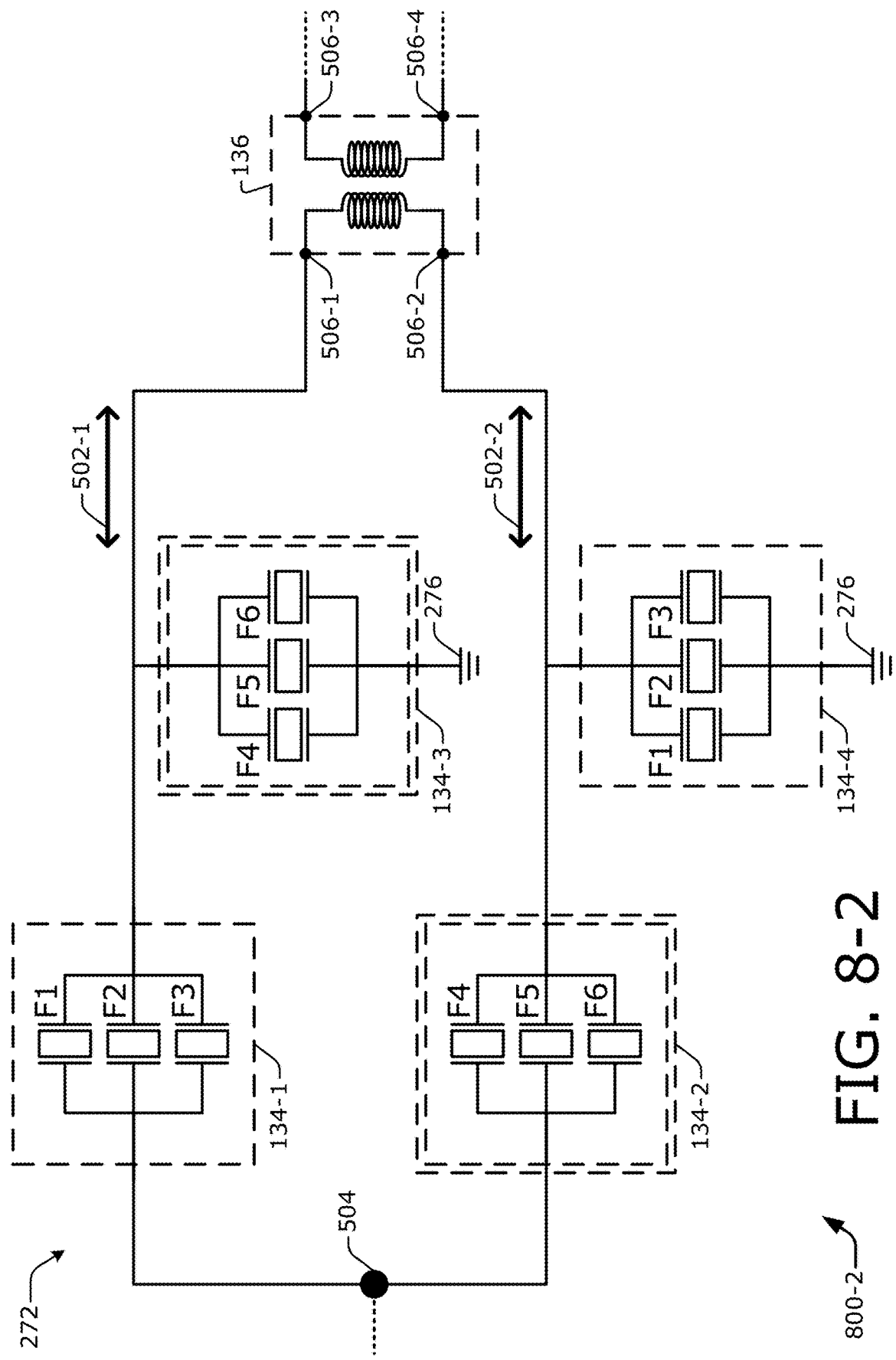

In the example implementations illustrated in FIGS. 6 to 9-2, each resonator arrangement 134 includes at least one acoustic resonator. These illustrated example implementations include one, two, three, and four acoustic resonators per resonator arrangement 134. The acoustic resonators within a given resonator arrangement 134 can be coupled together in series, in parallel, or in a combination of series and parallel connections. FIG. 6 pertains to having one acoustic resonator per resonator arrangement 134, and FIGS. 7-1 and 7-2 pertain to having two acoustic resonators per resonator arrangement 134. FIGS. 8-1 and 8-2 pertain to having three acoustic resonators per resonator arrangement 134, and FIGS. 9-1 and 9-2 pertain to having four acoustic resonators per resonator arrangement 134.

FIG. 6 is a circuit diagram 600 illustrating an example lattice-type filter core 272 in which each resonator arrangement 134 is realized with an example of one acoustic resonator 602. The first resonator arrangement 134-1 is coupled along the first path 502-1, and the third resonator arrangement 134-3 is coupled to the first path 502-1. The second resonator arrangement 134-2 is coupled along the second path 502-2, and the fourth resonator arrangement 134-4 is coupled to the second path 502-2.

In example implementations, each resonator arrangement 134 includes one (e.g., a single) acoustic resonator 602. More specifically, the first resonator arrangement 134-1 includes a first acoustic resonator 602-1, and the second resonator arrangement 134-2 includes a second acoustic resonator 602-2. Further, the third resonator arrangement 134-3 includes a third acoustic resonator 602-3, and the fourth resonator arrangement 134-4 includes a fourth acoustic resonator 602-4.

In some cases, a shunt resonator that is coupled to a given path can have a different characteristic as compared to a series resonator that is coupled inline along the given path. Thus, the shunt resonator 602-3 that is coupled to the first path 502-1 can have at least one different characteristic as compared to the series resonator 602-1 that is coupled along the first path 502-1. Analogously, the shunt resonator 602-4 that is coupled to the second path 502-2 can have at least one different characteristic as compared to the series resonator 602-2 that is coupled along the second path 502-2.

Additionally or alternatively, a shunt resonator that is coupled to a given path can have a substantially similar (including a same) characteristic compared to a series resonator that is coupled along another path. Thus, the shunt resonator 602-3 that is coupled to the first path 502-1 can have at least one substantially similarly characteristic as compared to the series resonator 602-2 that is coupled along the second path 502-2. Analogously, the shunt resonator 602-4 that is coupled to the second path 502-2 can have at least one substantially similar characteristic as compared to the series resonator 602-1 that is coupled along the first path 502-1.

Generally, the first resonator 602-1 may be associated with a first characteristic, the second resonator 602-2 may be associated with a second characteristic, the third resonator 602-3 may be associated with a third characteristic, and the fourth resonator 602-4 may be associated with a fourth characteristic. The substantially similar characteristic may be selected from a group of characteristics including, for example, a resonant frequency or an impedance value, such as a static capacitance. Thus, the first resonator 602-1 may correspond to a first resonant frequency, the second resonator 602-2 may correspond to a second resonant frequency, the third resonator 602-3 may correspond to a third resonant frequency, and the fourth resonator 602-4 may correspond to a fourth resonant frequency. Further, the first resonator 602-1 may have a first impedance, the second resonator 602-2 may have a second impedance, the third resonator 602-3 may have a third impedance, and the fourth resonator 602-4 may have a fourth impedance. By way of example, the second impedance may be substantially similar to the third impedance, and the second resonant frequency may be substantially similar to the third resonant frequency.

The filter cores depicted in FIGS. 7-1 to 9-2 illustrate how each resonator 602 of FIG. 6 can be realized with multiple acoustic resonators with resonator arrangements. For example, each resonator of at least two resonators that are selected from a group of resonators including the first resonator, the second resonator, the third resonator, and the fourth resonator can include multiple acoustic resonators. More specifically, the at least two selected resonators may be realized with least two respective sets of multiple acoustic resonators.

Consider implementations in which the resonator arrangements are formed with a single acoustic resonator structure. With regard to substantially similar resonators, a single series acoustic resonator in one path (e.g., a first path) may further be effectively identical to, or a duplicate of, a single parallel acoustic resonator in another path (e.g., a second path). Thus, a single parallel acoustic resonator in the one path (e.g., the first path) may further be effectively identical to, or a duplicate of, a single series acoustic resonator in the other path (e.g., the second path). In some cases, two acoustic resonator structures may be effectively identical to each other, or duplicates of one another, if the two acoustic resonator structures are the same within expected manufacturing tolerances or fabrication variances of a given production technology. Also, consider implementations in which the resonator arrangements are formed with a double acoustic resonator structure. With regard to substantially similar resonators, a series acoustic resonator of a pair of series acoustic resonators in one path (e.g., a first path) may further be effectively identical to, or a duplicate of, a parallel acoustic resonator of a pair of parallel acoustic resonators in another path (e.g., a second path). Thus, a given parallel acoustic resonator of a pair of parallel acoustic resonators in the one path (e.g., the first path) may further be effectively identical to, or a duplicate of, a given series acoustic resonator of a pair of series acoustic resonators in the other path (e.g., the second path).

Resonator arrangements having three or more acoustic resonator structures per arrangement may also have respective corresponding acoustic resonator structures in the opposite configuration (e.g., series versus parallel arrangements) that are effectively identical or duplicates of acoustic resonator structures in the other path. Generally, a multi-acoustic-resonator series resonator arrangement in one path (e.g., a first path) may further be effectively identical to, or a duplicate of, a multi-acoustic-resonator parallel resonator arrangement in another path (e.g., a second path), regardless of a quantity of acoustic resonator structures per resonator arrangement. Thus, a multi-acoustic-resonator parallel resonator arrangement in the one path (e.g., the first path) may further be effectively identical to, or a duplicate of, a multi-acoustic-resonator series resonator arrangement in the other path (e.g., the second path).

Figures 3, 4, 5, 6, 7:
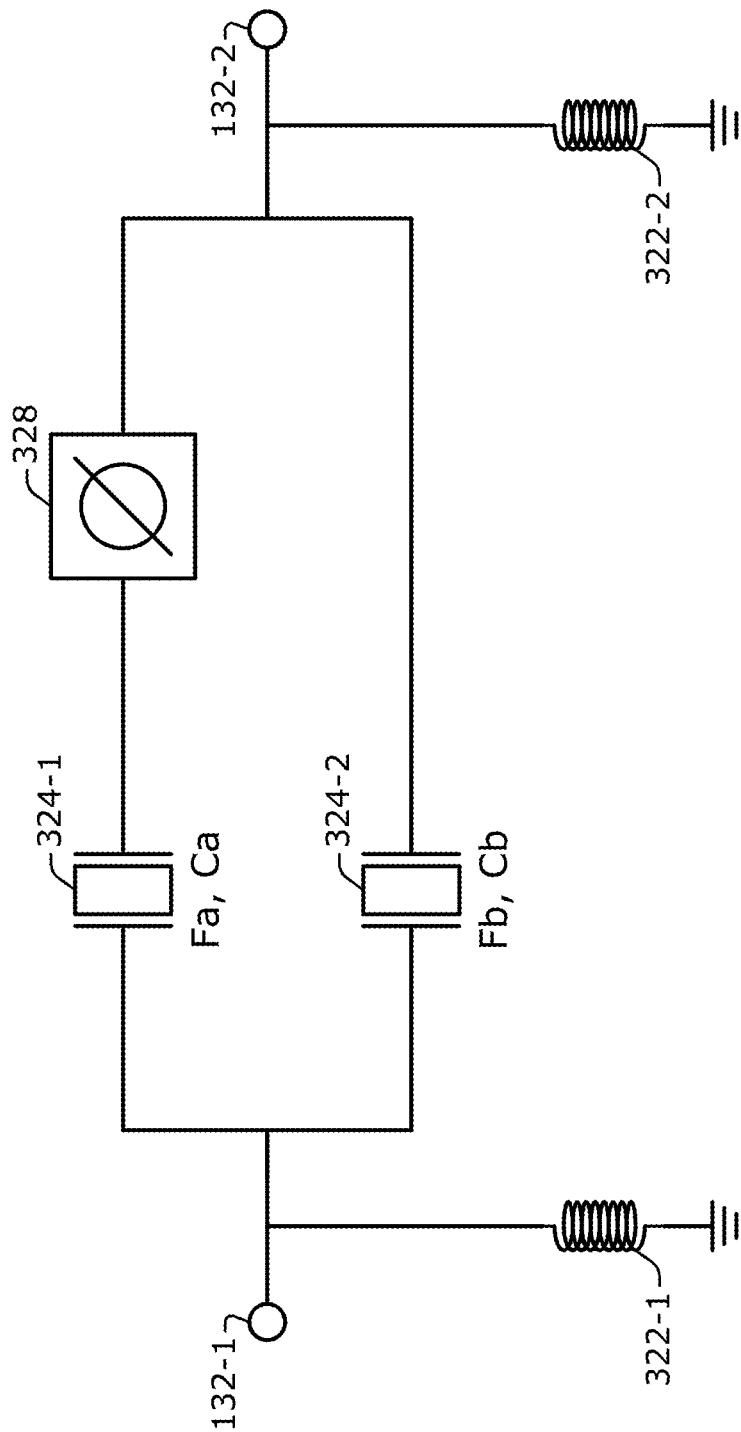
Figure 4:
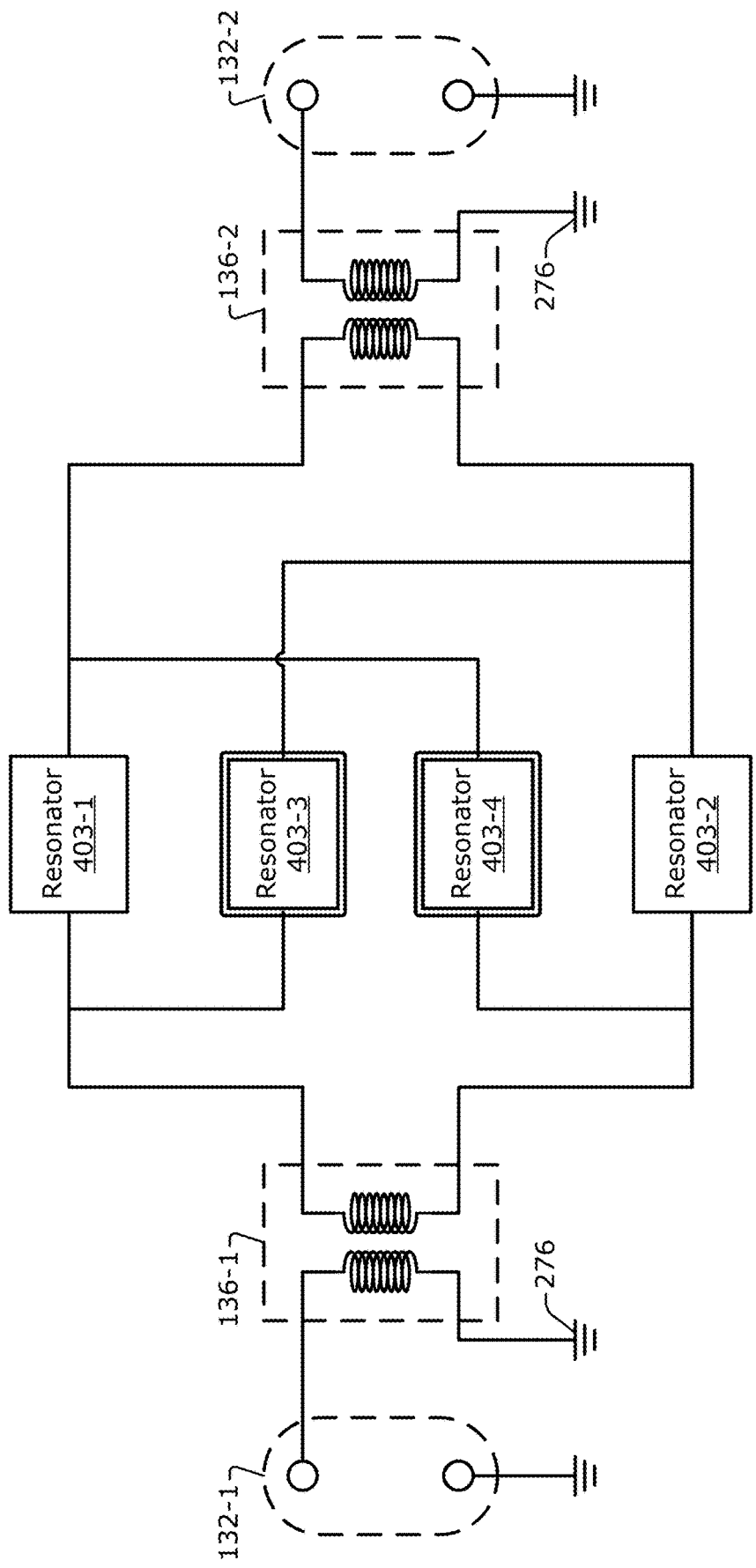
Figures 1, 5:
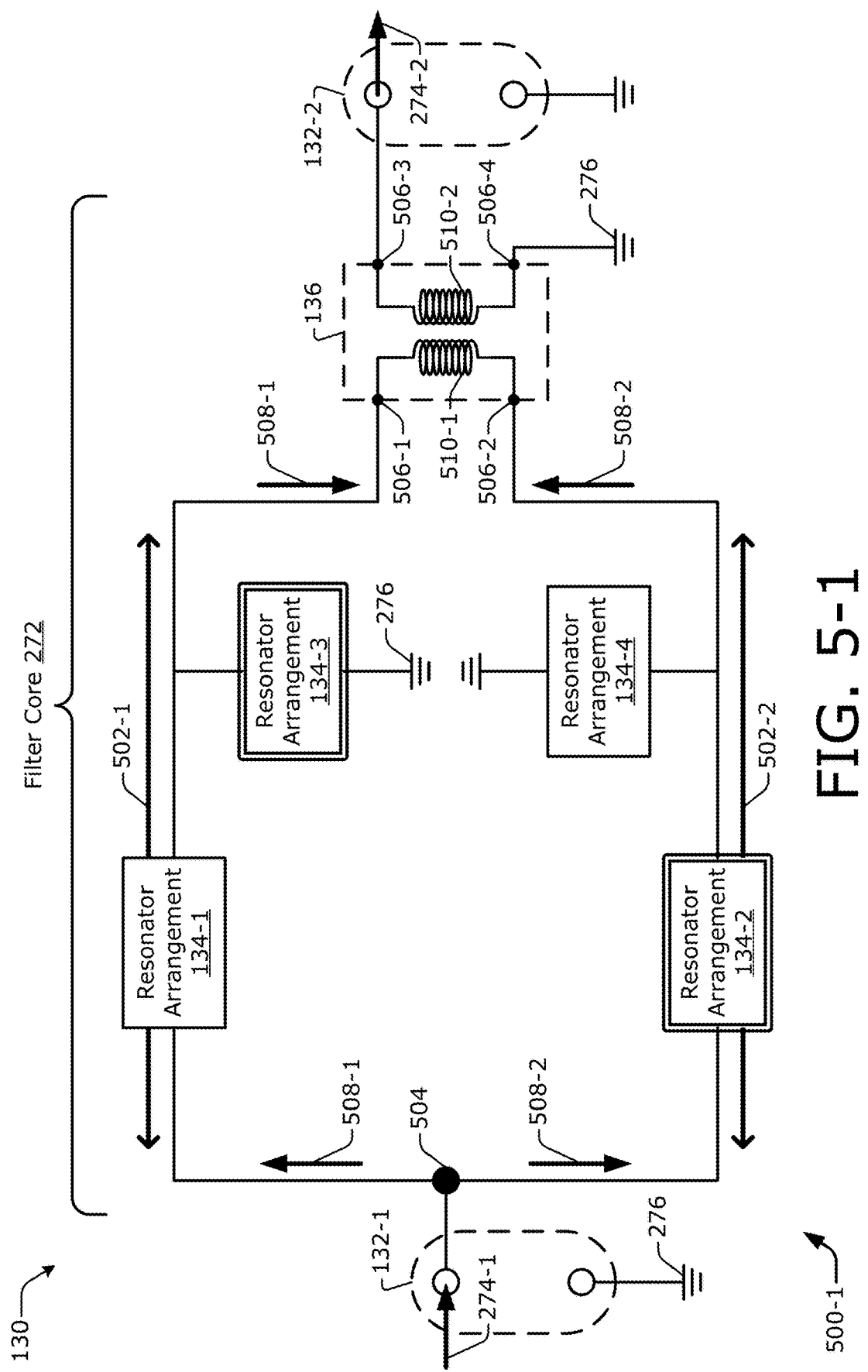
Figures 2, 5:
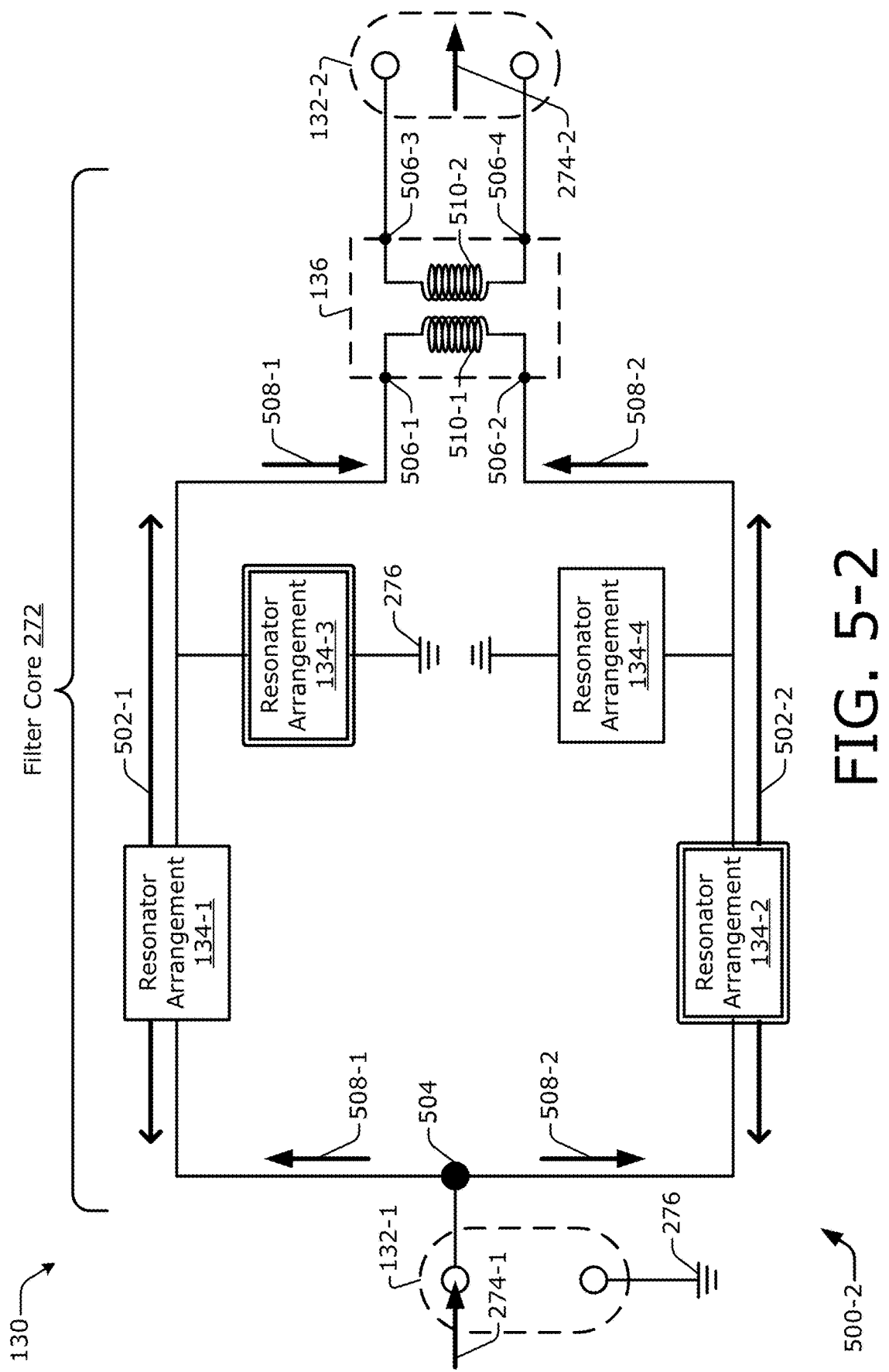
Figure 6:
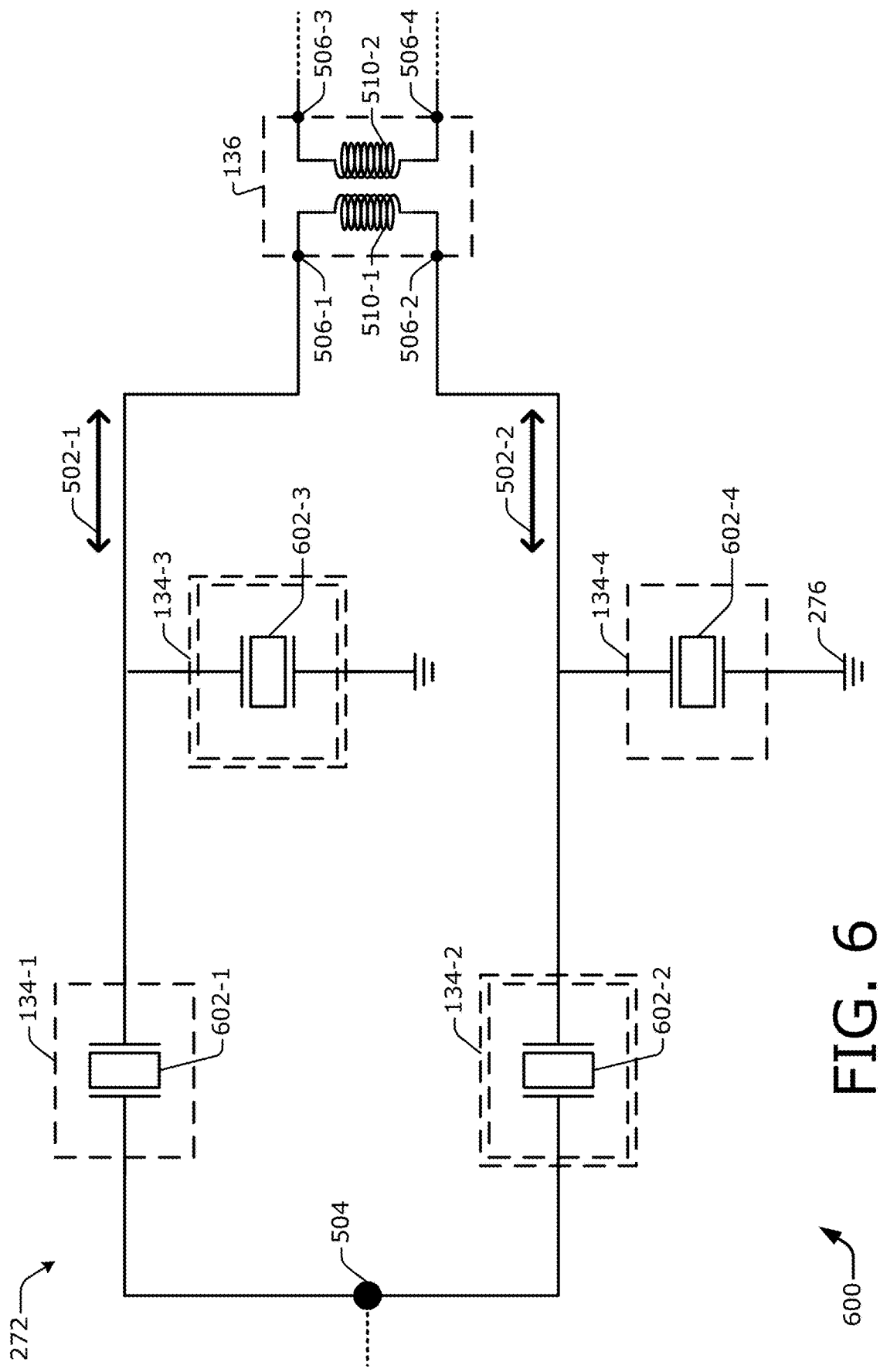
Figures 1, 7:
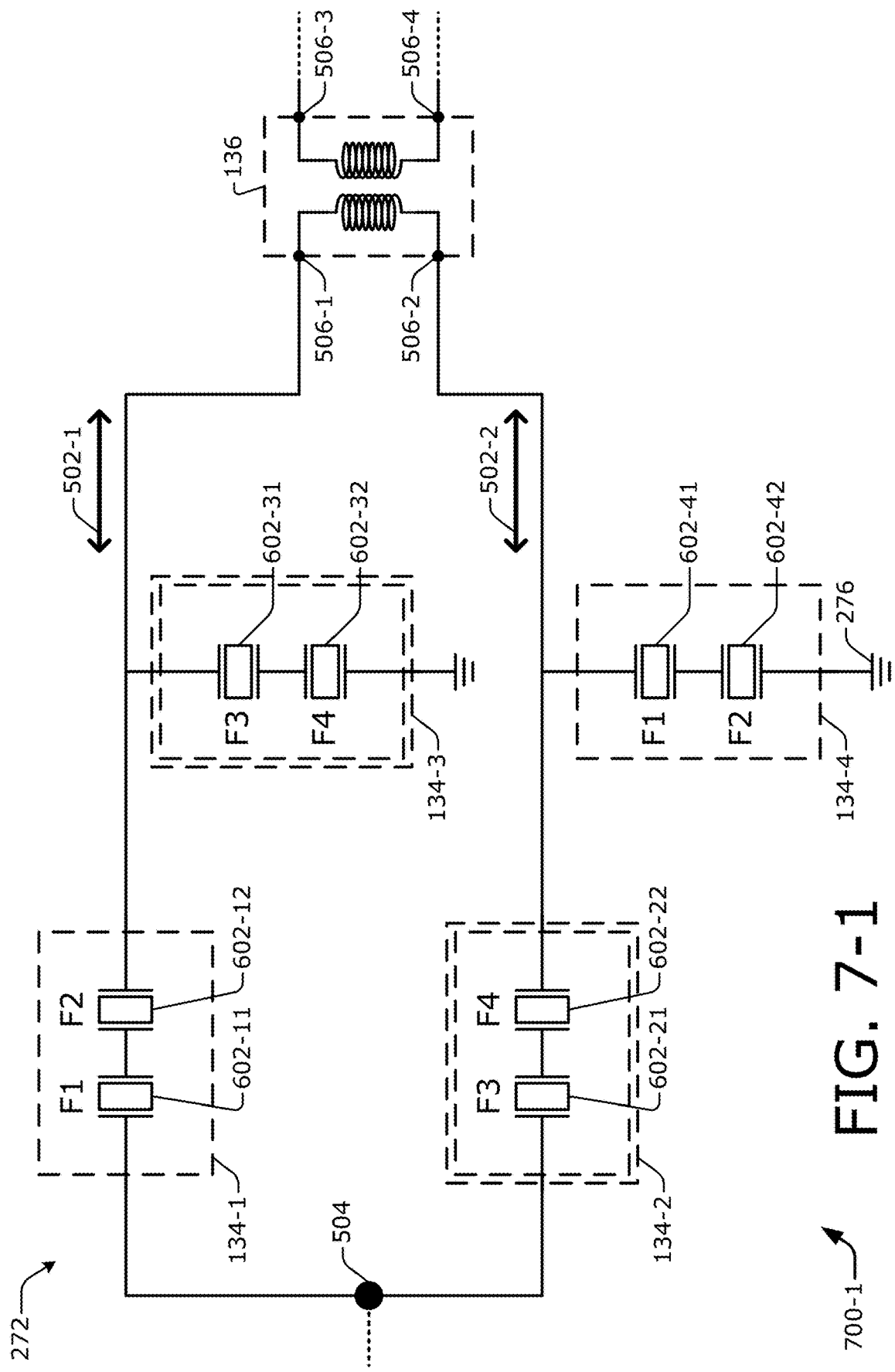
Figures 2, 7:
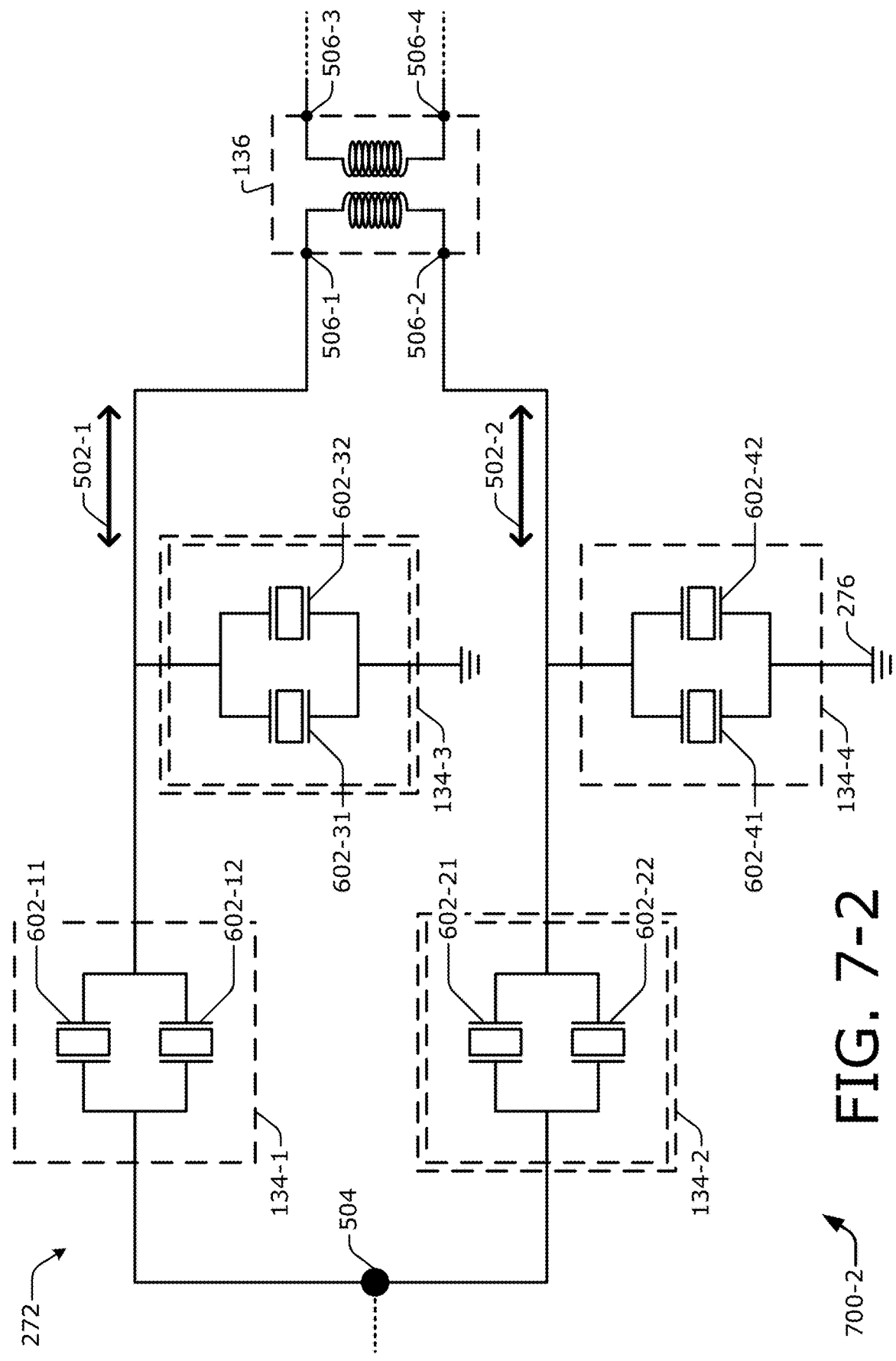

FIGS. 7-1 and 7-2 are circuit diagrams 700-1 and 700-2 illustrating example lattice-type filter cores 272 in which each resonator arrangement 134 is realized with an example of two acoustic resonators in a series and parallel connection, respectively. The circuit diagram 700-1 has two respective acoustic resonators that are coupled together in series "within" each respective resonator arrangement 134. The circuit diagram 700-2 has two respective acoustic resonators that are coupled together in parallel "within" each respective resonator arrangement 134.

With reference to FIG. 7-1, the first resonator arrangement 134-1 includes a first acoustic resonator 602-11 and a second acoustic resonator 602-12. The second resonator arrangement 134-2 includes a third acoustic resonator 602-21 and a fourth acoustic resonator 602-22. The third resonator arrangement 134-3 includes a fifth acoustic resonator 602-31 and a sixth acoustic resonator 602-32. The fourth resonator arrangement 134-4 includes a seventh acoustic resonator 602-41 and an eighth acoustic resonator 602-42. By way of example, the first acoustic resonator 602-11 is coupled in series with the second acoustic resonator 602-12 between the common node 504 and the first terminal 506-1 of the transformer 136. Also, the seventh acoustic resonator 602-41 is coupled in series with the eighth acoustic resonator 602-42 between the second terminal 506-2 of the transformer 136 and the ground 276.

As described above, one or more characteristics, such as impedance or resonant frequency, of one resonator arrangement 134 may be substantially similar to those of another resonator arrangement 134. These substantial similarities are indicated by the single and double dashed lines depicting the resonator arrangements. For clarity, a resonant frequency characteristic—instead of an impedance characteristic—is discussed below by way of example only. Four resonant frequencies F1, F2, F3, and F4 are illustrated in FIG. 7-1.

The first and seventh acoustic resonators 602-11 and 602-41 have the first resonant frequency F1. The second and eighth acoustic resonators 602-12 and 602-42 have the second resonant frequency F2. The third and fifth acoustic resonators 602-21 and 602-31 have the third resonant frequency F3. The fourth and sixth acoustic resonators 602-22 and 602-32 have the fourth resonant frequency F4.

In this example, the first, second, third, and fourth resonant frequencies F1, F2, F3, and F4 are different from each other. (One or more of such resonant frequencies, however, may be substantially similar to each other in other examples.) Thus, although the first and third resonator arrangement 134-1 and 134-3 are associated with the same path 502-1, each has acoustic resonators with different resonant frequencies. Also, regarding the first and fourth resonator arrangements 134-1 and 134-4, the respective acoustic resonators thereof have the same resonant frequencies. Similarly, regarding the second and third resonator arrangements 134-2 and 134-3, the respective acoustic resonators thereof have the same resonant frequencies.

Additionally or alternatively, the resonant frequencies (or other characteristics) of the acoustic resonators that are within or included as part of a given resonator arrangement 134 may be different from each other. For example, the first acoustic resonator 602-11 has a first resonant frequency F1 that is different from the second resonant frequency F2 of the second acoustic resonator 602-12. This intra-resonator arrangement difference of resonant frequencies (or other characteristics) of the acoustic resonators included within a single resonator arrangement 134 enables the frequency or filter response of the associated lattice-type filter circuit 130 to be established with more selectivity. With respect to a resonant frequency characteristic in particular, a quantity of different resonant frequencies can define an order of a filter. For instance, a fourth-order filter can be enabled with the four different resonant frequencies illustrated for FIG. 7-1. A higher order for a filter typically provides a higher level of selectively for the frequency response of the filter. Thus, a sixth-order filter (e.g., which can be achieved with a filter as shown in FIG. 8-1 or 8-2 as described below) may be more selective than a fourth-order filter.

With reference to FIG. 7-2, each resonator arrangement 134 includes two acoustic resonators that are coupled together in parallel for the respective resonator arrangement 134. By way of example, for the first resonator arrangement 134-1, the first acoustic resonator 602-11 is coupled in parallel with the second acoustic resonator 602-12 between the common node 504 and the first terminal 506-1 of the transformer 136. Also, the seventh acoustic resonator 602-41 is coupled in parallel with the eighth acoustic resonator 602-42 between the second terminal 506-2 of the transformer 136 and the ground 276.

FIGS. 8-1 and 8-2 are circuit diagrams 800-1 and 800-2 illustrating example lattice-type filter cores 272 in which each resonator arrangement 134 is realized with an example of three acoustic resonators in series and parallel connections, respectively. The circuit diagram 800-1 has three respective acoustic resonators that are coupled together in series for each respective resonator arrangement 134. The circuit diagram 800-2 has three respective acoustic resonators that are coupled together in parallel for each respective resonator arrangement 134.

With reference to FIG. 8-1, and by way of example, the first resonator arrangement 134-1 has three acoustic resonators coupled together in series between the common node 504 and the first terminal 506-1 of the transformer 136. Also, the third resonator arrangement 134-3 has three acoustic resonators coupled together in series between the first terminal 506-1 of the transformer 136 and the ground 276.

With reference to FIG. 8-2, each resonator arrangement 134 includes three acoustic resonators that are coupled together in parallel for the respective resonator arrangement 134. By way of example, the first resonator arrangement 134-1 has three acoustic resonators coupled together in parallel between the common node 504 and the first terminal 506-1 of the transformer 136. Also, the third resonator arrangement 134-3 has three acoustic resonators coupled together in parallel between the first terminal 506-1 of the transformer 136 and the ground 276.

Generally, for both FIGS. 8-1 and 8-2, the acoustic resonators of a given resonator arrangement 134 may have the same or different characteristics relative to other acoustic resonators of the given resonator arrangement 134. Further, the three acoustic resonators of the first resonator arrangement 134-1 can have substantially similar characteristics respectively to the three acoustic resonators of the fourth resonator arrangement 134-4. Likewise, the three acoustic resonators of the second resonator arrangement 134-2 can have substantially similar characteristics respectively to the three acoustic resonators of the third resonator arrangement 134-3.

For clarity, the individual acoustic resonators of the resonator arrangements of FIGS. 8-1 and 8-2 are not assigned individual reference numbers. For brevity, an example characteristic for each acoustic resonator is omitted from FIG. 8-1. For FIG. 8-2, however, an example characteristic—a resonant frequency "F"—is depicted relative to or in association with each acoustic resonator. In a described example, the six resonant frequencies F1, F2, F3, F4, F5, and F6 may be different from one another. For instance, at least a first frequency F1 may differ from a third frequency F3 "within" a single resonator arrangement 134. A resonant frequency of FX (with "X" representing an integer from 1 to 6) for an acoustic resonator in one resonator arrangement 134 is, however, substantially similar to a resonant frequency of FX for a respective acoustic resonator in another resonator arrangement 134.

As shown in FIG. 8-2, the three inline acoustic resonators of the first (inline) resonator arrangement 134-1 have three resonant frequencies of F1, F2, and F3. The three shunt acoustic resonators of the fourth (shunt) resonator arrangement 134-4 have the same three resonant frequencies of F1, F2, and F3, or at least resonant frequencies that are substantially similar thereto. Similarly, the three inline acoustic resonators of the second (inline) resonator arrangement 134-2 have three resonant frequencies of F4, F5, and F6. The three shunt acoustic resonators of the third (shunt) resonator arrangement 134-3 have the same three resonant frequencies of F4, F5, and F6, or at least resonant frequencies that are substantially similar thereto.

Figures 1, 9:
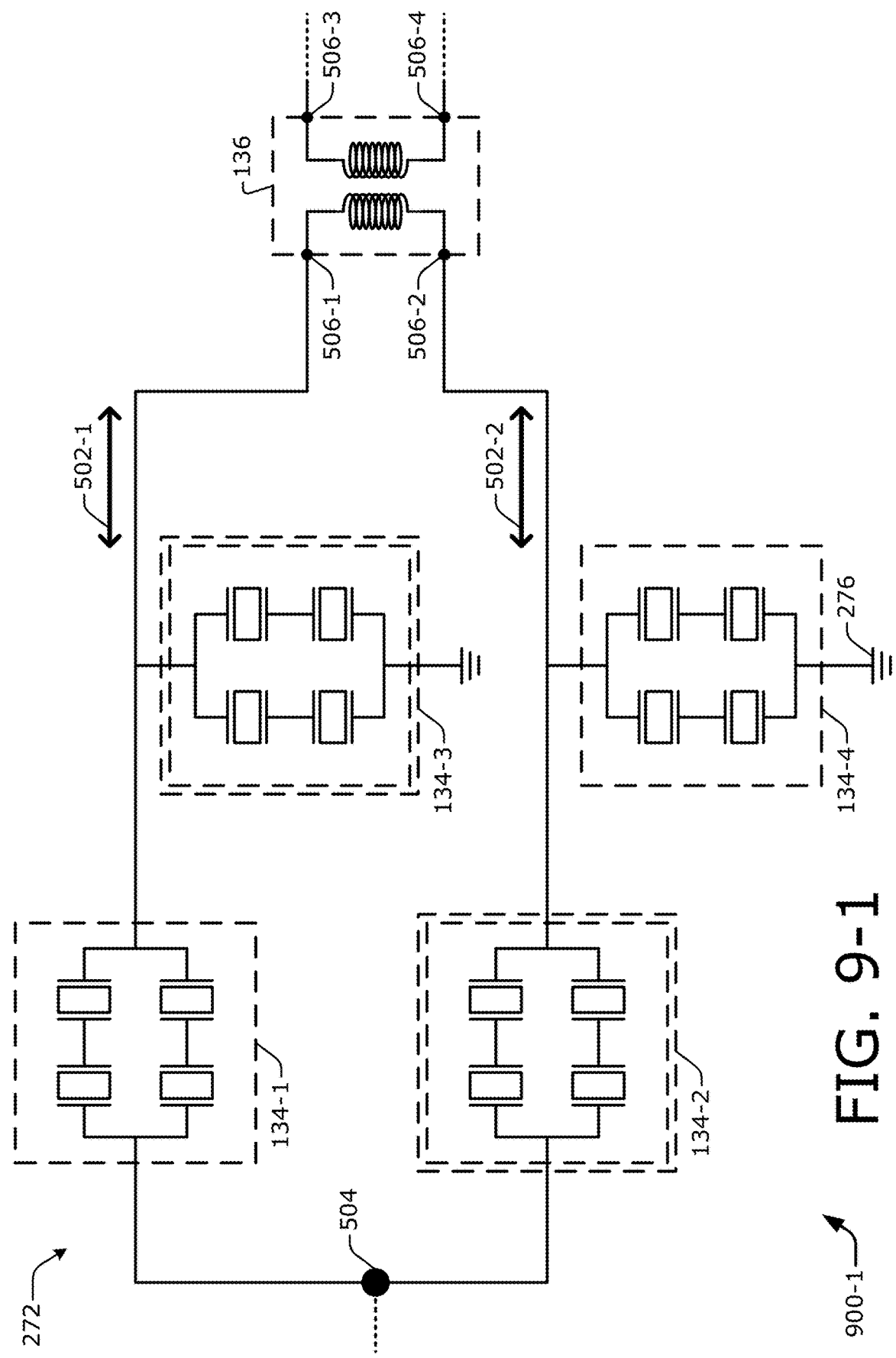
Figures 2, 9:
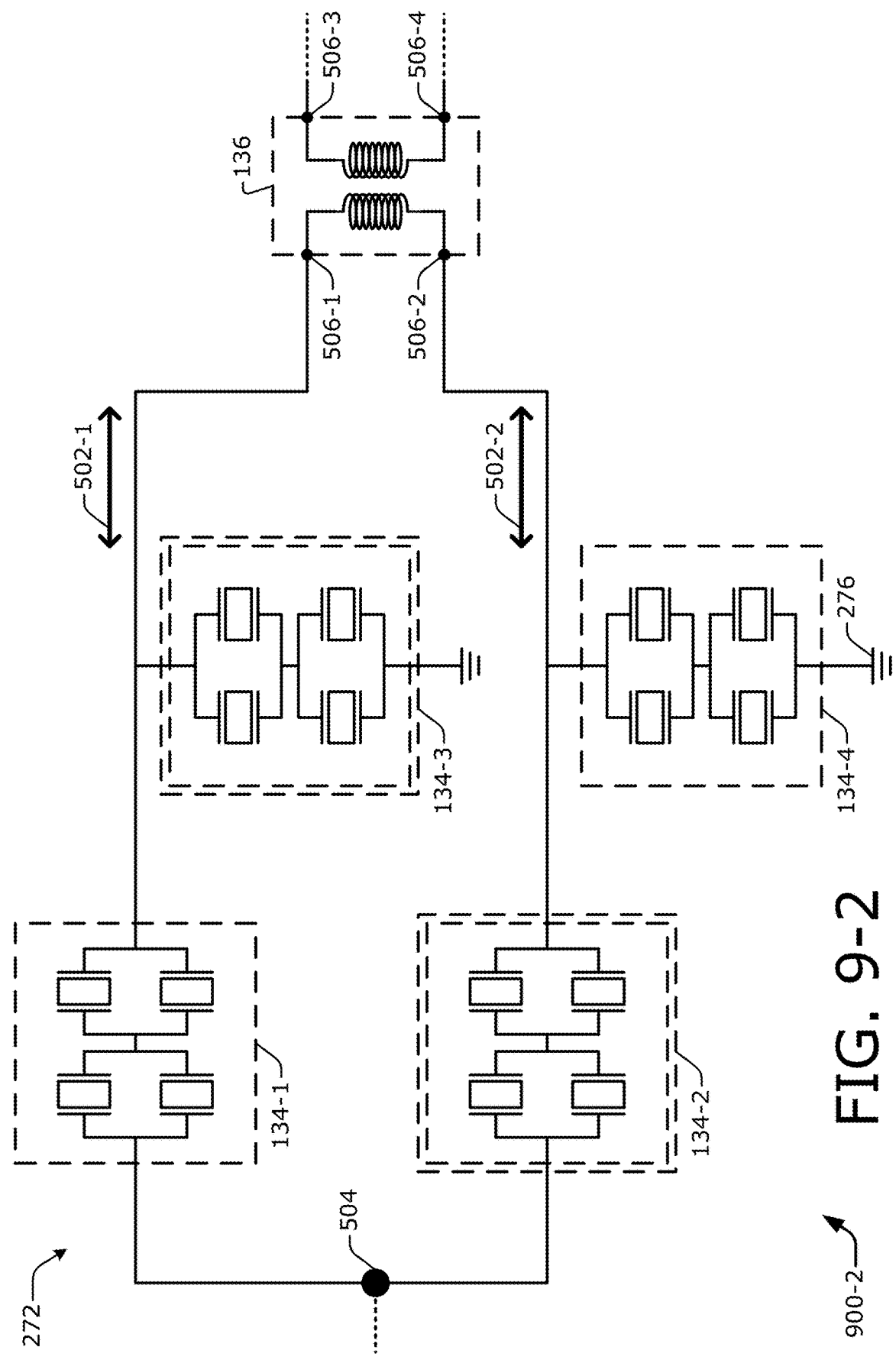

FIGS. 9-1 and 9-2 are circuit diagrams 900-1 and 900-2 illustrating example lattice-type filter cores 272 in which each resonator arrangement is realized with an example of four acoustic resonators in different combinations of series and parallel connections. In FIG. 9-1, each resonator arrangement 134 includes four acoustic resonators that are "series-to-parallel" connected. In each resonator arrangement 134, two acoustic resonators are coupled together in series. A pair of such series-connected acoustic resonators are further coupled together in parallel for each resonator arrangement 134.

In FIG. 9-2, each resonator arrangement 134 includes four acoustic resonators that are "parallel-to-series" connected. In each resonator arrangement 134 of FIG. 9-2, two acoustic resonators are coupled together in parallel. A pair of such parallel-connected acoustic resonators are then coupled together in series for each resonator arrangement 134. These and other combinations of parallel- and series-connected acoustic resonators can be used to balance the relatively lower insertion loss provided by parallel connections with the relatively greater ability of series connections to handle higher power levels.

The examples of categories of resonator characteristics, the examples of corresponding resonators in different resonator arrangements having substantially similar characteristics, and so forth that are described above with reference to FIGS. 6 to 8-2 may also be implemented with respect to the circuit diagrams of FIGS. 9-1 and 9-2. Further, resonator arrangements may have more than four acoustic resonators per resonator arrangement 134, and any such quantity of acoustic resonators may be coupled together in a multitude of diverse manners.

Figure 10:
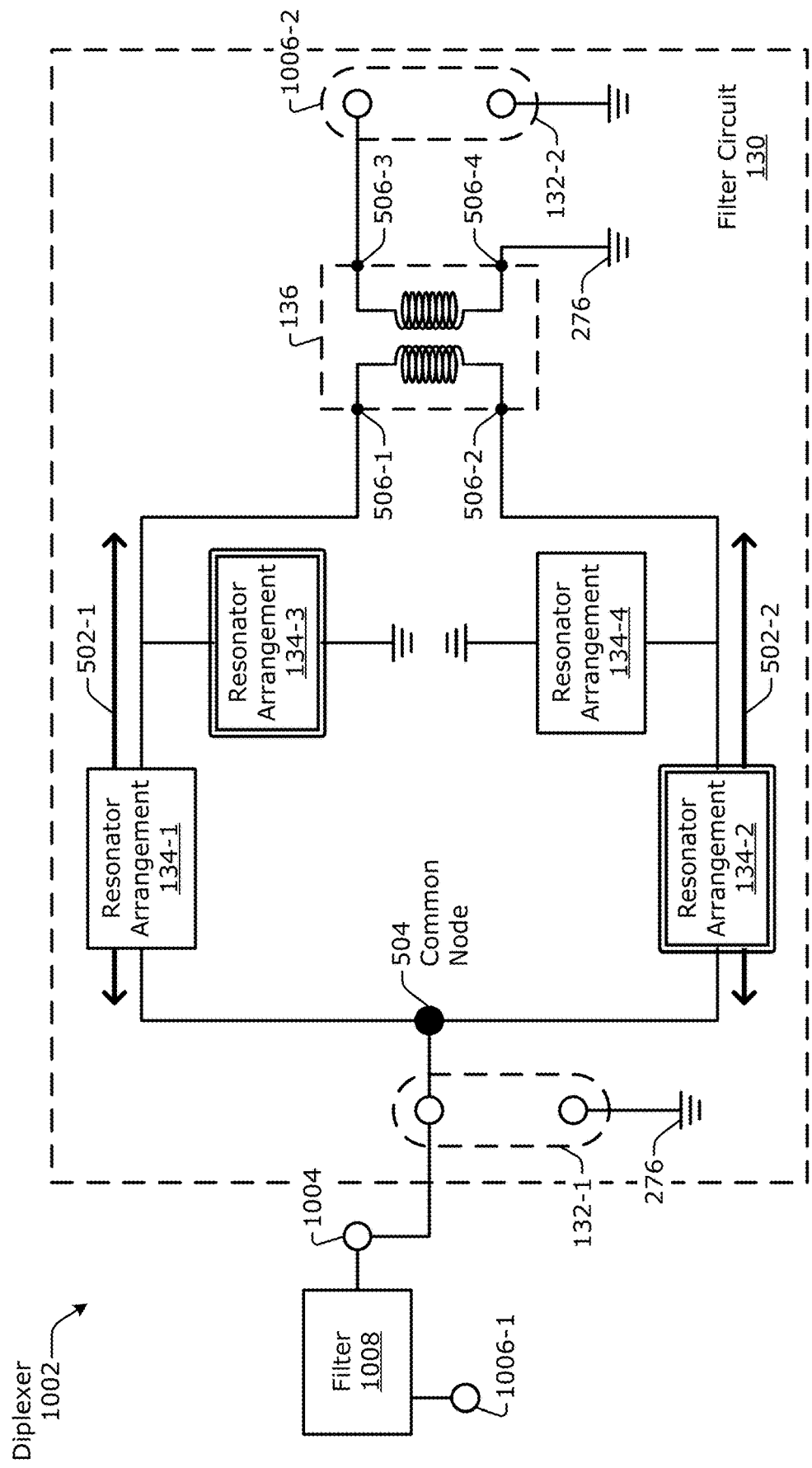
FIG. 10 is a schematic diagram illustrating an example lattice-type filter incorporated into a diplexer via a common node of the lattice-type filter.

FIG. 10 is a schematic diagram 1000 illustrating an example lattice-type filter circuit 130 incorporated into a diplexer 1002 via a common node 504 of the lattice-type filter. As illustrated, the example diplexer 1002 includes the filter circuit 130, a filter 1008, and three terminals: a first terminal 1006-1, a second terminal 1006-2, and a common terminal 1004. In example implementations, the filter 1008 is coupled to the filter circuit 130 via the common terminal 1004 of the diplexer 1002. Further, the common terminal 1004 of the diplexer 1002 is coupled to a port 132 of the filter circuit 130 that is coupled to, and may correspond to, the common node 504 of the filter circuit 130 and that is remote or distant from the transformer 136. The common terminal 1004 may be coupled toward an antenna (e.g., of FIGS. 1, 2-1, and 2-2). The first terminal 1006-1 is associated with and is coupled to the filter 1008. The second terminal 1006-2 is associated with and is coupled to the filter circuit 130. The second terminal 1006-2 is coupled to, and may correspond to, the second port 132-2 as shown.

In the depicted example, the common terminal 1004 is coupled to the first port 132-1, which has a terminal that is coupled to the common node 504. This positions the transformer 136 farther from the filter 1008. Otherwise, a transformer of a filter can impact nearby frequency-dependent components by consuming energy and creating a deep notch. Thus, by employing a filter circuit 130 that lacks or omits a transformer 136 near at least one port 132, a filter 1008 of the diplexer 1002 can function without being appreciably degraded by a transformer of the filter circuit 130. A filter circuit 130 can be analogously incorporated into a triplexer or other multi-filter component.

Figure 11:
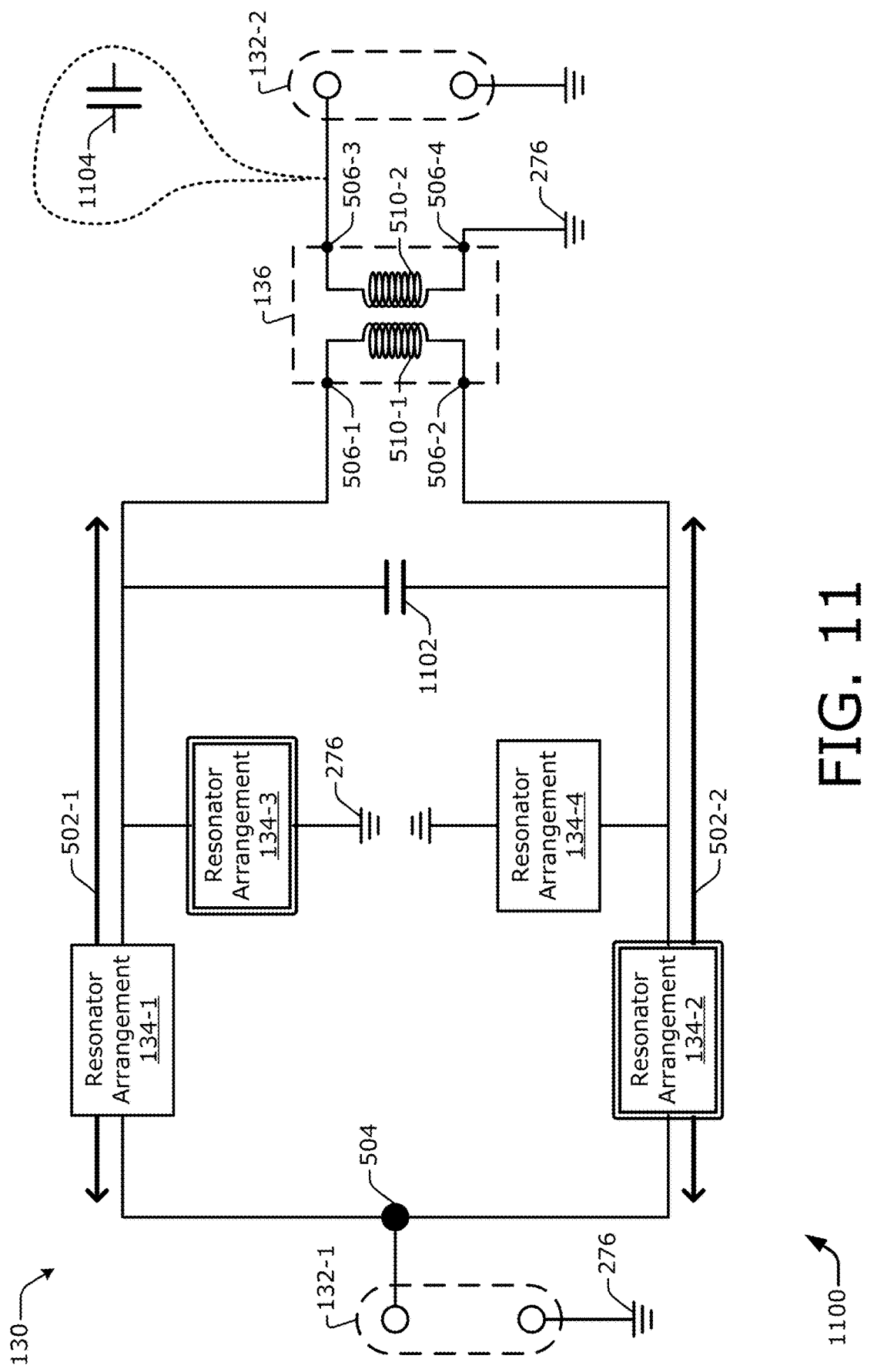
FIG. 11 is a schematic diagram illustrating an example lattice-type filter including a capacitor coupled across two terminals of a transformer of the lattice-type filter.

FIG. 11 is a schematic diagram 1100 illustrating an example lattice-type filter circuit 130 including a capacitor 1102 coupled across two terminals of a transformer 136 of the lattice-type filter. As shown, the transformer 136 includes two inductors that are electromagnetically coupled. The inductors can be realized with coils, coupled lines, and so forth. The inductive values, line lengths, and/or number of windings of the inductors of the transformer 136 may be the same or different. With a non-ideal transformer, the coupling coefficient "K" is less than one (K<1)—e.g., is anon-ideal coupling coefficient. This K<1 coupling coefficient of a non-ideal transformer can be at least partially compensated for by including a capacitor as described herein.

In example implementations, the capacitor 1102 is coupled between the terminals of the transformer 136 that are on the "interior" or "internal" side of the filter core or that are coupled to the multiple resonator arrangements 134-1 to 134-4. As shown in FIG. 11, the capacitor 1102 is coupled between the first terminal 506-1 and the second terminal 506-2 of the transformer 136. A value of the capacitor 1102 can be selected based on a frequency of operation (e.g., in the single-digit GHz range) and the filter impedance (e.g., between 25 to 75 ohms, such as 50 ohms). The capacitive value may be, for instance, in the picofarad (pF) range. Other frequencies, impedances, or capacitor values, however, may be considered or employed for a capacitor 1102. During operation, the capacitor 1102 can at least partially compensate for a non-ideal property of the transformer 136. The capacitor 1102 may be formed from multiple capacitors. Although not depicted in each figure, the capacitor 1102 may be included in other circuits that are described herein. For example, the capacitor 1102 may be coupled to the terminals of a transformer as shown in FIG. 11 in the circuits of, e.g., FIGS. 5-1, 5-2, 10, and 12, the latter of which is described below.

In some implementations, the filter circuit 130 can include a capacitor 1104 coupled between a terminal of the transformer 136 and a terminal of the port 132 that is coupled on the same side of the filter as the transformer 136. As shown, the capacitor 1104 is coupled between the third terminal 506-3 of the transformer 136 and a terminal of the second port 132-2. The capacitor 1104 can also compensate for non-ideal aspects of the transformer 136. Alternatively, the capacitance of the capacitor 1104 can be incorporated outside of the filter circuit 130, such as by being part of a matching network between the filter circuit 130 and an adjacent component.

Figure 12:
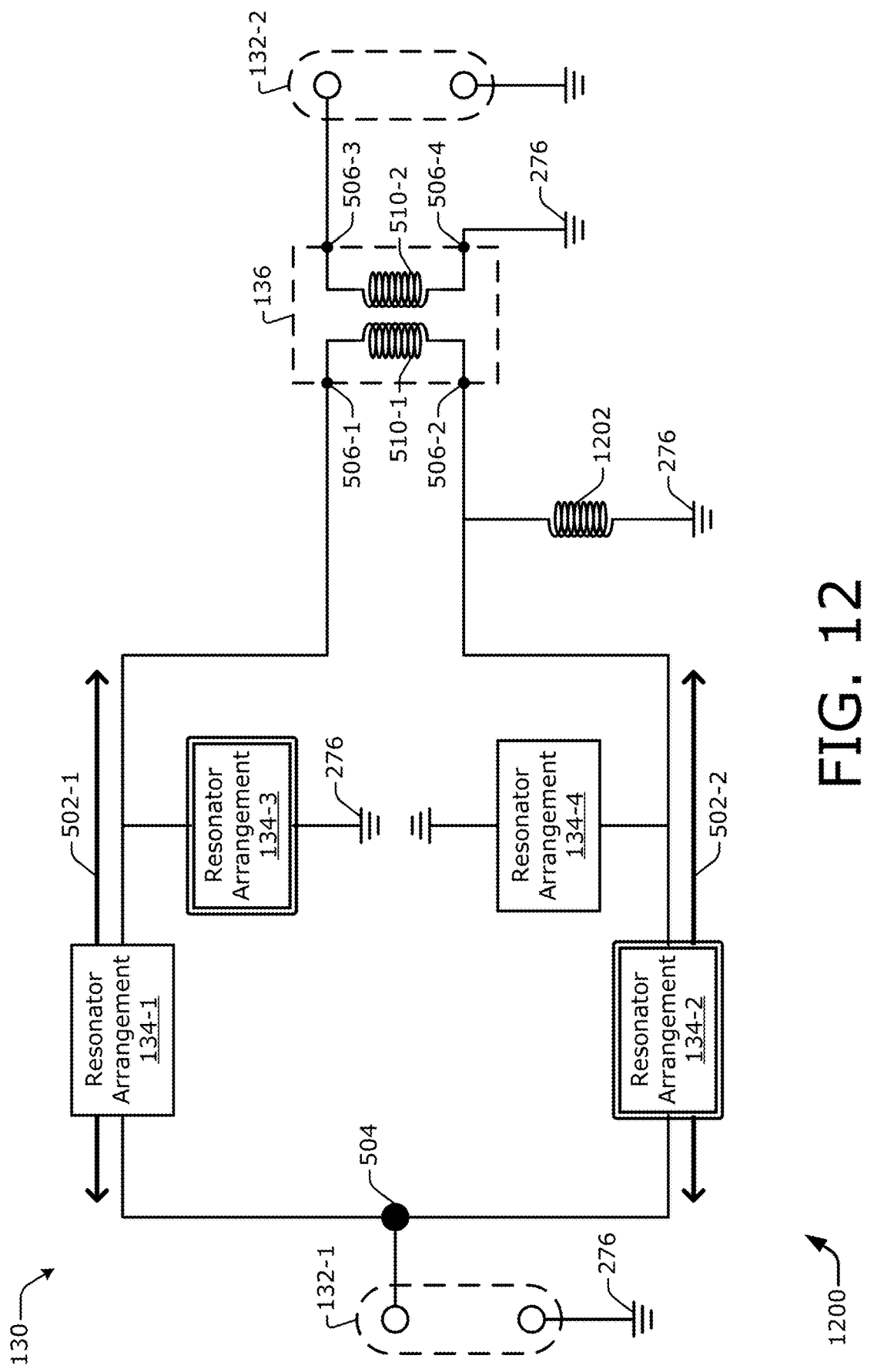
FIG. 12 is a schematic diagram illustrating an example lattice-type filter including an inductor asymmetrically coupled to a terminal of a transformer of the lattice-type filter.

FIG. 12 is a schematic diagram 1200 illustrating an example lattice-type filter circuit 130 including an inductor 1202 asymmetrically coupled to a terminal 506 of a transformer 136 of the lattice-type filter. As shown, the transformer 136 includes two inductors that are electromagnetically coupled. The inductors can be realized with coupled coils, coupled lines, and so forth. The two inductors can, however, also create a capacitive coupling. For example, two coupled lines may have a capacitive coupling that introduces a phase error between the balanced terminals of the transformer 136. The capacitive coupling can be lowered by reducing the overlap or increasing the distance between the two lines, but this also reduces the desired inductive coupling. With filters, managing phase and amplitude error may be relevant to signaling processing at both in-band and out-of-band frequencies.

In example implementations, an asymmetrically coupled inductor can at least partly balance or counteract the parasitic capacitance of the two inductors forming the transformer 136. An inductor is coupled to one of two terminals of an inductor (e.g., to one of two terminals that are galvanically coupled) of the transformer 136. The filter circuit 130 lacks or omits, however, another inductor at the other terminal of the inductor of the transformer 136. As shown, the inductor 1202 is coupled to the second terminal 506-2 of the transformer 136. The filter circuit 130 omits, however, an additional symmetrical inductor at the first terminal 506-1 of the transformer 136, with the first and second terminals 506-1 and 506-2 corresponding to a same inductor of the transformer 136. More specifically, the inductor 1202 can be coupled between the second terminal 506-2 of the transformer 136 and the ground 276. The inductor 1202 can also be coupled to the second signal path 502-2 at a node that is between the second terminal 506-2 of the transformer 136 and a terminal of the second resonator arrangement 134-2. The inductor 1202 may be formed from multiple inductors.

In some cases, the asymmetric inductor can be coupled to a terminal 506 of the transformer 136 that has or that exhibits a relatively higher-level capacitance. Additionally or alternatively, the asymmetric inductor may be coupled to a terminal 506 of the transformer 136 that better corrects for a phase error resulting from the parasitic capacitance of the two inductors of the transformer 136. As illustrated in FIG. 12, the inductor 1202 may be coupled to a terminal 506-2 that is on the balanced or differential side of the transformer 136 (and/or a side of the transformer 136 that is coupled to the multiple resonator arrangements 134-1 to 134-4) and that is closer to the unbalanced or single-ended terminal of the transformer 136 that is grounded (e.g., closer to the fourth terminal 506-4). Other circuits, however, may produce lower phase error if the asymmetric inductor is coupled to a terminal 506-1 that is on the differential side of the transformer 136 and that is farther from the single-ended terminal of the transformer 136 that is grounded (e.g., that is farther from the fourth terminal 506-4). In other words, another filter circuit 130 may produce lower phase error if the asymmetric inductor is coupled to the terminal 506-1 that is closer to the single-ended terminal of the transformer 136 (e.g., that is closer to the third terminal 506-3) that is coupled to a terminal of the second port 132-2 that carries the operational signal.

Although not depicted in each figure, the inductor 1202 may be included in other circuits that are described herein. For example, the inductor 1202 may be coupled to a terminal 506 of a transformer 136 in the manner shown in FIG. 12 in the circuits of, e.g., FIGS. 5-1, 5-2, 10, and 11. Additionally, an asymmetric inductor 1202 as depicted in FIG. 12 can be included in any of the seven example bridge-type filter architectures described above with reference to FIGS. 3-1 to 3-7 or to any of the filter architectures described below with reference to FIGS. 14-1 to 17-7. Further, the capacitor 1102 of FIG. 11 may be included in the example lattice-type filter circuit 130 of FIG. 12 as being coupled between the terminal 506-1 and the terminal 506-2 as illustrated in FIG. 11 and described above.

Figure 13:
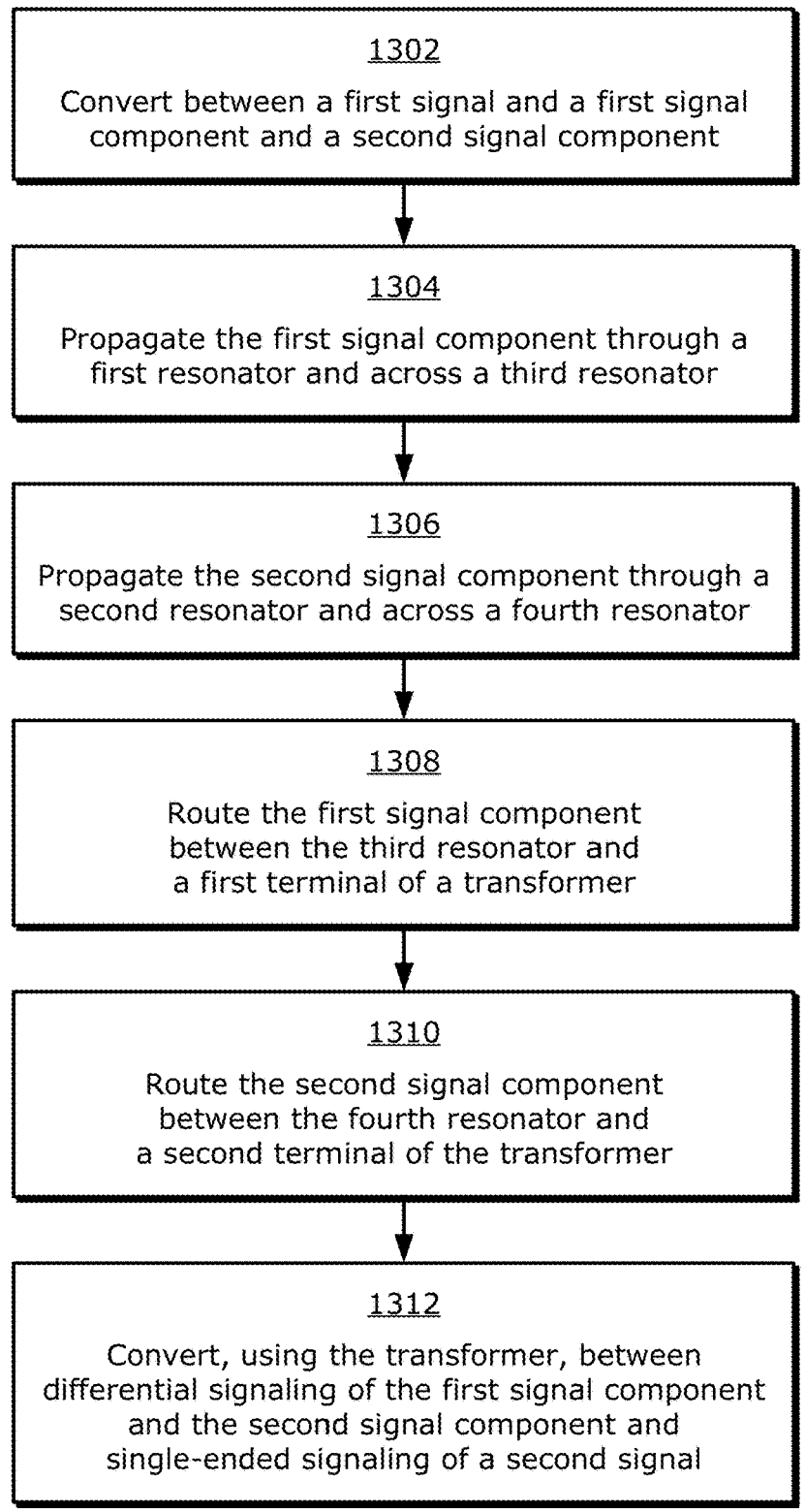
FIG. 13 is a flow diagram illustrating an example process for filtering signals and/or operating a lattice-type filter.

FIG. 13 is a flow diagram illustrating an example process 1300 for filtering signals and/or for operating a lattice-type filter circuit. The process 1300 includes six blocks 1302-1312 that specify operations that can be performed for a method.

At block 1302, a filter circuit converts between a first signal and a first signal component and a second signal component. For example, a common node 504 can convert between a first signal 274-1 and a first signal component 508-1 and a second signal component 508-2. If a first filter port 132-1 is operating as an input port, the common node 504 may convert from the first signal 274-1 to the first signal component 508-1 and the second signal component 508-2. This may correspond to a signal splitting operation. If, on the other hand, the first filter port 132-1 is operating as an output port, the common node 504 may perform a signal combining operation. In some cases, the first signal component 508-1 and the second signal component 508-2 may have a relative phase difference that is substantially zero degrees (0°) around the common node 504.

At block 1304, the filter circuit propagates the first signal component through a first resonator and across a third resonator. For example, a first signal path 502-1 can propagate the first signal component 508-1 through a first resonator 602-1 and across a third resonator 602-3. To do so, the first signal path 502-1 may propagate the first signal component 508-1 through an inline or series resonator 602-1 (e.g., a resonator that is coupled to the first path 502-1 in a series configuration) and across a shunt or parallel resonator 602-3 (e.g., a resonator that is coupled to the first path 502-1 in a shunt configuration). The first resonator 602-1 may comprise or be part of a first resonator arrangement 134-1, and the third resonator may comprise or be part of a third resonator arrangement 134-3. In addition to frequency, other signal properties may be modified while the signal or signal component propagates through or across one or more resonators. For example, an amplitude or a phase (including both) of a signal may be modified by at least one resonator as a result of the signal propagation along a signal path 502.

At block 1306, the filter circuit propagates the second signal component through a second resonator and across a fourth resonator. For example, a second signal path 502-2 can propagate the second signal component 508-2 through a second resonator 602-2 and across a fourth resonator 602-4. This may correspond to propagating the second signal component 508-2 through an inline or series resonator 602-2 and across a shunt or parallel resonator 602-4. If each respective resonator comprises a set of acoustic resonators, the acoustic resonators of the set of acoustic resonators may be coupled together in series, in parallel, or in a combination of series and parallel connections.

At block 1308, the filter circuit routes the first signal component between the third resonator and a first terminal of a transformer. For example, the first signal path 502-1 can route the first signal component 508-1 between the third resonator 602-3 and a first terminal 506-1 of a transformer 136. The propagation of the first signal component 508-1 along the first signal path 502-1 may shift a phase of the first signal component 508-1 based on the inline and shunt resonator interactions with the propagating signal.

At block 1310, the filter circuit routes the second signal component between the fourth resonator and a second terminal of the transformer. For example, the second signal path 502-2 can route the second signal component 508-2 between the fourth resonator 602-4 and a second terminal 506-2 of the transformer 136. With the phase shifts generated from the signal propagations along the first and second paths 502-1 and 502-2, the first and second signal components 508-1 and 508-2 may have a relative phase of approximately one hundred and eighty degrees (180°), such as within 10%, 5%, or even 1% of 180 degrees phase difference. Thus, the first and second signal components 508-1 and 508-2 may result in differential signaling at the first and second terminals 506-1 and 506-2 of the transformer 136.

At block 1312, the filter circuit converts, using the transformer, between differential signaling of the first signal component and the second signal component and single-ended signaling of a second signal. For example, the transformer 136 can convert between differential signaling of the first signal component 508-1 and the second signal component 508-2 and single-ended signaling of a second signal 274-2. Depending on a direction of signal propagation within the filter circuit 130, the transformer 136 may convert from single-ended signaling to differential signaling or from a differential signal to a single-ended signal as shown in FIG. 5-1. Alternatively, the transformer can couple the differential signaling of the first signal component 508-1 and the second signal component 508-2 to a second signal 274-2 that is also differential as shown in FIG. 5-2.

FIG. 13 is a flow diagram illustrating example processes or methods related to filtering signals and/or operating a lattice-type filter circuit. The processes are described in the form of a set of blocks that specify operations that can be performed. However, operations are not necessarily limited to the order shown in the figures or described herein, for the operations may be implemented in alternative orders or in fully or partially overlapping manners. Also, more, fewer, and/or different operations may be implemented to perform a respective process or an alternative process. Operations represented by the illustrated blocks of each process may be performed by an electronic device, such as the electronic device 102 of FIG. 1 or the wireless interface device 120 thereof. More specifically, the operations of the respective processes may be performed by a filter circuit 130 of a transceiver 126 or an RF front-end 128, independently or in conjunction with other components.

Figures 1, 14:
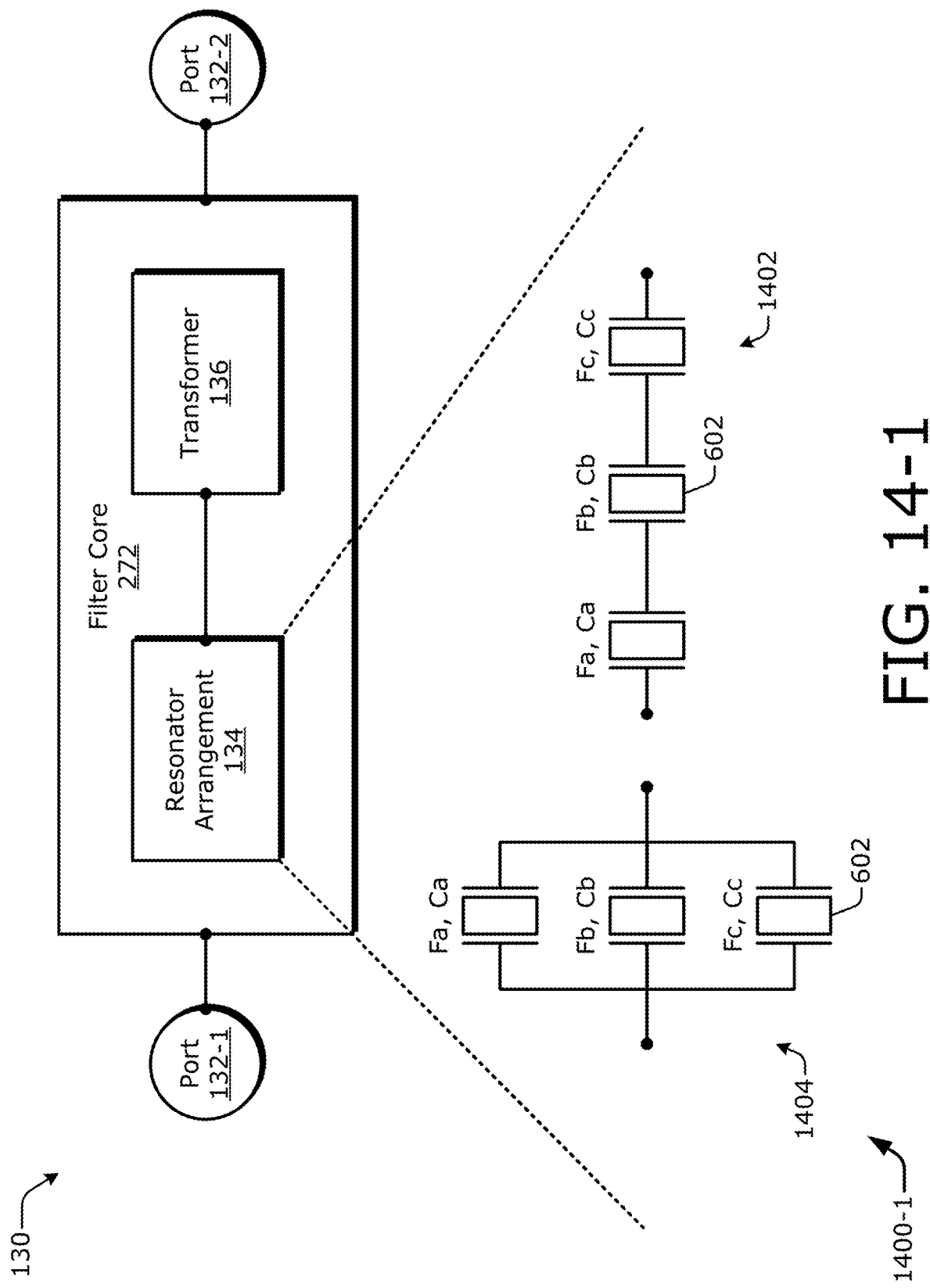
Figures 2, 14:
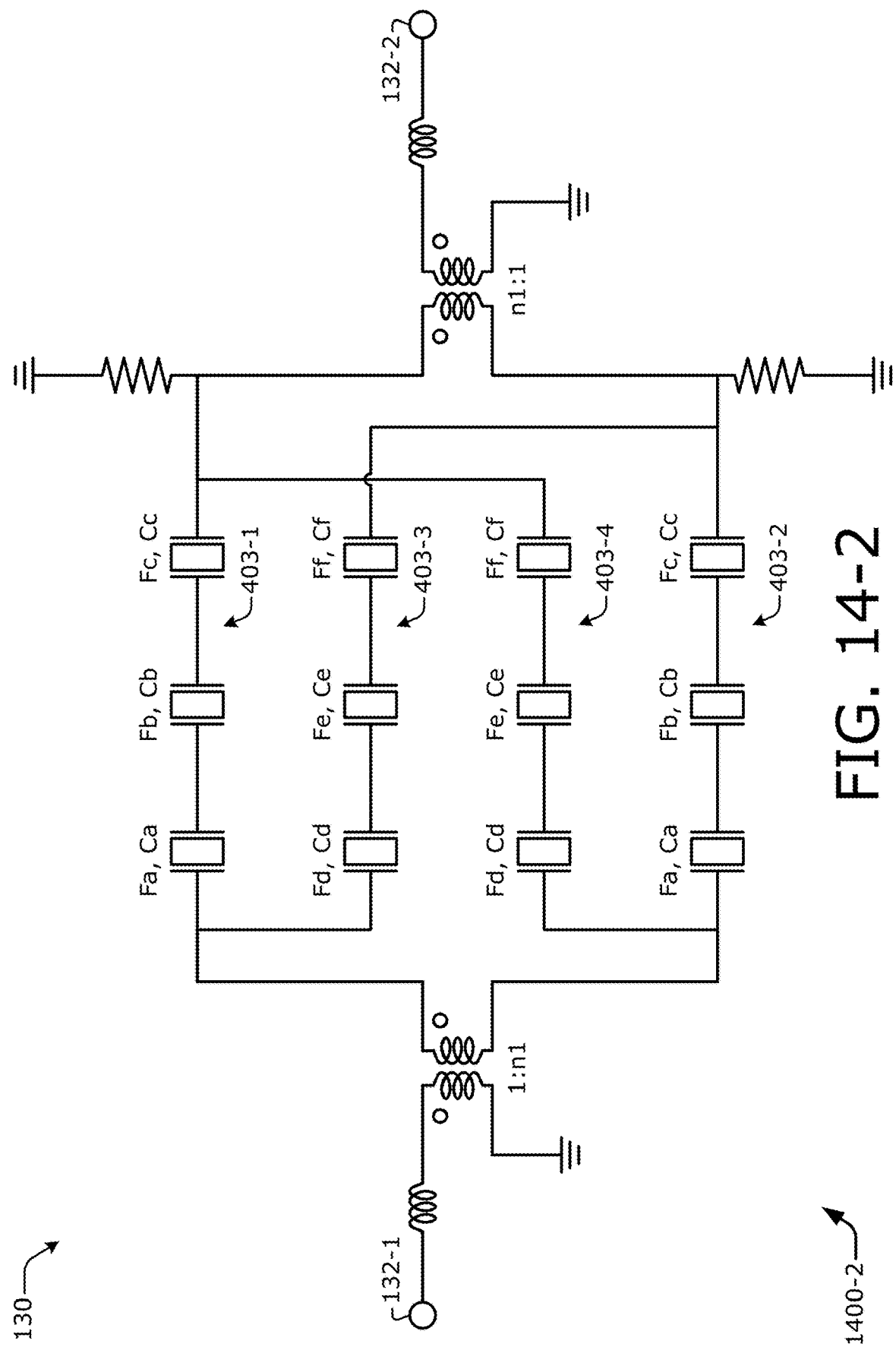
Figures 3, 14:
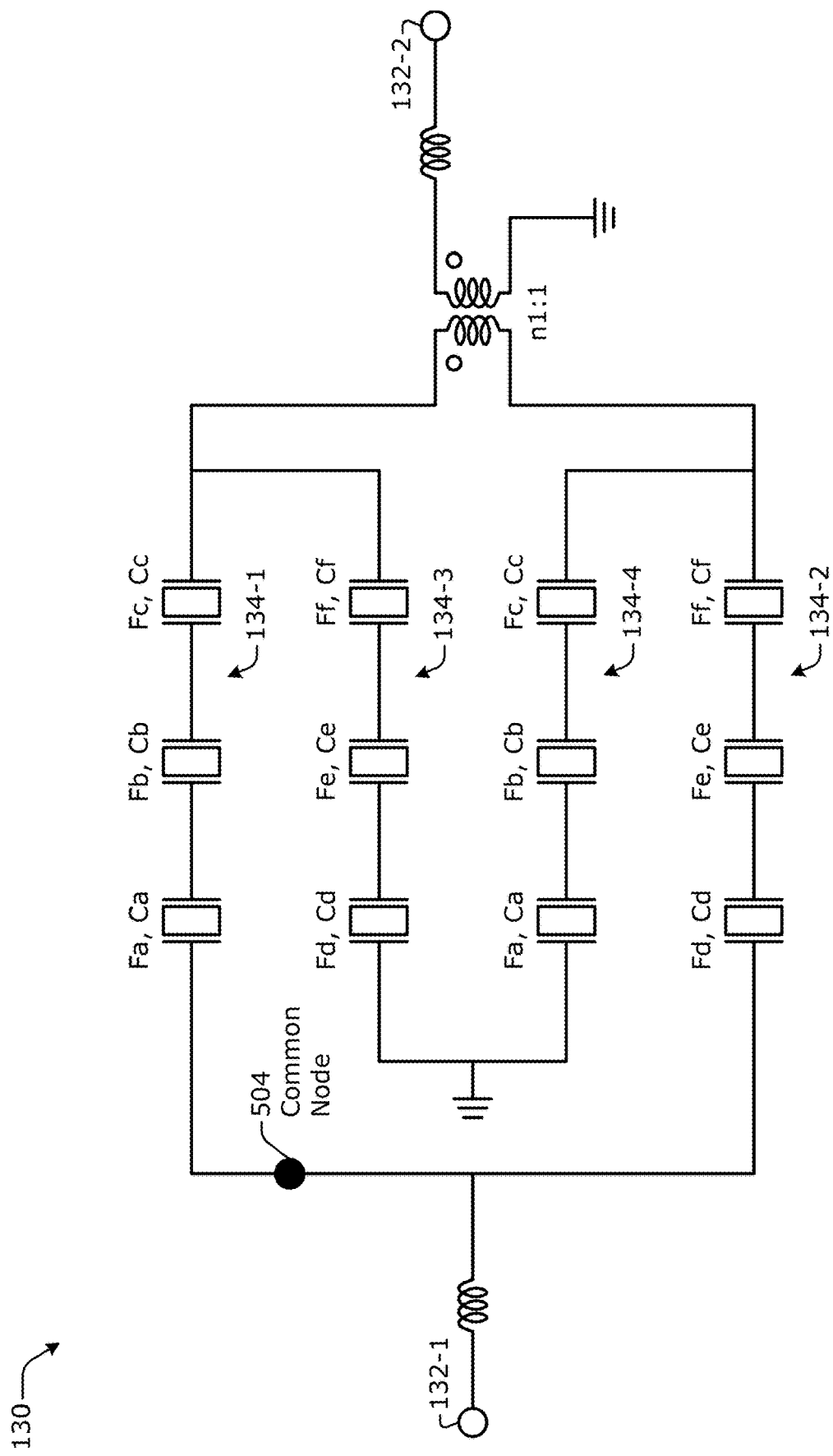
Figures 6, 14:
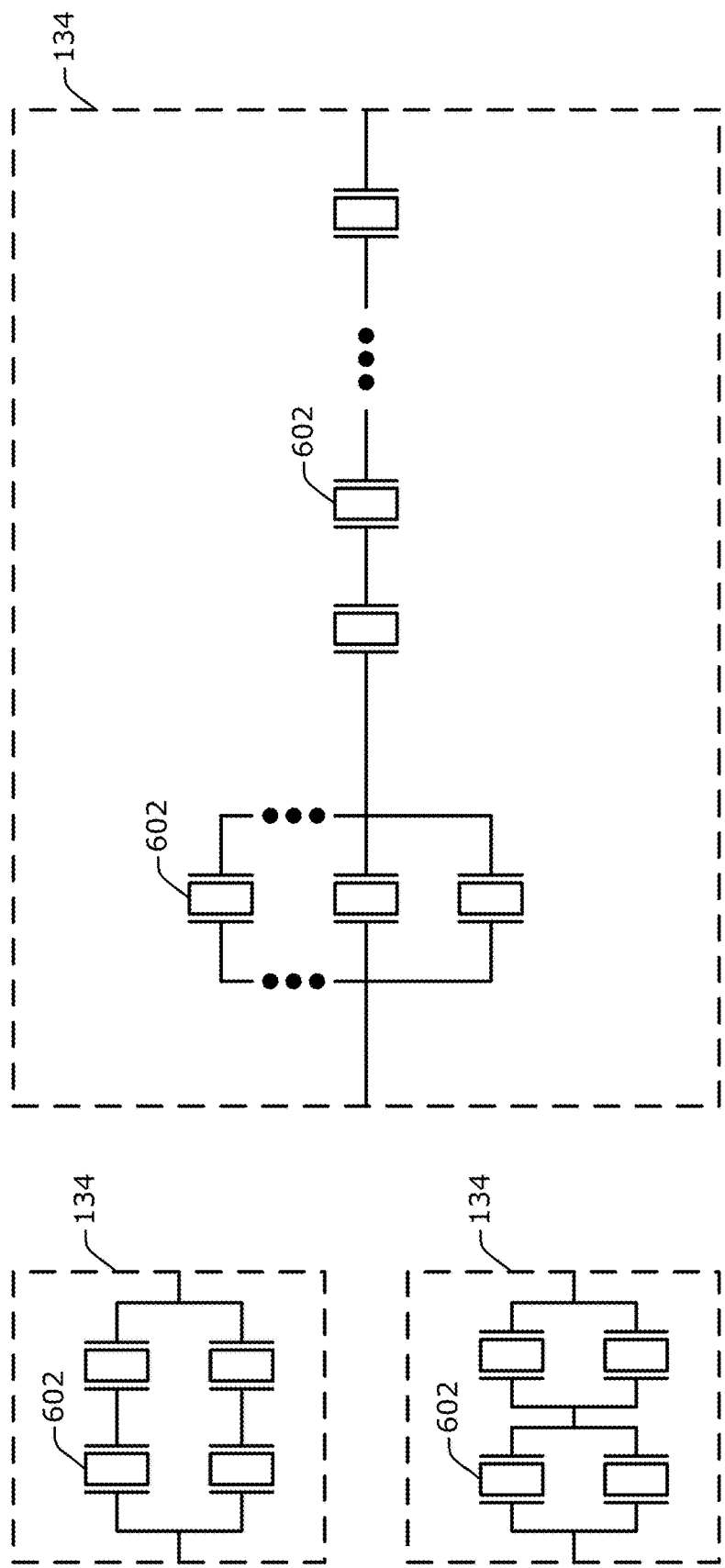
Figures 7, 14:
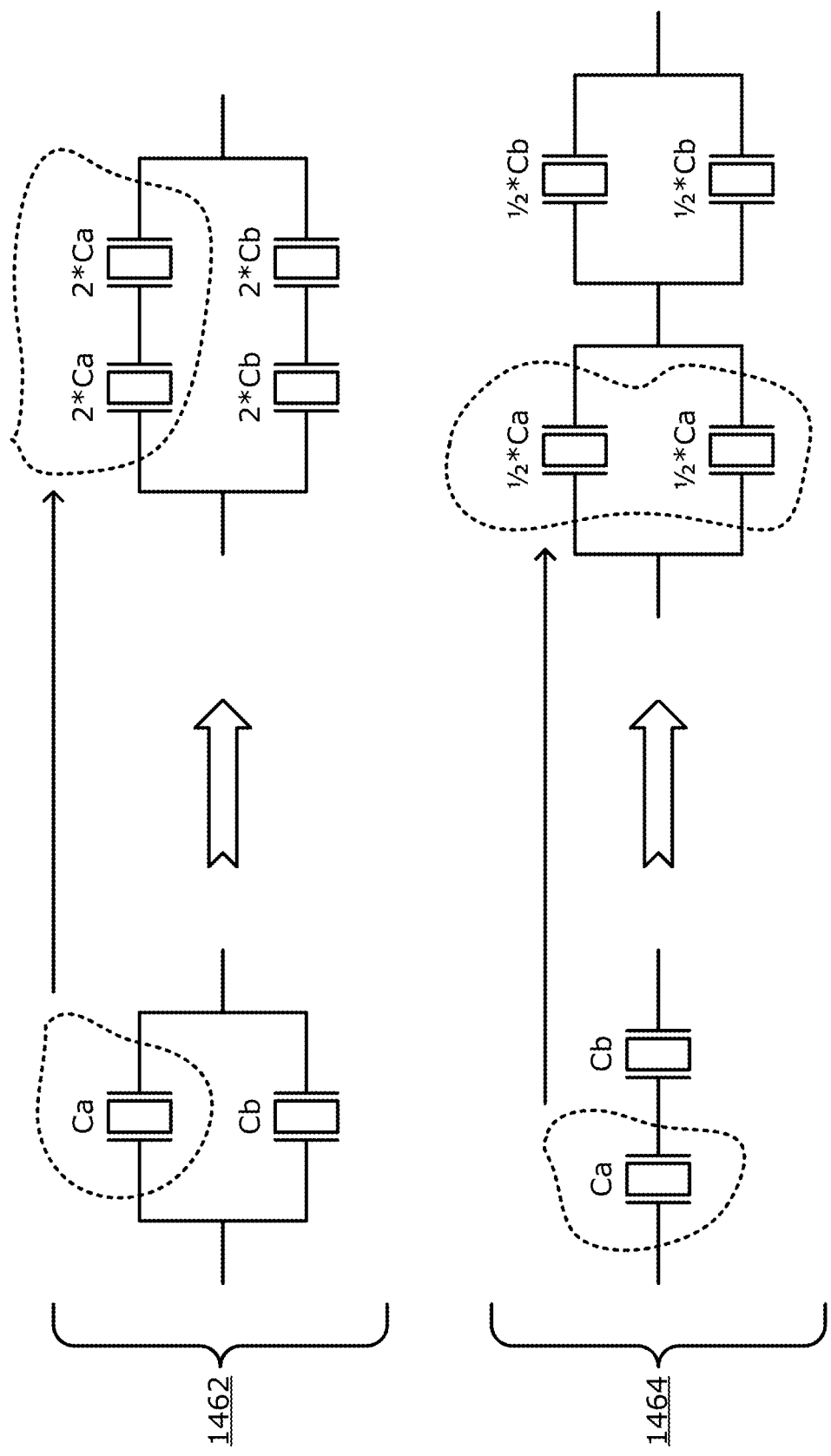

FIG. 14-1 is a schematic diagram 1400-1 illustrating a filter core 272 that has an example resonator arrangement 134 including multiple acoustic resonators that can be coupled together in series, in parallel, or in a combination of series and parallel couplings. As shown, a filter circuit 130 includes a first port 132-1, a second port 132-2, and the filter core 272. The filter core 272 includes at least one resonator arrangement 134 that is coupled to at least one transformer 136. In example implementations, each resonator arrangement 134 can include multiple instances of an acoustic resonator 602.

In the illustrated example, the resonator arrangement 134 includes three acoustic resonators in a parallel coupling 1404 or in a series coupling 1402. A given resonator arrangement 134 may, however, have multiple acoustic resonators coupled together in series and in parallel. Further, although three acoustic resonators are shown, a particular resonator arrangement 134 may include more or fewer acoustic resonators. Each acoustic resonator 602 may have or may be associated with one or more characteristics. Example characteristics include a resonant frequency (F) (e.g., Fa, Fb, and Fc), a static capacitance (C or Co) (e.g., Ca, Cb, and Cc), and a frequency ratio (e.g., a value "r" derived from a ratio between a parallel resonant frequency and a series resonant frequency of a given acoustic resonator) or another variable that reflects a distance or other relationship between a parallel resonant frequency and a series resonant frequency of a particular acoustic resonator.

Seven examples of bridge-type filter architectures are described above with reference to FIGS. 3-1 to 3-7. Each of these filter architectures is depicted in FIGS. 3-1 to 3-7 using a singular instance of an acoustic resonator at each acoustic resonator position. Each position may, however, have more than one acoustic resonator at each acoustic resonator position. Thus, each depicted acoustic resonator may comprise or may be realized using multiple acoustic resonators. In other words, each depicted acoustic resonator may comprise or may be realized using at least one resonator arrangement 134. Examples of the fifth and sixth bridge-type filter architectures are described below with reference to FIGS. 14-2 and 14-3 for implementations in which each acoustic resonator position is realized with three acoustic resonators that are coupled together in series to realize a respective resonator arrangement 134.

Employing multiple acoustic resonators "instead" of a single acoustic resonator to diversify a resonator arrangement 134 can provide one or more advantages. For example, switching from a single acoustic resonator 602 to a series coupling 1402 of two or more acoustic resonators can increase a power-handling capability. This increased ability to handle higher power may be beneficial in a transmit chain that processes or propagates signals having a relatively higher power. In contrast, switching from a single acoustic resonator 602 to a parallel coupling 1404 of two or more acoustic resonators can decrease an insertion loss of the filter circuit. This decreased insertion loss can translate into an ability to properly filter low-power signals, which may be beneficial in a receive chain that processes and propagates signals having a relatively lower power level.

As another example, increasing a quantity of acoustic resonators in a resonator arrangement 134 can enable a filter core 272 to operate with acoustic resonators having a greater variety of resonant frequencies (F). The greater quantity of different resonant frequencies can increase a selectivity of the filter circuit 130. For example, one or both sides of a skirt of a frequency response may be steeper with a filter circuit having a greater quantity of different resonant frequencies as compared to the slope or steepness of a skirt of a filter response of a filter circuit with a lower quantity of different resonant frequencies. In other words, a filter circuit can be realized as a relatively higher-order filter if more resonant frequencies are provided by including more acoustic resonators with varying resonant frequencies. This can enable, for instance, a filter circuit to have a filter response with a stronger out-of-band suppression, including nearer the passband.

FIGS. 14-2 and 14-3 are circuit diagrams 1400-2 and 1400-3, respectively, illustrating example lattice-type filter architectures with multiple series couplings of acoustic resonators. The schematic diagram 1400-2 of FIG. 14-2 corresponds to the fifth bridge-type filter architecture example depicted in, e.g., FIGS. 3-5 and 4. Each of the four resonator arrangements 403-1, 403-2, 403-3, and 403-4 (also of FIG. 4) includes a set of three acoustic resonators. The first and second resonator arrangements 403-1 and 403-2 each include three acoustic resonators with the following resonant frequency and static capacitance values (or value pairs): Fa, Ca; Fb, Cb; and Fc, Cc. The third and fourth resonator arrangements 403-3 and 403-4 each include three acoustic resonators with the following resonant frequency and static capacitance values: Fd, Cd; Fe, Ce; and Ff, Cf.

If there were instead one acoustic resonator per acoustic resonator position (or resonator arrangement 403 in FIG. 14-2), the filter circuit would be a second-order filter. The filter circuit can also be a second-order filter if each of Fa, Fb, and Fc has a same frequency value and each of Fd, Fe, and Ff have a same frequency value, which still differs from that of Fa, Fb, and Fc. However, if each of Fa, Fb, and Fc have three different frequency values, and if each of Fd, Fe, and Ff have three other different frequency values (e.g., if the six acoustic resonators each have a different resonant frequency), then the filter circuit 130 can be realized as a sixth-order filter with greater selectivity than a filter with a second or other relatively lower order.

The schematic diagram 1400-3 of FIG. 14-3 corresponds to the sixth bridge-type filter architecture example depicted in, e.g., FIGS. 3-6 and 5-1 to 12. Each of the four resonator arrangements 134-1, 134-2, 134-3, and 134-4 (also of, e.g., FIGS. 5-1 and 5-2) includes a set of three acoustic resonators that are coupled together in series. The first and fourth resonator arrangements 134-1 and 134-4 each include three acoustic resonators with the following resonant frequency and static capacitance values: Fa, Ca; Fb, Cb; and Fc, Cc. The second and third resonator arrangements 134-2 and 134-3 each include three acoustic resonators with the following resonant frequency and static capacitance values: Fd, Cd; Fe, Ce; and Ff, Cf.

As described above with reference to FIG. 14-2, if each of Fa, Fb, and Fc have three different frequency values, and if each of Fd, Fe, and Ff have three other different frequency values (e.g., if the six acoustic resonators each have a different resonant frequency), then the filter circuit 130 can be realized as a sixth-order filter with greater selectivity than a filter with a lower order. Although the fifth and sixth bridge-type filter architectures are explicitly illustrated (in FIGS. 14-2 and 14-3, respectively), these principles regarding having multiple acoustic resonators per acoustic resonator position are applicable to bridge-type filter architectures generally that employ acoustic resonators, including the first through fourth and the seventh bridge-types that are described herein. Further, each resonator position or resonator arrangement 134 (or 403) can include any quantity of acoustic resonators that are coupled together in any manner, a few examples of which are described next.

FIGS. 14-4 to 14-6 are circuit diagrams 1400-4 to 1400-6 of example resonator arrangements that each include one or more acoustic resonators to illustrate how each bridge-type filter architecture (e.g., of FIGS. 3-1 to 3-7) can employ one acoustic resonator 602 or multiple acoustic resonators per resonator arrangement 134. Each resonator arrangement 134 (or resonator arrangement 403) can be part of a filter core 272 of a filter circuit 130. Each resonator arrangement 134 can be realized with one or more acoustic wave resonators and/or with an acoustic wave resonator arrangement. Each acoustic resonator 602 (or acoustic wave resonator 602) can be implemented with a bulk acoustic wave (BAW) resonator, a surface acoustic wave (SAW) resonator, and so forth. Generally, each resonator arrangement 134 can be implemented with multiple acoustic wave resonators that are coupled together in series, in parallel, or in a combination of series and parallel connections.

FIG. 14-4 depicts at the circuit diagrams 1400-4 examples of acoustic wave resonators coupled together in series, or series couplings of acoustic resonators. At the upper-left portion of the drawing sheet, the resonator arrangement 134 is implemented with a single acoustic resonator 602. At the lower-left portion, the resonator arrangement 134 is implemented with two acoustic resonators coupled together in series. At the upper-right portion of the drawing sheet, the resonator arrangement 134 is implemented with three acoustic resonators coupled together in series. At the lower-right portion, the resonator arrangement 134 is implemented with "N" acoustic resonators connected together in series, with "N" representing a positive integer.

FIG. 14-5 depicts at the circuit diagrams 1400-5 examples of acoustic wave resonators coupled together in parallel, or parallel couplings of acoustic resonators. At the upper-left portion of the drawing sheet, the resonator arrangement 134 is implemented with a single acoustic resonator 602. At the upper-right portion, the resonator arrangement 134 is implemented with two acoustic resonators coupled together in parallel. At the lower-left portion of the drawing sheet, the resonator arrangement 134 is implemented with three acoustic resonators coupled together in parallel. At the lower-right portion, the resonator arrangement 134 is implemented with "N" acoustic resonators connected together in parallel, with "N" representing a positive integer.

FIG. 14-6 depicts at the circuit diagrams 1400-6 examples of acoustic wave resonators coupled together in a combination of series connections and parallel connections, or series-parallel combination couplings of acoustic resonators. At the upper-left portion of the drawing sheet, the resonator arrangement 134 is implemented with four acoustic resonators. Two series-coupled pairs of acoustic resonators are coupled together in parallel. At the lower-left portion, the resonator arrangement 134 is also implemented with four acoustic resonators, but two parallel-coupled pairs of acoustic resonators are then coupled together into a series connection. At the right portion of the drawing sheet, the resonator arrangement 134 is implemented with "N" acoustic resonators coupled together in both series and parallel configurations, with "N" representing a positive integer.

Any quantity of acoustic resonators can be coupled together in series or in parallel, and any quantity of series or parallel-connected sets of acoustic resonators can be further coupled together in series or parallel and/or nested in any manner. Individual acoustic resonators of series-connected or parallel-connected acoustic resonators may have, or may not have, substantially equal characteristics (e.g., a resonant frequency or an impedance such as static capacitance). If the multiple series-connected or parallel-connected acoustic resonators are different from each other so as not to have substantially equal characteristics, the filter order may be increased. The higher filter order can increase selectivity. On the other hand, if the multiple series-connected or parallel-connected acoustic resonators are substantially equal to each other, the filter order remains unchanged, but the performance can be improved in terms, e.g., of power handling or linearity.

FIG. 14-7 depicts a circuit diagram 1400-7 illustrating relationships of static capacitances (C or Co) between a given acoustic resonator and a realization thereof that includes a series coupling or a parallel coupling of multiple acoustic resonators. At 1462, two acoustic resonators having respective static capacitances of Ca and Cb are shown to the left of the arrow. To transform each respective acoustic resonator into a series-coupled pair of acoustic resonators, the static capacitance is adjusted as shown to the right of the arrow. To substitute the acoustic resonator having the Ca static capacitance with a pair of acoustic resonators that are coupled together in series, each acoustic resonator of the series-coupled pair is fabricated to have a doubled static capacitance, or a capacitance of 2*Ca. Similarly for the acoustic resonator having the Cb static capacitance, it is replaced with two series-coupled acoustic resonators that each have a doubled static capacitance of 2*Cb.

At 1464, another two acoustic resonators having respective static capacitances of Ca and Cb are shown to the left of the arrow. To transform each respective acoustic resonator into a parallel-coupled pair of acoustic resonators, the static capacitance is adjusted as shown to the right of the arrow. To substitute the acoustic resonator having the Ca static capacitance with a pair of acoustic resonators that are coupled together in parallel, each acoustic resonator of the parallel-coupled pair is fabricated to have a halved static capacitance, or ½*Ca. Similarly for the acoustic resonator having the Cb static capacitance, it is replaced with two parallel-coupled acoustic resonators that each have a half static capacitance of ½*Cb.

Figures 1, 15:
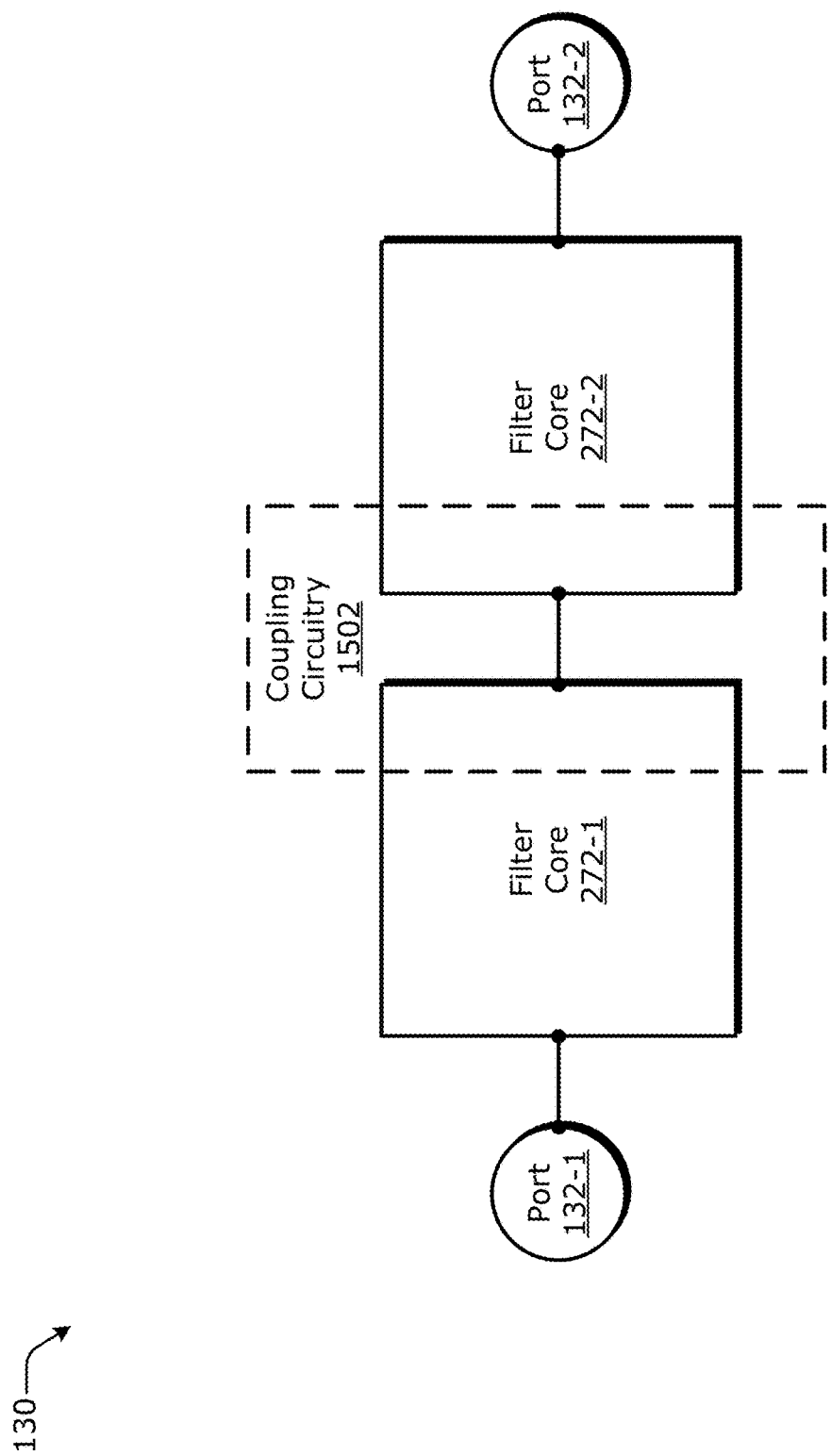
Figures 2, 15:
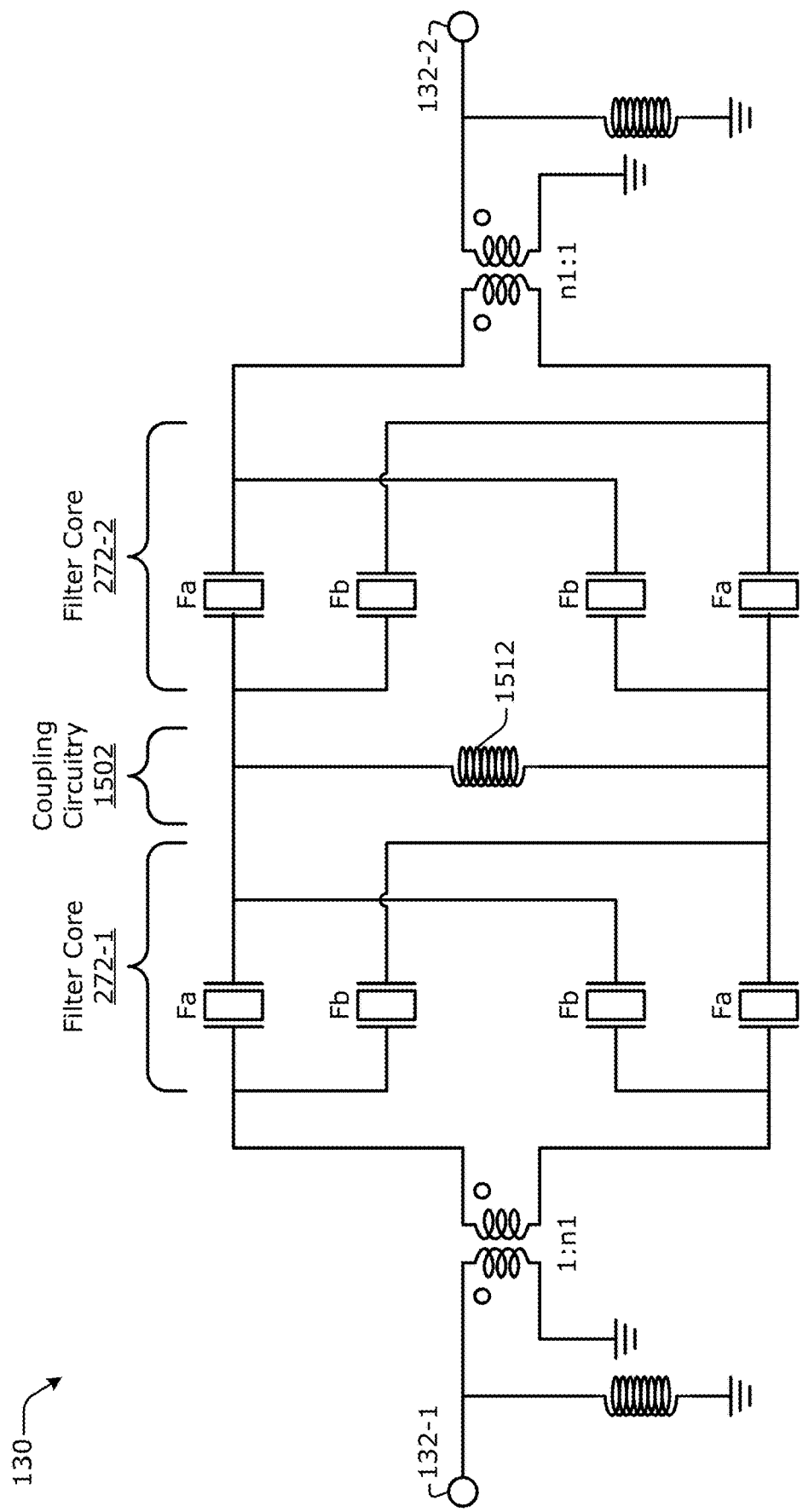
Figures 3, 15:
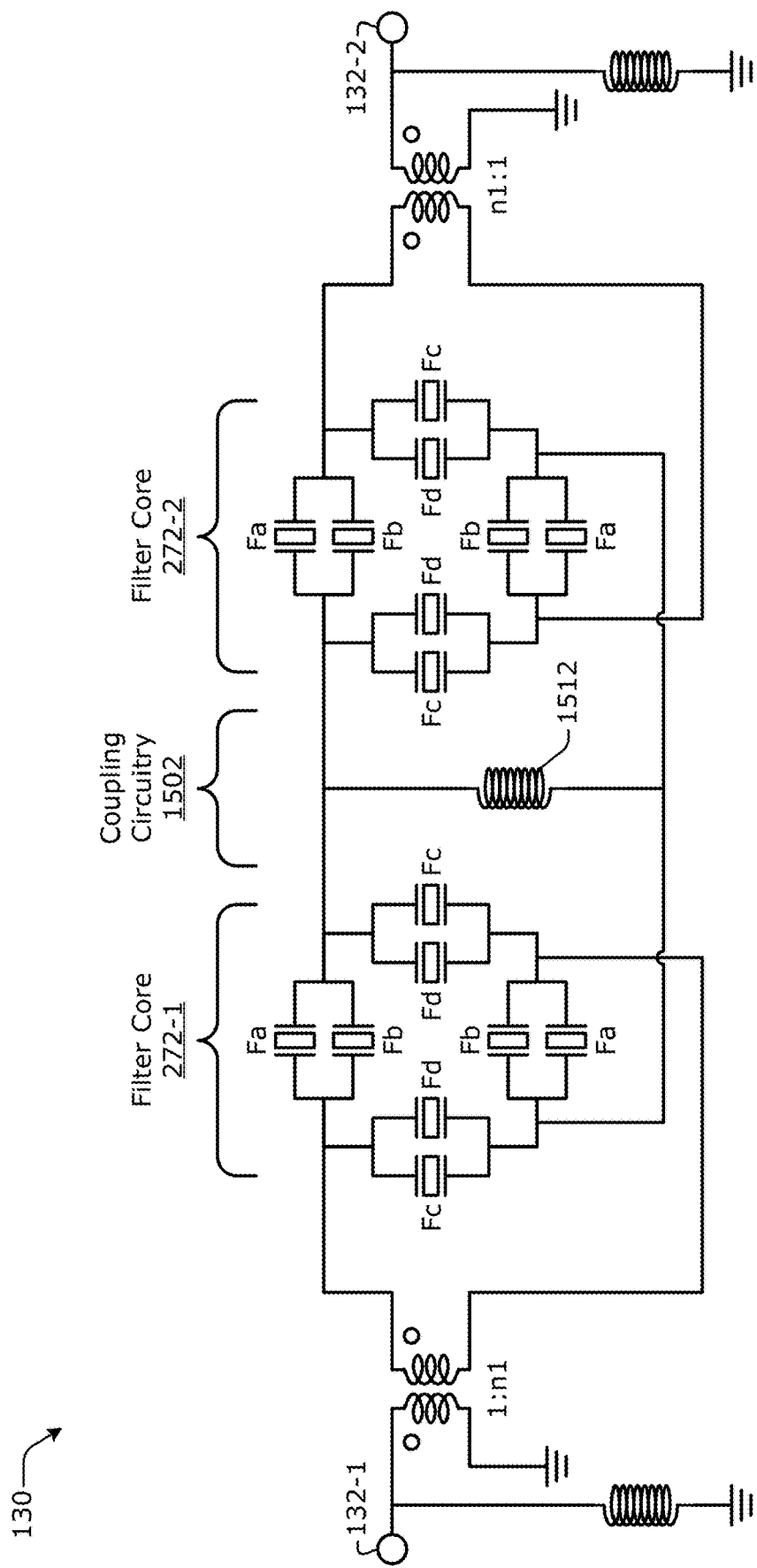
Figures 4, 15:
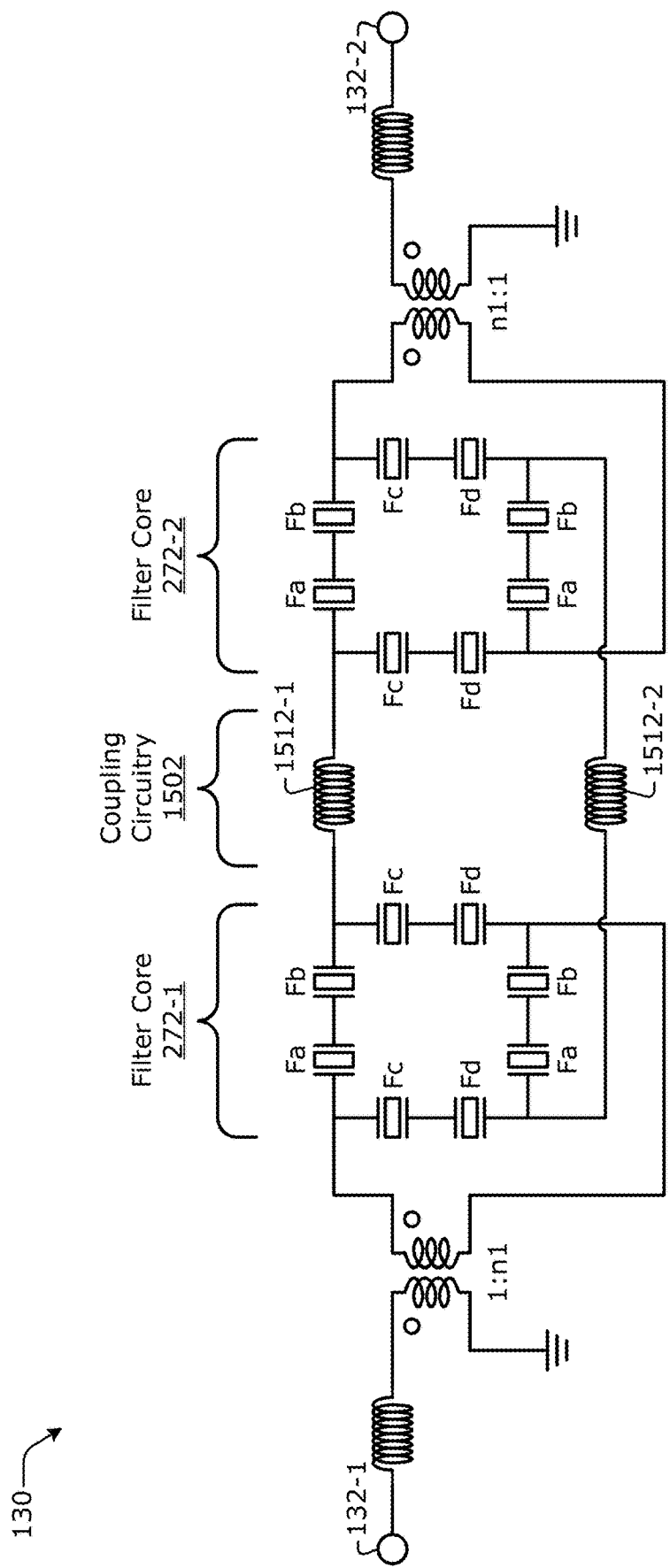
Figures 5, 15:
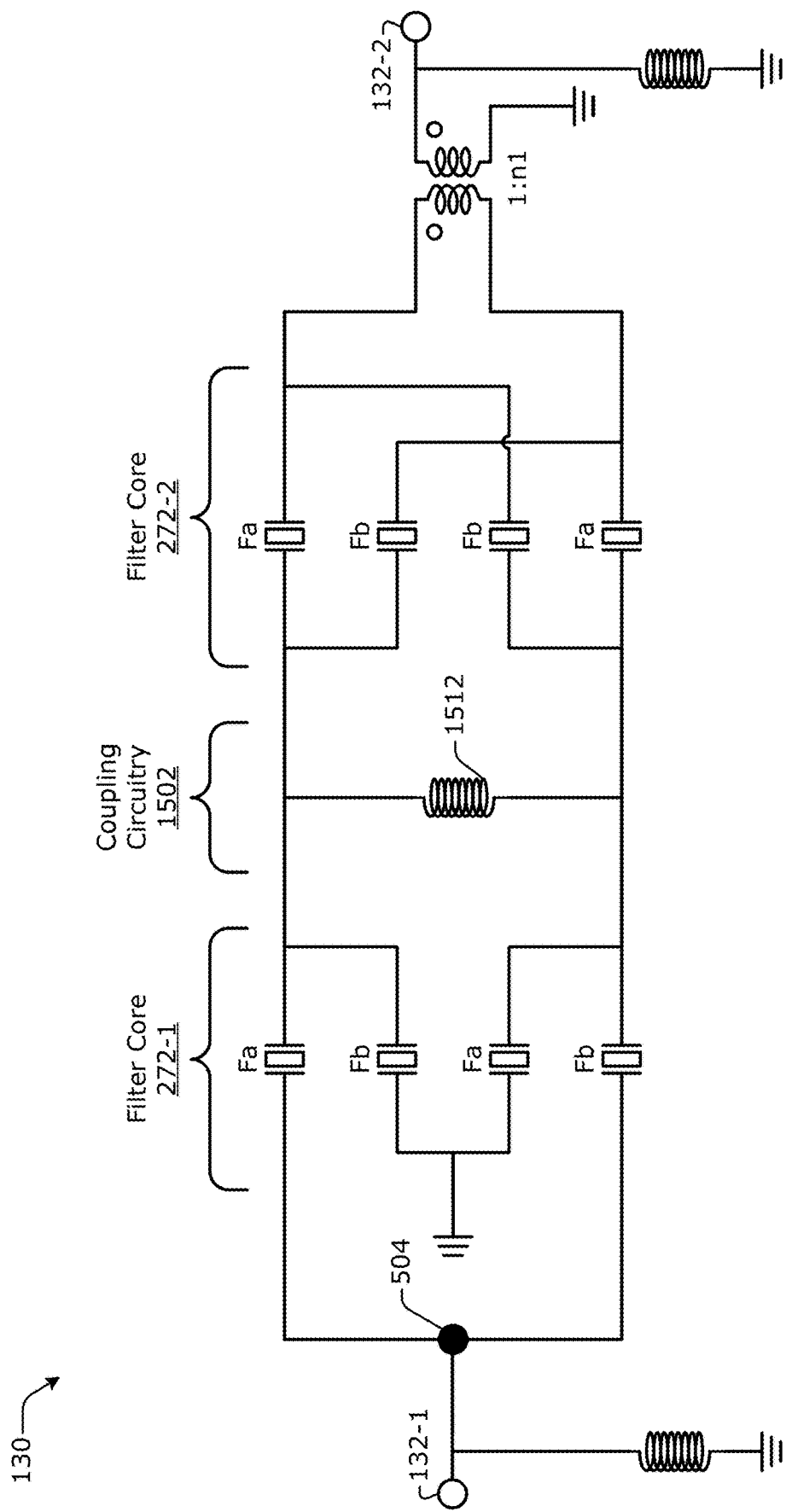
Figures 6, 15:
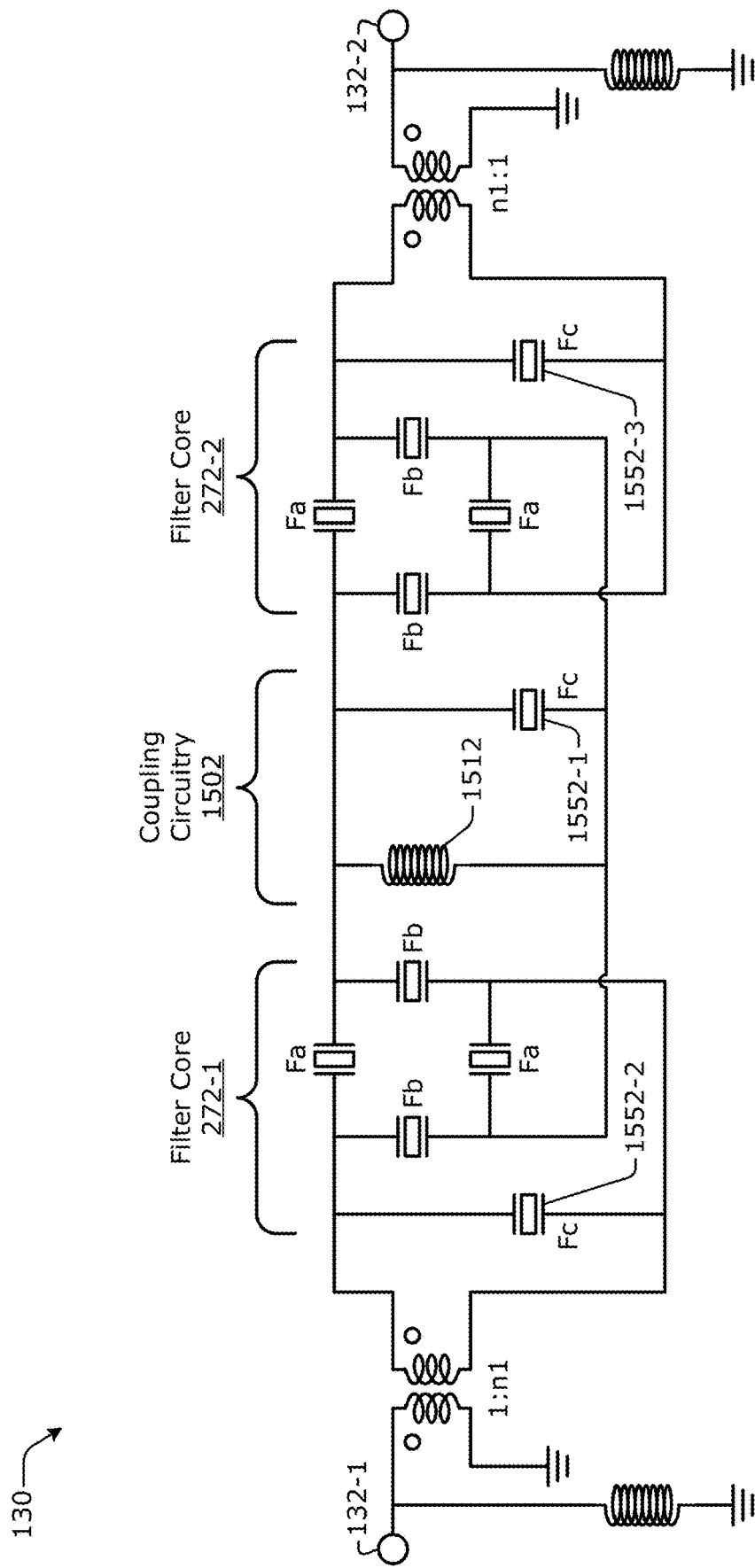
Figures 7, 15:
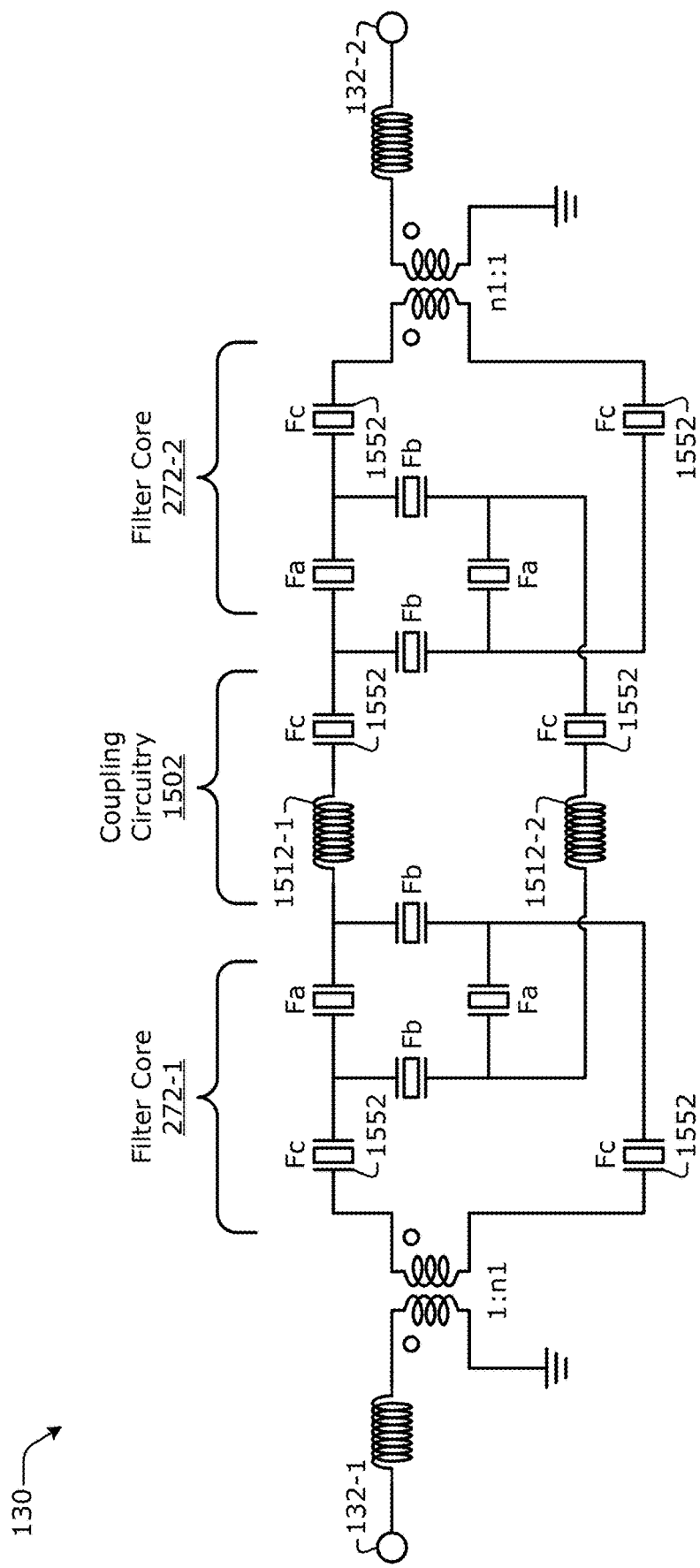

FIG. 15-1 is a schematic diagram 1500-1 illustrating an example of multiple acoustic filter cores 272-1 and 272-2 cascaded together in series between two ports using coupling circuitry 1502 to form a filter circuit 130. As shown, the filter circuit 130 can include a first filter core 272-1 and a second filter core 272-2 coupled between a first port 132-1 and a second port 132-2. The multiple filter cores 272-1 and 272-2 are cascaded together in series between the two ports via the coupling circuitry 1502. Although two filter cores are shown, more than two filter cores may be cascaded in series to form a filter circuit 130.

In example implementations, at least one filter core 272, and up to all cascaded filter cores, can include at least one acoustic resonator 602 (not shown in FIG. 15-1). A filter core 272 that includes at least one acoustic resonator 602 but omits or excludes a transformer can be referred to herein as an acoustic filter core or an acoustic core. Each filter core 272 can include multiple acoustic resonators, including those with multiple different resonant frequencies to produce filter circuits of different, higher orders. In some cases, the filter architecture types of the multiple filter cores 272-1 and 272-2 are the same, such as both being the example fifth bridge-type filter architecture (e.g., of FIGS. 3-5 and 4). In other cases, the filter architecture types of the multiple filter cores 272-1 and 272-2 are different from each other, such as one being the example fifth bridge-type filter architecture (e.g., of FIGS. 3-5 and 4) and another one being the example sixth bridge-type filter architecture (e.g., of FIGS. 3-6 and 5-1 to 12).

An order of the filter circuit 130 can be determined based on an order of each filter core 272. In some implementations, cascading two filter cores can increase the selectivity of the filter without increasing the quantity of different resonant frequencies of the acoustic resonators in the filter cores. For example, if the first and second filter cores 272-1 and 272-2 are each of a third order, then the filter circuit 130 may produce a filter having a selectivity closer to a fourth order. Although the area occupied by the acoustic resonators may increase appreciably, a benefit is that each filter core 272 can be fabricated from one or more acoustic resonators having the same set of one or more resonant frequencies in each filter core 272. In other words, two filter cores can be fabricated without increasing a quantity of different resonant frequencies of the acoustic resonators that are distributed across the two filter cores as compared to a quantity of resonant frequencies that is present in each "single" filter core. Thus, these techniques can increase the selectivity of a filter circuit without necessitating an increase in the quantity of different resonant frequencies of the acoustic wave resonators, which may save space or reduce manufacturing costs. Further, although the acoustic cores may be doubled, the quantity of transformers need not be doubled, as is described next.

The coupling circuitry 1502 can be realized using one or more of various circuit components, such as at least one inductor. The coupling circuitry 1502 can omit, at least partially, the transformers that would otherwise be proximate, or even adjacent, to each other between the two filter cores. In their place, an inductor can be used to couple the two filter cores together in series. Examples of the coupling circuitry 1502 are described below with references to FIGS. 15-2 to 15-7.

FIG. 15-2 is a circuit diagram 1500-2 illustrating an example of two second-order filter cores, which each have a lattice architecture, cascaded together in series. A filter circuit 130 of FIG. 15-2 includes a first filter core 272-1 and a second filter core 272-2 cascaded together in series between first and second ports 132-1 and 132-2 and between two illustrated transformers. Each filter core 272 corresponds to a fifth bridge-type filter architecture as described herein (e.g., with reference to FIGS. 3-5 and 4). In this case as depicted in FIG. 15-2, each filter core 272 can comprise or correspond to an acoustic filter core or acoustic core that includes multiple acoustic resonators (including multiple resonator arrangements in some implementations) but that excludes the transformer(s).

In example implementations, the coupling circuitry 1502 can be realized using at least one inductor 1512. The inductor 1512 can be used instead of two transformers that would be present if two full filter circuits were cascaded, thereby saving three inductors in some cases. As shown, the inductor 1512 can be coupled between the two filter cores relative to the first and second ports 132-1 and 132-2 and in parallel with the first and second filter cores 272-1 and 272-2, as well as in parallel with a respective inductor of each of the two transformers. With each filter core 272 having two different resonant frequencies Fa and Fb, the filter circuit 130 is a second-order filter, but it may offer a selectivity closer to a third-order filter because the cascaded filter cores can increase the filter performance.

FIGS. 15-3 and 15-4 are circuit diagrams 1500-3 and 1500-4, respectively, illustrating examples of two fourth-order filter cores, which each have a lattice architecture, cascaded together in series. The acoustic resonators of each resonator arrangement are coupled together in parallel and in series, respectively, for the circuit diagrams 1500-3 and 1500-4. The circuit diagram 1500-3 is similar to the circuit diagram 1500-2 of FIG. 15-2, except that each filter core 272 has a fourth order in FIG. 15-3. Specifically, each filter core 272 in the circuit diagram 1500-3 has acoustic resonators with four resonant frequencies of Fa, Fb, Fc, and Fd. Accordingly, the filter circuit 130 comprises a fourth-order filter, but it may provide a performance more comparable to a selectivity of a fifth-order filter due to the two filter cores that are cascaded in series. In the circuit diagram 1500-3, each resonator arrangement is formed from two acoustic resonators that are coupled to together in parallel.

In contrast, in the circuit diagram 1500-4 of FIG. 15-4, each resonator arrangement is formed from two acoustic resonators that are coupled together in series. Otherwise, the circuit diagram 1500-4 is similar to the circuit diagram 1500-3 of FIG. 15-3. For example, both circuit diagrams have two fourth-order filter cores that correspond to the fifth bridge-type filter architecture as described herein. Further, both filter circuits can provide a filter response that is superior to that of a fourth-order filter because of the filter core cascading.

Due to the serial couplings for the acoustic resonators of each resonator arrangement, however, the coupling circuitry 1502 is implemented differently from that of FIG. 15-3. The coupling circuitry 1502 of the circuit diagram 1500-4 includes multiple inductors, such as a first inductor 1512-1 and a second inductor 1512-2. These two inductors are coupled in series with the first and second filter cores 272-1 and 272-2 between the two transformers. Further, the first and second inductors 1512-1 and 1512-2 are coupled between the first and second filter cores 272-1 and 272-2 as shown.

FIG. 15-5 is a circuit diagram 1500-5 illustrating an example of two second-order filter cores, which have different lattice-type architectures, cascaded together in series to form a filter circuit 130. The circuit diagram 1500-5 is similar to the circuit diagram 1500-2 of FIG. 15-2, except that the two filter cores have different bridge-type filter architectures in FIG. 15-5. The second filter core 272-2 of FIG. 15-5 has the fifth bridge-type filter architecture (e.g., as shown FIGS. 3-5 and 4) like the two illustrated filter cores in FIG. 15-2. In contrast with FIG. 15-2, however, the first filter core 272-1 of FIG. 15-5 has the sixth bridge-type filter architecture as described above (e.g., and as shown in FIGS. 3-6 and 5-1 to 12).

Like FIG. 15-2, the coupling circuitry 1502 of FIG. 15-5 is realized with an inductor 1512 that is coupled in parallel with the first and second filter cores 272-1 and 272-2. Further, the inductor 1512 is coupled between the first and second filter cores 272-1 and 272-2 relative to the first and second ports 132-1 and 132-2. Another difference between the filter circuits of FIGS. 15-2 and 15-5 is the quantity of transformers. In FIG. 15-2, the filter circuit 130 includes two transformers that "sandwich" the two acoustic filter cores. In contrast, in FIG. 15-5, the filter circuit 130 can include a single transformer. Thus, in addition to being able to replace the two central transformers with the inductor 1512 for the coupling circuitry 1502, the filter circuit 130 of the circuit diagram 1500-5 can further omit a third transformer by employing the common node 504 that is provided by the sixth bridge-type filter architecture.

FIGS. 15-6 and 15-7 are circuit diagrams 1500-6 and 1500-7, respectively, illustrating examples of two second-order filter cores, which each have a lattice architecture, cascaded together in series. The circuit diagrams 1500-6 and 1500-7 each include one or more "additional" acoustic resonators in a parallel or a series connection, respectively. The circuit diagrams 1500-6 and 1500-7 are each similar to the circuit diagram 1500-2 of FIG. 15-2 (although they are drawn more like the circuit diagrams 1500-3 and 1500-4 of FIGS. 15-3 and 15-4, respectively). Thus, each of the first and second filter cores 272-1 and 272-2 realizes the fifth bridge-type filter architecture as described herein. Further, the coupling circuitry 1502 is realized with at least one inductor 1512.

In example implementations, as shown in FIGS. 15-6 and 15-7, the filter circuit 130 can additionally include at least one acoustic resonator 1552 to add another order to the filter circuit. Thus, given that the circuit diagrams 1500-6 and 1500-7 are each second order (e.g., due to the Fa and Fb resonant frequencies), the inclusion of the acoustic resonator 1552 increases the order of the filter circuit 130 from being second order to being third order. Further, the series-cascaded filter cores 272-1 and 272-2 can increase the selectivity of the filter circuit 130 from being third order to closer to being fourth order. Thus, a third-order filter that may perform closer to a fourth order can be constructed using acoustic resonators having three different resonant frequencies and two second-order acoustic cores.

The circuit diagram 1500-6 of FIG. 15-6 represents a filter circuit 130 in which multiple acoustic resonators (not shown for clarity) of different resonator arrangements (not explicitly indicated) of different acoustic resonator positions are coupled together in parallel (e.g., like in FIG. 15-3). In the circuit diagram 1500-6, three "additional" acoustic resonators 1552-1 to 1552-3 are depicted. In some cases, each acoustic resonator 1552 has a resonant frequency Fc that differs from those of the other acoustic resonators in the filter cores to increase the filter order. In FIG. 15-6, each acoustic resonator 1552 is coupled in parallel with at least a portion of the first and second filter cores 272-1 and 272-2, and two are coupled in parallel with a respective inductor of each of the two transformers.

As illustrated in FIG. 15-6, a first acoustic resonator 1552-1 is coupled in parallel with, and between, at least parts of the first and second filter cores 272-1 and 272-2. The first acoustic resonator 1552-1 is also coupled in parallel with the inductor 1512. The first acoustic resonator 1552-1 may be part of or separate from the coupling circuitry 1502 that includes the inductor 1512. A second acoustic resonator 1552-2 is coupled in parallel with, and between, the left transformer and at least part of the first filter core 272-1. The second acoustic resonator 1552-2 may be part of or separate from the first filter core 272-1. A third acoustic resonator 1552-3 is coupled in parallel with, and between, the right transformer and at least part of the second filter core 272-2. The third acoustic resonator 1552-3 may be part of or separate from the second filter core 272-2.

More or fewer than the three acoustic resonators 1552-1 to 1552-3 may alternatively be implemented. For example, if one acoustic resonator is implemented, the second and third acoustic resonators 1552-2 and 1552-3 may be omitted. If two acoustic resonators are implemented, the first acoustic resonator 1552-1 may be omitted.

The circuit diagram 1500-7 of FIG. 15-7 represents a filter circuit 130 in which multiple acoustic resonators (not shown for clarity) of different resonator arrangements (not explicitly indicated) are coupled together in series (e.g., like in FIG. 15-4). In the circuit diagram 1500-7, six acoustic resonators 1552 are depicted. In some cases, each acoustic resonator 1552 has a resonant frequency Fc that differs from those of the other acoustic resonators in the filter cores to increase the filter order. In FIG. 15-7, each acoustic resonator 1552 is coupled in series with the first and second filter cores 272-1 and 272-2, and two of the acoustic resonators 1552 are coupled in series with the inductors 1512-1 and 1512-2. Further, each acoustic resonator 1552 is coupled in between the two transformers. One or more additional resonators 1552 can be included in other implementations besides those with cascaded cores (e.g., like those depicted in FIGS. 3-1 to 3-7). Generally, the principles illustrated in FIGS. 15-1 to 15-7 and described with reference thereto (e.g., cascading multiple filter cores in series and including at least one additional acoustic resonator with an additional resonant frequency in conjunction with at least one filter core) are applicable to other filter architectures. For example, these principles are applicable to any of the example bridge-type filter architectures described above with reference to FIGS. 3-1 to 3-7.

Figures 1, 16:
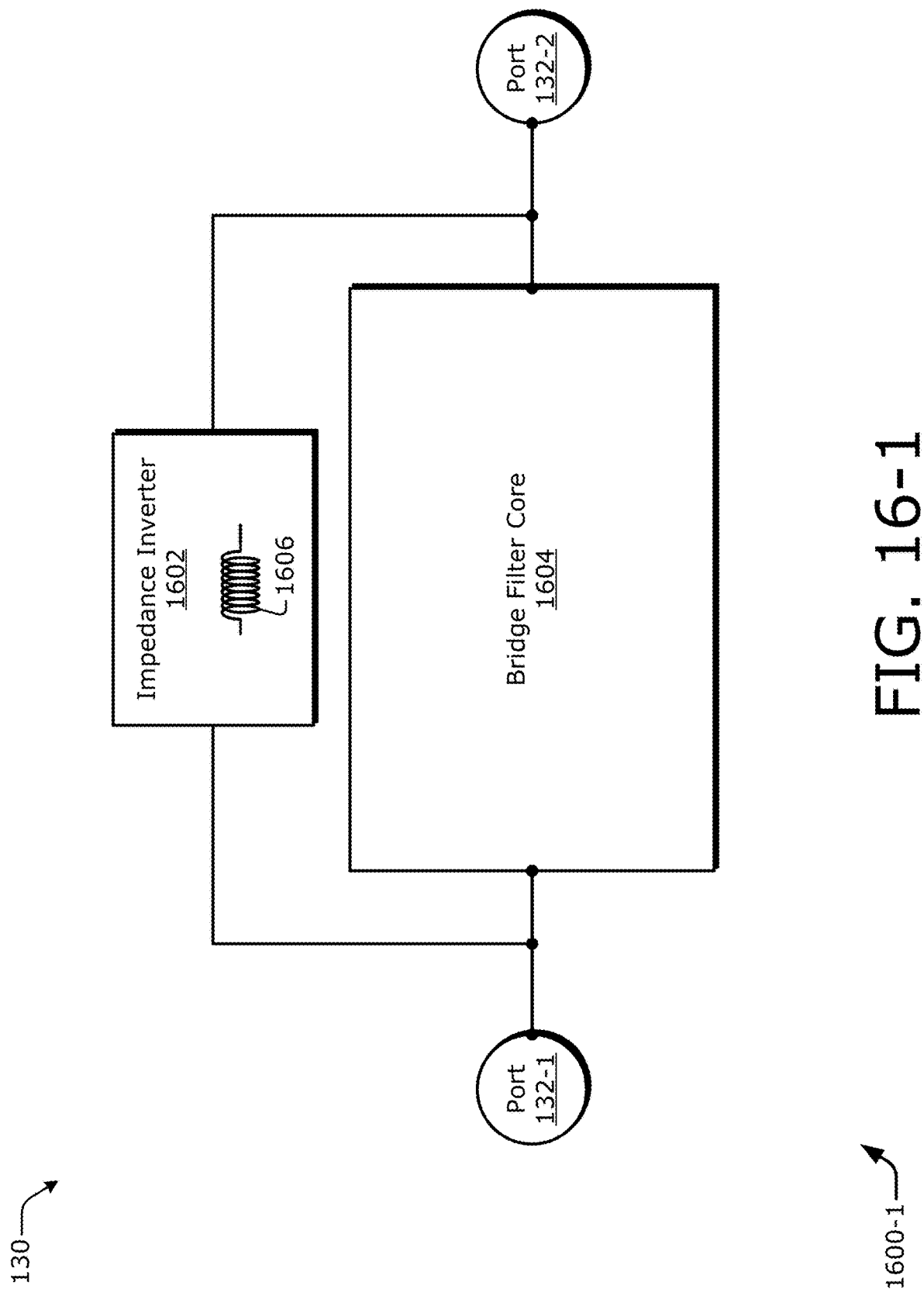
Figures 2, 16:
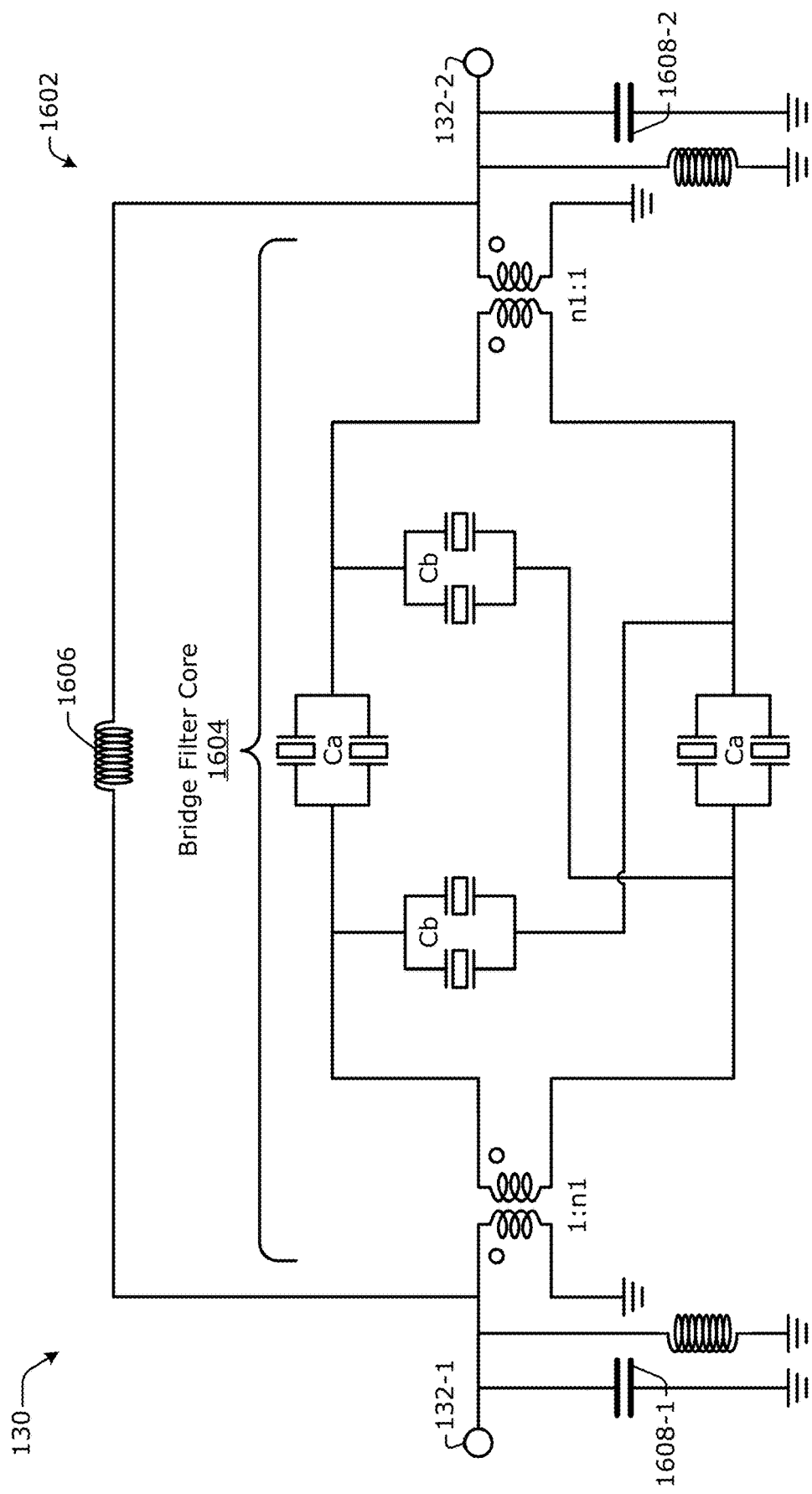
Figures 3, 16:
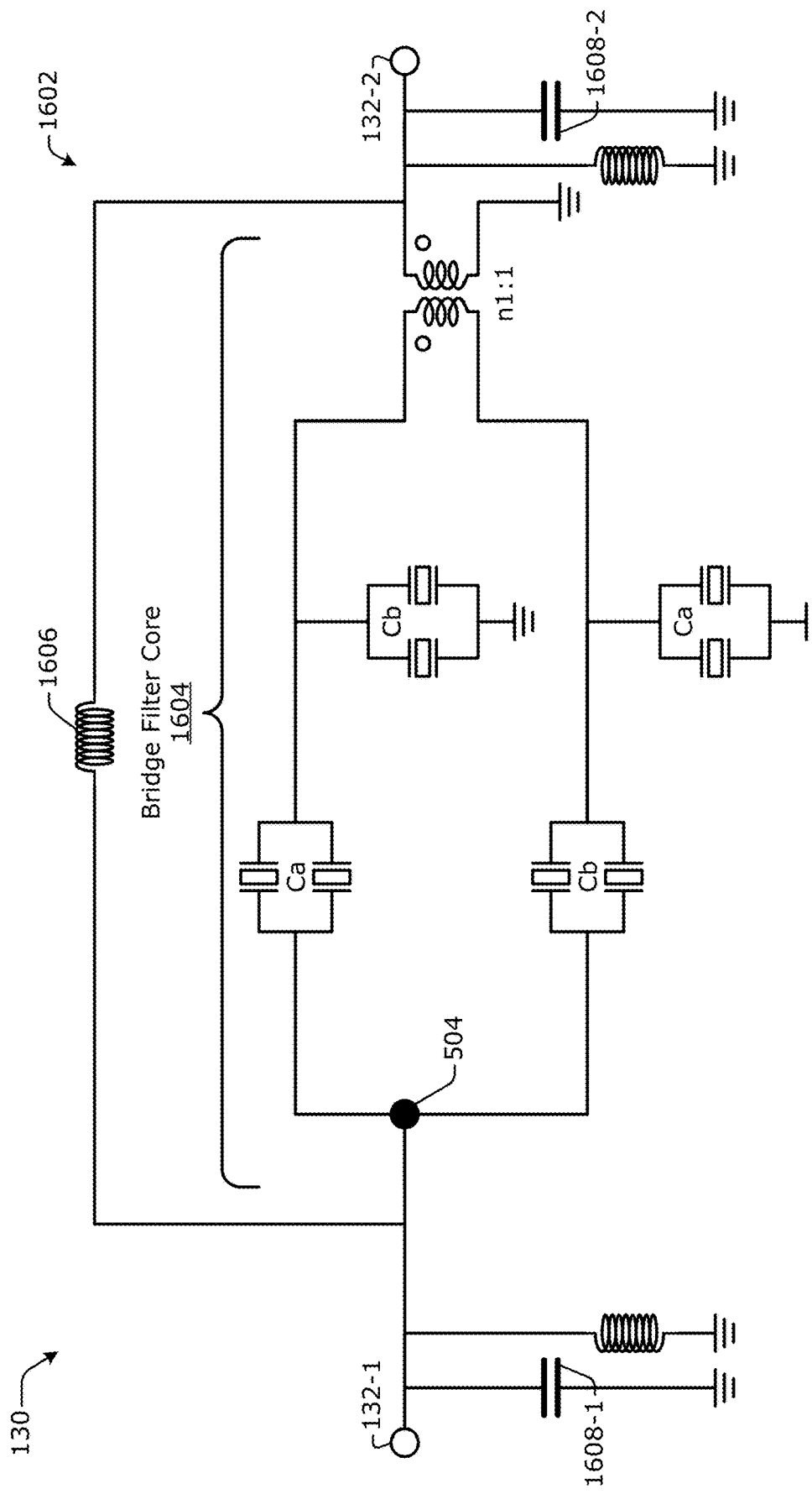
Figures 4, 16:
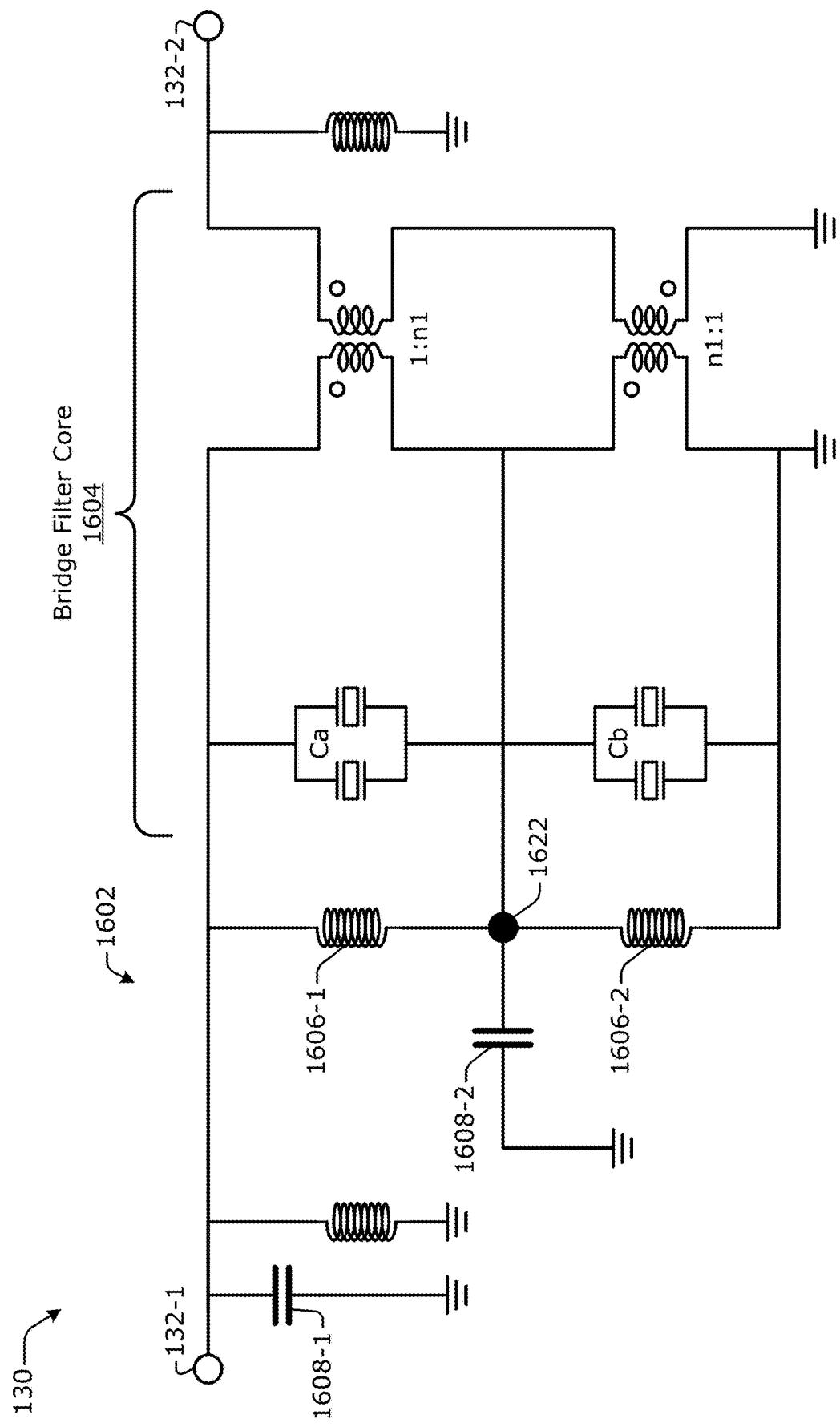

FIG. 16-1 is a schematic diagram 1600-1 illustrating an example of an impedance inverter 1602 coupled to a filter core, such as a bridge filter core 1604 of a bridge-type filter architecture that employs one or more acoustic resonators. As shown, the filter circuit 130 includes a first port 132-1, a second port 132-2, the bridge filter core 1604, and the impedance inverter 1602. The bridge filter core 1604 is coupled between the first and second ports 132-1 and 132-2. The impedance inverter 1602 can also be coupled between the first and second ports 132-1 and 132-2.

In example implementations, the impedance inverter 1602 can be realized as a Pi network or a T network, which may also be referred to respectively as a Delta network or a Y network. The impedance inverter 1602 may further be realized as an admittance inverter. In some cases, the impedance inverter 1602 can include at least one inductor 1606. As shown, at least a portion of the impedance inverter 1602 (e.g., the at least one inductor 1606 thereof) can be coupled in parallel with the bridge filter core 1604 between the first port 132-1 and the second port 132-2.

With a fully canonical bridge filter core 1604, the inclusion of the impedance inverter 1602 can add another order to the filter circuit 130. As used herein, a "fully canonical" filter core is a filter core in which each resonator arrangement position that is permitted to have a different resonant-frequency relative to other resonator arrangement position(s) does have a different resonant-frequency acoustic resonator. Thus, including an impedance inverter 1602 can increase the order of the filter above that of a fully canonical implementation. FIGS. 16-2 to 16-4 depict examples of fully canonical filters that further include an impedance inverter 1602 coupled to the filter cores thereof.

FIGS. 16-2 and 16-3 are circuit diagrams 1600-2 and 1600-3, respectively, illustrating examples of two second-order filter cores, which have two different respective lattice-type architectures, that are coupled to an impedance inverter 1602. In these two example implementations, the impedance inverter 1602 is implemented as a Pi network that includes an inductor 1606 and multiple capacitors: a first capacitor 1608-1 and a second capacitor 1608-2. The inductor 1606 is coupled between the first and second ports 132-1 and 132-2 and in parallel with the bridge filter core 1604.

The bridge filter core 1604 of the circuit diagram 1600-2 of FIG. 16-2 corresponds to the fifth bridge-type filter architecture as described herein, which includes two transformers that "sandwich" the acoustic filter core. As shown for the circuit diagram 1600-2, the inductor 1606 is coupled "outside" of, or at external terminals of, the two transformers relative to the bridge filter core 1604. Here, the external terminals of the two transformers are coupled to the two filter ports 132-1 and 132-2.

The bridge filter core 1604 of the circuit diagram 1600-3 of FIG. 16-3 corresponds to the sixth bridge-type filter architecture as described herein, which includes a common node 504 and one transformer that together "sandwich" the acoustic filter core. As shown for the circuit diagram 1600-3, the inductor 1606 is coupled to the common node 504 of the filter circuit 130 and is coupled "outside" of, or at an external terminal of an inductor of, the transformer relative to the bridge filter core 1604. Here, the external terminal of the transformer is coupled to the second port 132-2.

In the circuit diagrams 1600-2 and 1600-3, the first capacitor 1608-1 is coupled between the first port 132-1 and a ground. The second capacitor 1608-2 is coupled between the second port 132-2 and the ground. At radio frequencies, the component values of the filter circuit 130, including the static capacitance values of the acoustic resonators, may dominate over the capacitive values of the first and second capacitors 1608-1 and 1608-2. Accordingly, the first capacitor 1608-1 or the second capacitor 1608-2, including both capacitors with a permitted disjunctive interpretation of the word "or," may be omitted from the impedance inverter 1602 in some implementations.

FIG. 16-4 is a circuit diagram 1600-4 illustrating an example of a second-order filter core, which has the second bridge-type filter architecture as described herein (e.g., as depicted in FIG. 3-2), that is coupled to an impedance inverter 1602. In some implementations, the at least one inductor 1606 is realized as multiple inductors, such as a first inductor 1606-1 and a second inductor 1606-2. The first inductor 1606-1 and the second inductor 1606-2 are coupled together in series between the first port 132-1 and a ground.

The series connection of the first inductor 1606-1 and the second inductor 1606-2 is coupled in parallel with the bridge filter core 1604. The first capacitor 1608-1 is coupled between the first port 132-1 and the ground. The second capacitor 1608-2 is coupled between the ground and a node 1622 that is located between the first inductor 1606-1 and the second inductor 1606-2. The node 1622 is also positioned between the two resonator arrangements and between two respective terminals of the two transformers. As shown, the two respective terminals are on the internal side of the two transformers relative to the bridge filter core 1604 versus the second port 132-2. Generally, the principles illustrated in FIGS. 16-1 to 16-4 and described with reference thereto (e.g., including an impedance inverter that is coupled between first and second ports and in parallel with a filter core, which core can be implemented in a fully canonical form) are applicable to other filter architectures. For example, these principles are applicable to any of the example bridge-type filter architectures described above with reference to FIGS. 3-1 to 3-7.

Figures 1, 17:
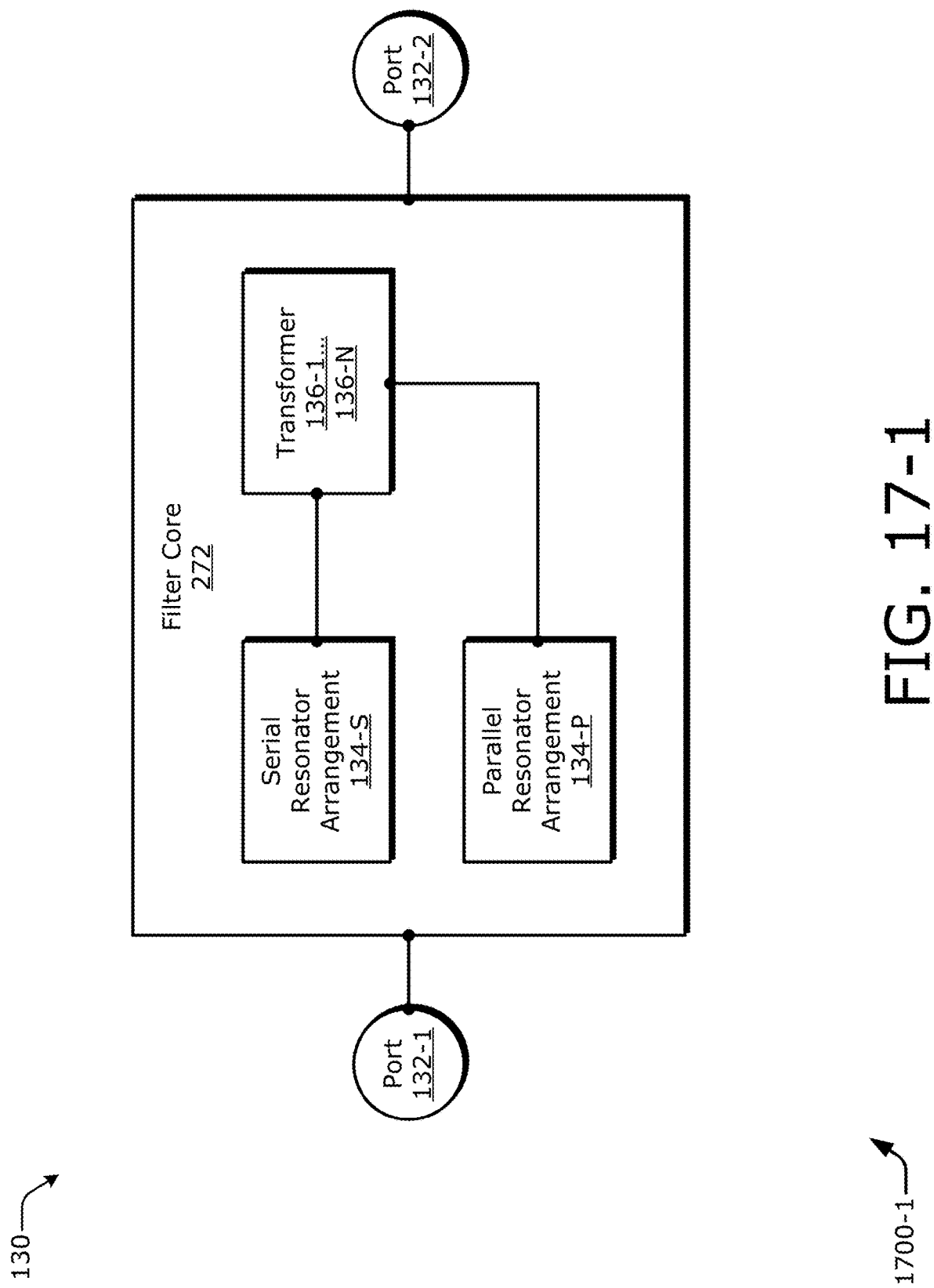
Figures 2, 17:
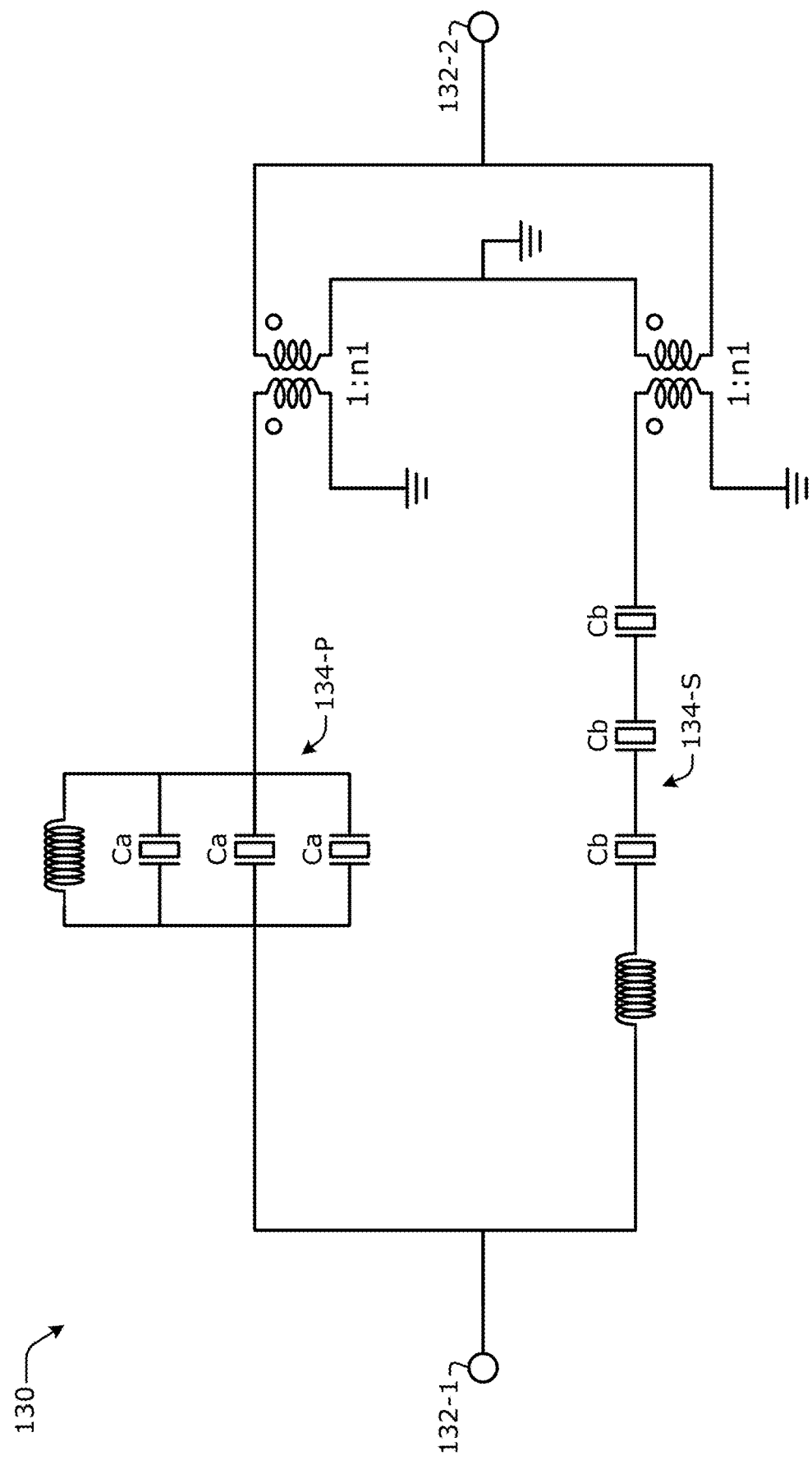
Figures 3, 17:
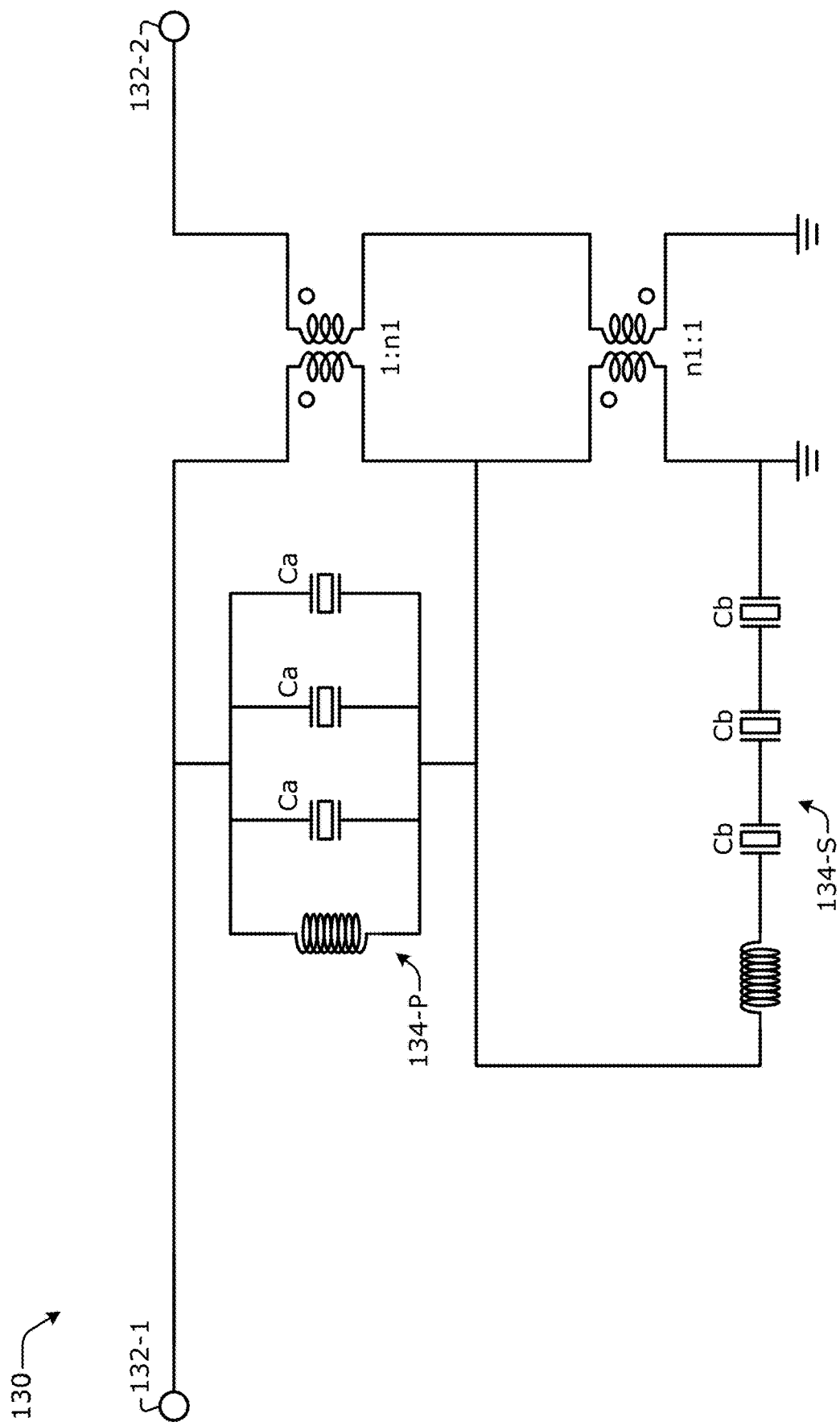
Figures 4, 17:
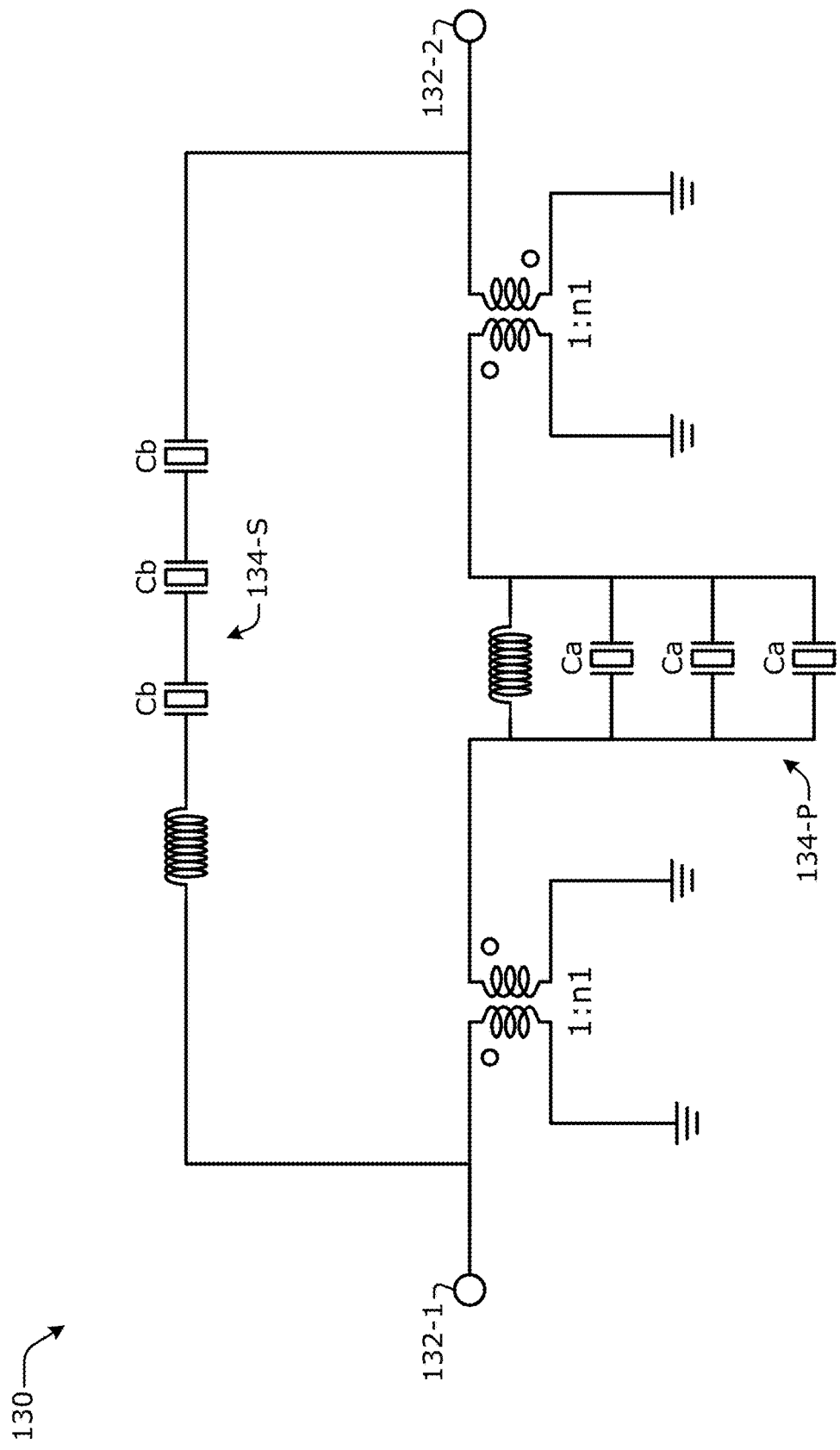
Figures 5, 17:
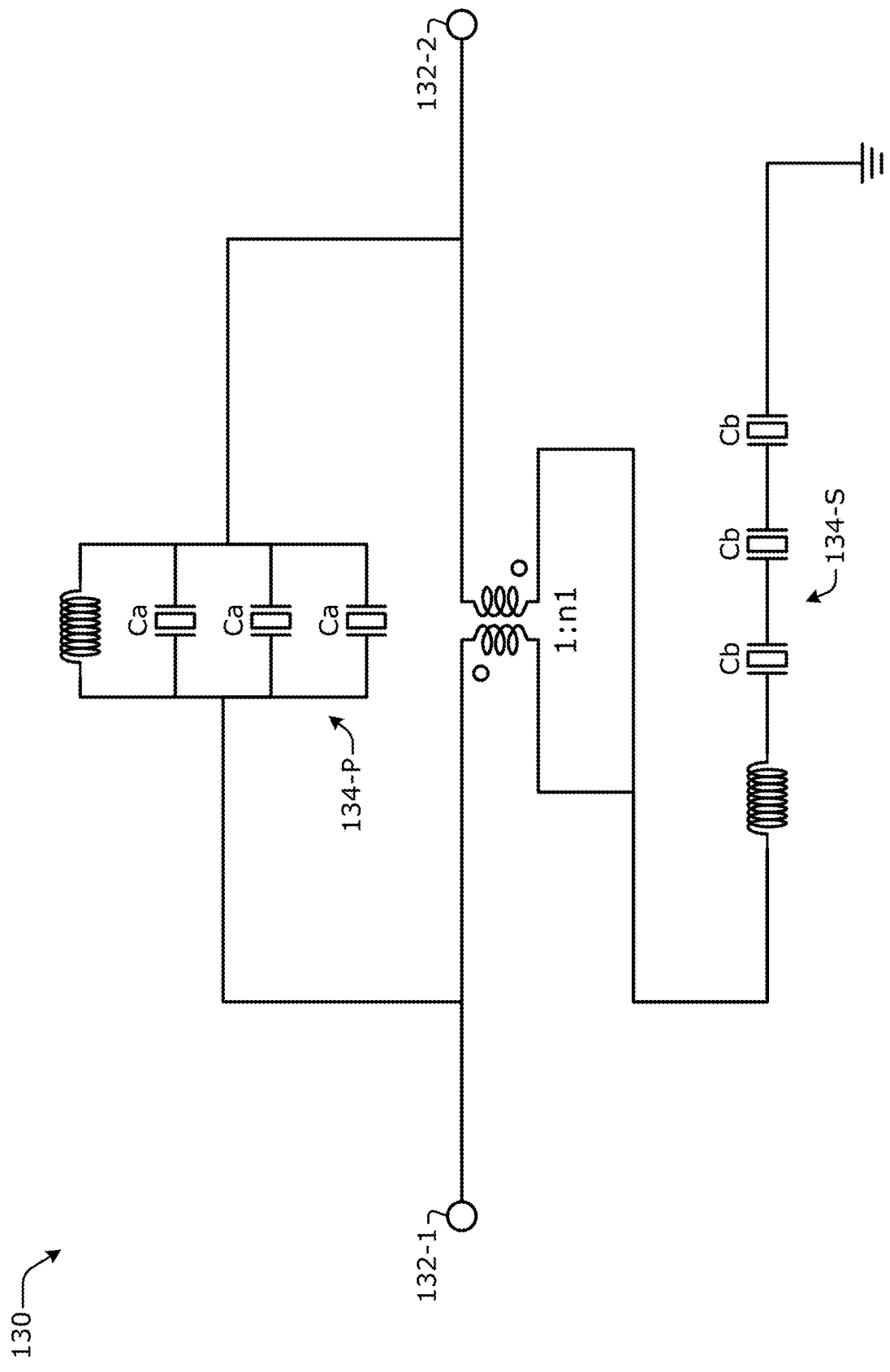
Figures 6, 17:
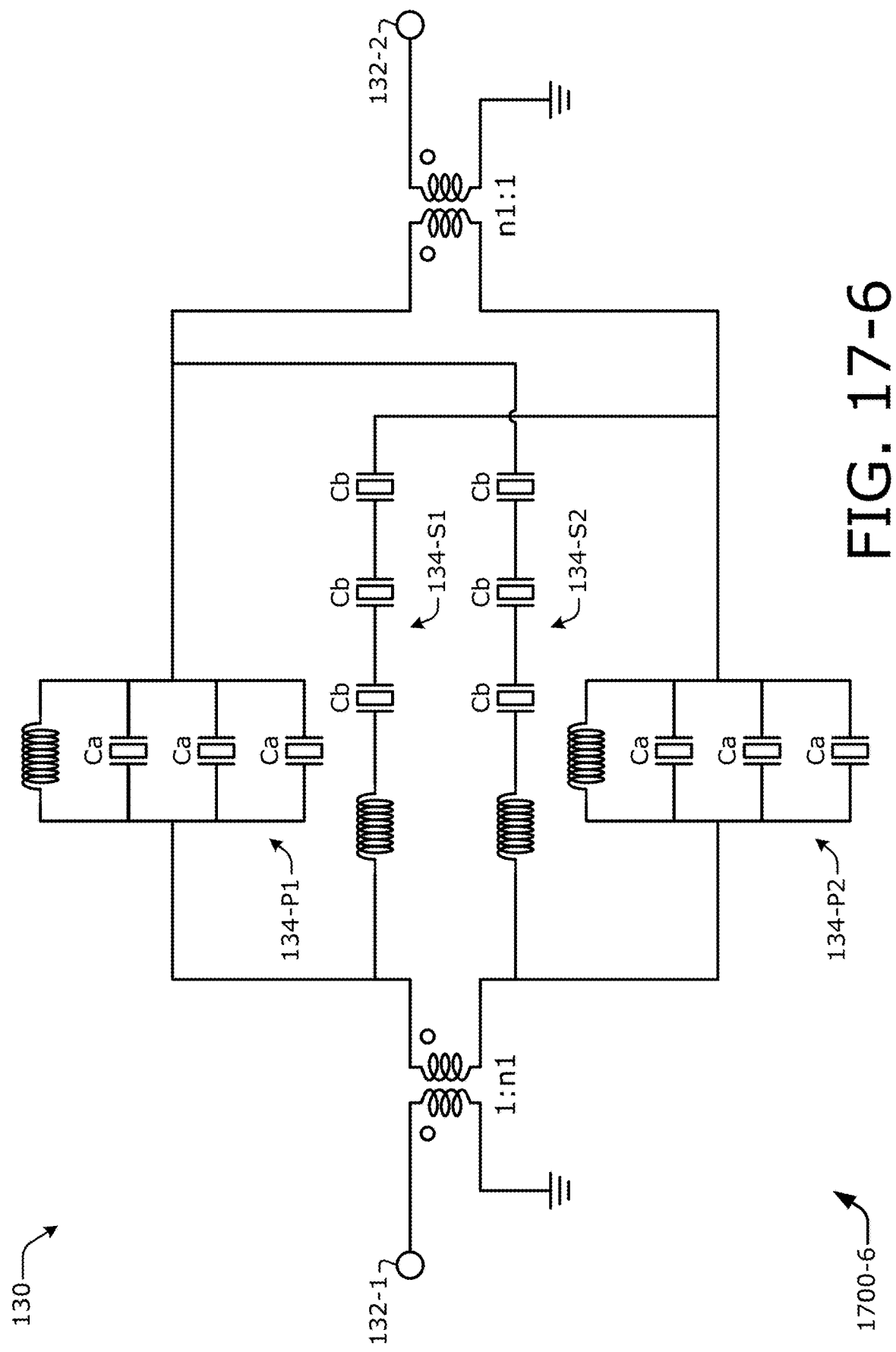
Figures 7, 17:
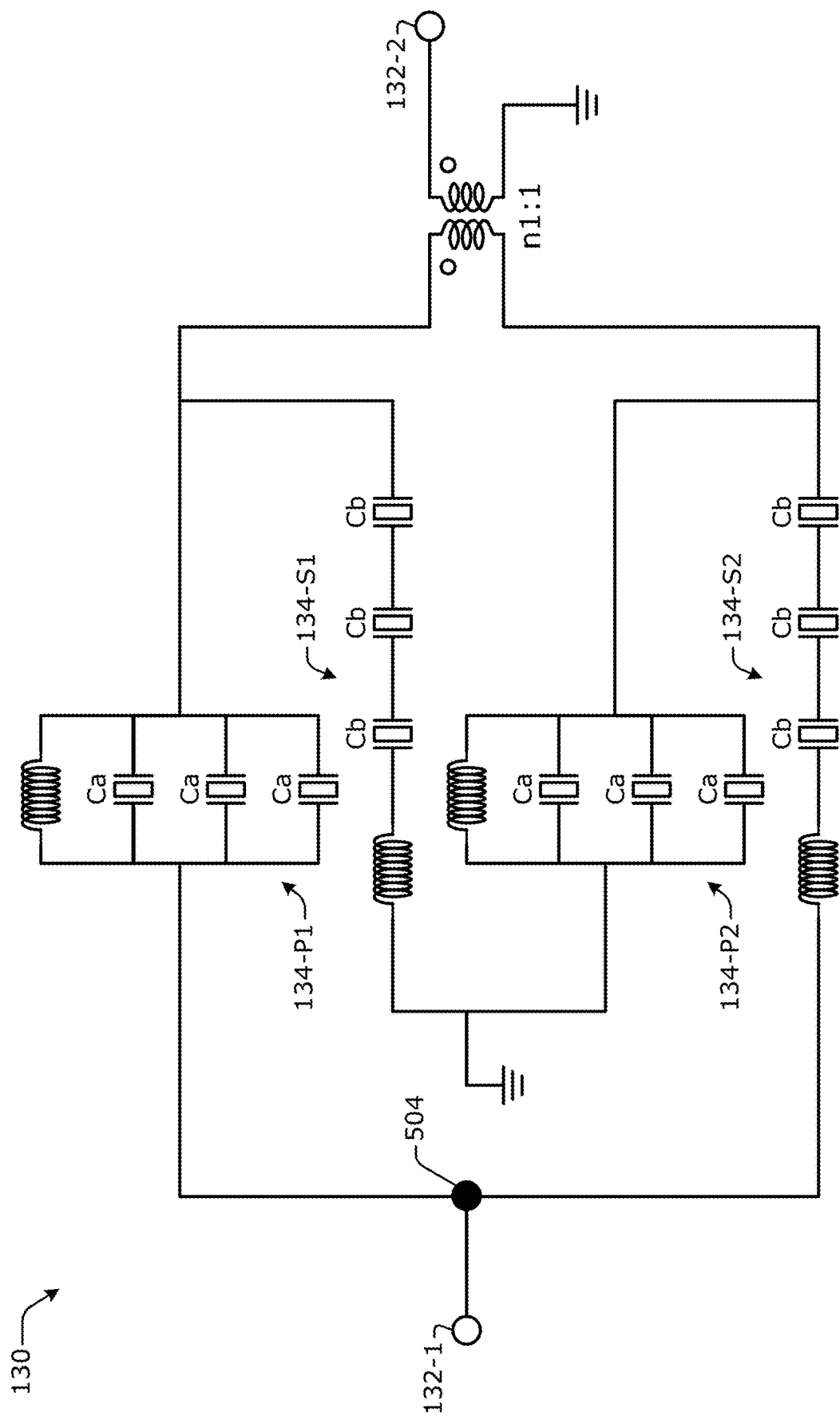

FIG. 17-1 is a schematic diagram 1700-1 illustrating an example of a bridge filter having a filter core 272 with a serial resonator arrangement 134-S and a parallel resonator arrangement 134-P to provide a band-stop filter response. As shown, the filter circuit 130 includes the filter core 272 coupled between a first port 132-1 and a second port 132-2. The filter core 272 includes at least one serial resonator arrangement 134-S (or series resonator arrangement 135-S), at least one parallel resonator arrangement 134-P, and at least one transformer 136, which is depicted as one or more transformers 136-1 . . . 136-N, with "N" representing a positive integer.

In example implementations, including at least one serial resonator arrangement 134-S and at least one parallel resonator arrangement 134-P within a same acoustic core can produce a band-stop filter or notch filter. Thus, a range of frequencies in the stop band or notch can be substantially rejected while other frequencies above and below the stop band are passed with relatively little attenuation. As shown in the FIGS. 17-2 to 17-7, each serial resonator arrangement 134-S and parallel resonator arrangement 134-P includes at least two acoustic resonators that are coupled together in series or in parallel, respectively. Thus, band-stop filters can be fabricated using any of the bridge-type filter architectures that are described herein by employing multiple acoustic resonators per resonator arrangement 134 using serial and parallel couplings.

FIGS. 17-2 to 17-7 are circuit diagrams 1700-2 to 1700-7, respectively, illustrating examples of how each bridge-type filter architecture (e.g., of FIGS. 3-1 to 3-6, respectively) can employ at least one serial resonator arrangement 134-S and at least one parallel resonator arrangement 134-P to provide a band-stop filter response. Although certain resonator arrangement positions are shown with serial versus parallel arrangements in the drawings, the arrangements may be swapped. Thus, a resonator arrangement that is depicted as being serial may be swapped with a parallel arrangement, and another resonator arrangement that is depicted as being parallel may be swapped with a serial arrangement to maintain the existence of both types of resonator arrangements in the filter core.

Example implementations for the circuit diagrams 1700-2 to 1700-7 are described next. The circuit diagram 1700-2 of FIG. 17-2 corresponds to the first bridge-type filter architecture that is described above with reference to FIG. 3-1. As shown in FIG. 17-2, the filter circuit 130 for this first bridge-type architecture includes a parallel resonator arrangement 134-P and a serial resonator arrangement 134-S. The circuit diagram 1700-3 of FIG. 17-3 corresponds to the second bridge-type filter architecture that is described above with reference to FIG. 3-2. As shown in FIG. 17-3, the filter circuit 130 for this second bridge-type architecture also includes a parallel resonator arrangement 134-P and a serial resonator arrangement 134-S.

The circuit diagram 1700-4 of FIG. 17-4 corresponds to the third bridge-type filter architecture that is described above with reference to FIG. 3-3. As shown in FIG. 17-4, the filter circuit 130 for this third bridge-type architecture includes a parallel resonator arrangement 134-P and a serial resonator arrangement 134-S. The circuit diagram 1700-5 of FIG. 17-5 corresponds to the fourth bridge-type filter architecture that is described above with reference to FIG. 3-4. As shown in FIG. 17-5, the filter circuit 130 for this fourth bridge-type architecture also includes a parallel resonator arrangement 134-P and a serial resonator arrangement 134-S.

The circuit diagram 1700-6 of FIG. 17-6 corresponds to the fifth bridge-type filter architecture that is described above with reference to FIG. 3-5. As shown in FIG. 17-6, the filter circuit 130 for this fifth bridge-type architecture includes a first parallel resonator arrangement 134-P1, a second parallel resonator arrangement 134-P2, a first serial resonator arrangement 134-S1, and a second serial resonator arrangement 134-S2. As shown in FIG. 17-6, the first and second serial resonator arrangements 134-S1 and 134-S2, which are coupled along the "X paths," have a substantially similar structure as per the fifth bridge-type filter architecture. Likewise, the first and second parallel resonator arrangements 134-P1 and 134-P2, which are coupled along the "inline paths," have a substantially similar structure. As described above, each resonator arrangement position may have its coupling type (e.g., serial or parallel) swapped with the other coupling type.

The circuit diagram 1700-7 of FIG. 17-7 corresponds to the sixth bridge-type filter architecture that is described above with reference to FIG. 3-6. As shown in FIG. 17-7, the filter circuit 130 for this sixth bridge-type architecture includes a first parallel resonator arrangement 134-P1, a second parallel resonator arrangement 134-P2, a first serial resonator arrangement 134-S1, and a second serial resonator arrangement 134-S2. As shown in FIG. 17-7, the first and second serial resonator arrangements 134-S1 and 134-S2, which are coupled along an "inline path" and a shunt coupling of the opposite inline path, have a substantially similar structure as per the sixth bridge-type filter architecture. Likewise, the first and second parallel resonator arrangements 134-P1 and 134-P2, which are coupled along one "inline path" and a shunt branch of the other inline path, have a substantially similar structure. As described above, each resonator arrangement position may have its coupling type (e.g., serial or parallel) swapped with the other coupling type.

IMPLEMENTATION EXAMPLES

This section describes some aspects of example implementations and/or example configurations related to the apparatuses and/or processes presented above.

Example aspect 1: An apparatus comprising:
a filter circuit comprising:
a first port that is single-ended;
a second port that is single-ended;
a transformer comprising a first terminal, a second terminal, and a third terminal, the third terminal coupled to the second port;
a first resonator coupled between the first port and the first terminal of the transformer;
a second resonator coupled between the first port and the second terminal of the transformer;
a third resonator coupled between the first terminal of the transformer and a ground; and
a fourth resonator coupled between the second terminal of the transformer and the ground.

Example aspect 2: The apparatus of example aspect 1, wherein:
the transformer comprises a fourth terminal; and
the fourth terminal of the transformer is coupled to the ground.

Example aspect 3: The apparatus of example aspect 2, wherein:
the transformer comprises a first inductor and a second inductor;
the first inductor is coupled between the first terminal and the second terminal of the transformer; and
the second inductor is coupled between the third terminal and the fourth terminal of the transformer.

Example aspect 4: The apparatus of example aspect 3, wherein:
the first inductor comprises a first coil; and
the second inductor comprises a second coil that is electromagnetically coupled to the first coil.

Example aspect 5: The apparatus of example aspect 3 or 4, wherein:
the first inductor comprises a first conductive line; and
the second inductor comprises a second conductive line that is electromagnetically coupled to the first conductive line.

Example aspect 6: The apparatus of any one of example aspects 3 to 5, wherein:
the first inductor comprises a first transmission line; and
the second inductor comprises a second transmission line that is electromagnetically coupled to the first transmission line along a broad side or an edge side of the first and second transmission lines.

Example aspect 7: The apparatus of any one of the preceding example aspects, wherein the filter circuit comprises a lattice-type filter.

Example aspect 8: The apparatus of any one of the preceding example aspects, wherein the first resonator is coupled to the second resonator via a common node.

Example aspect 9: The apparatus of example aspect 8, wherein:
the common node corresponds to a terminal of the first port; and
another terminal of the first port is coupled to the ground.

Example aspect 10: The apparatus of example aspect 8 or 9, further comprising:
a diplexer comprising:
the filter circuit; and
another filter circuit coupled to the filter circuit via the common node.

Example aspect 11: The apparatus of any one of the preceding example aspects, wherein:
the first resonator is substantially similar to the fourth resonator; and
the second resonator is substantially similar to the third resonator.

Example aspect 12: The apparatus of example aspect 11, wherein:
the first resonator has a substantially same structure as the fourth resonator; and
the second resonator has a substantially same structure as the third resonator.

Example aspect 13: The apparatus of example aspect 11 or 12, wherein:
a first impedance of the first resonator is substantially similar to a fourth impedance of the fourth resonator; and
a second impedance of the second resonator is substantially similar to a third impedance of the third resonator.

Example aspect 14: The apparatus of example aspect 13, wherein:
the first impedance is different from the second impedance and the third impedance.

Example aspect 15: The apparatus of any one of example aspects 11 to 14, wherein:
a first resonant frequency of the first resonator is substantially similar to a fourth resonant frequency of the fourth resonator; and
a second resonant frequency of the second resonator is substantially similar to a third resonant frequency of the third resonator.

Example aspect 16: The apparatus of example aspect 15, wherein:
the first resonant frequency is different from the second resonant frequency and the third resonant frequency.

Example aspect 17: The apparatus of any one of the preceding example aspects, wherein:
at least two resonators selected from a group of resonators including the first resonator, the second resonator, the third resonator, and the fourth resonator comprise at least two respective sets of multiple acoustic resonators.

Example aspect 18: The apparatus of example aspect 17, wherein each respective set of multiple acoustic resonators comprises multiple acoustic resonators coupled together in parallel.

Example aspect 19: The apparatus of example aspect 17 or 18, wherein each respective set of multiple acoustic resonators comprises multiple acoustic resonators coupled together in series.

Example aspect 20: The apparatus of any one of example aspects 17 to 19, wherein at least two acoustic resonators of each respective set of multiple acoustic resonators has a different resonant frequency from one another.

Example aspect 21: The apparatus of any one of example aspects 17 to 20, wherein at least two acoustic resonators of each respective set of multiple acoustic resonators has a different impedance from one another.

Example aspect 22: The apparatus of example aspect 21, wherein the different impedance comprises a different static capacitance.

Example aspect 23: The apparatus of any one of the preceding example aspects, wherein:
the first resonator comprises a first acoustic resonator having a first characteristic and a second acoustic resonator having a second characteristic, the first acoustic resonator coupled to the second acoustic resonator; and
the fourth resonator comprises a third acoustic resonator having a third characteristic and a fourth acoustic resonator having a fourth characteristic, the third acoustic resonator coupled to the fourth acoustic resonator.

Example aspect 24: The apparatus of example aspect 23, wherein:
each of the first characteristic, the second characteristic, the third characteristic, and the fourth characteristic is selected from a group of characteristics comprising an impedance and a resonant frequency.

Example aspect 25: The apparatus of example aspect 23 or 24, wherein:
a value of the first characteristic is different from a value of the second characteristic.

Example aspect 26: The apparatus of any one of example aspects 23 to 25, wherein:
a value of the first characteristic is substantially similar to a value of the third characteristic; and
a value of the second characteristic is substantially similar to a value of the fourth characteristic.

Example aspect 27: The apparatus of any one of the preceding example aspects, wherein the filter circuit comprises:
a capacitor coupled between the first terminal of the transformer and the second terminal of the transformer.

Example aspect 28: The apparatus of example aspect 27, wherein:
the capacitor is configured to compensate at least partially for the transformer having a coupling coefficient less than one (K<1).

Example aspect 29: The apparatus of any one of the preceding example aspects, wherein the filter circuit comprises:
an inductor coupled to the second terminal of the transformer.

Example aspect 30: The apparatus of example aspect 29, wherein:
the inductor is coupled between the second terminal of the transformer and the ground.

Example aspect 31: The apparatus of example aspect 30, wherein:
the filter circuit lacks another inductor being coupled between the first terminal of the transformer and the ground.

Example aspect 32: The apparatus of any one of example aspects 29 to 31, wherein:
the inductor is configured to compensate at least partially for a capacitive coupling that is present between two inductors of the transformer.

Example aspect 33: The apparatus of any one of example aspects 29 to 32, wherein:
the inductor comprises an asymmetric inductor relative to the first and second terminals of the transformer.

Example aspect 34: The apparatus of any one of the preceding example aspects, wherein:
the first terminal and the second terminal of the transformer are coupled to a common inductor of the transformer.

Example aspect 35: The apparatus of any one of the preceding example aspects, further comprising:
at least one radio-frequency front-end comprising the filter circuit.

Example aspect 36: The apparatus of example aspect 35, further comprising:
a wireless interface device comprising the at least one radio-frequency front-end;
a display screen; and
at least one processor operatively coupled to the display screen and at least a portion of the wireless interface device, the at least one processor configured to present one or more graphical images on the display screen based on one or more wireless signals communicated using the filter circuit of the wireless interface device.

Example aspect 37: An apparatus comprising:
a filter circuit comprising:
a first port;
a second port having a terminal that is coupled to a ground;
a transformer comprising a first terminal, a second terminal, and a third terminal, the third terminal coupled to another terminal of the second port;
first means for resonating coupled between the first port and the first terminal of the transformer;
second means for resonating coupled between the first port and the second terminal of the transformer;
third means for resonating coupled between the first terminal of the transformer and the ground; and
fourth means for resonating coupled between the second terminal of the transformer and the ground.

Example aspect 38: The apparatus of example aspect 37, wherein the first means for resonating comprises:
means for establishing a frequency response of the filter circuit using different resonant frequencies.

Example aspect 39: The apparatus of example aspect 37 or 38, wherein the filter circuit comprises:
means for compensating for a non-ideal coupling coefficient of the transformer.

Example aspect 40: The apparatus of any one of example aspects 37 to 39, wherein the filter circuit comprises:
means for compensating for a capacitive coupling between inductors of the transformer.

Example aspect 41: A method for filtering signals, the method comprising:
converting between a first signal and a first signal component and a second signal component;
propagating the first signal component through a first resonator and across a third resonator;
propagating the second signal component through a second resonator and across a fourth resonator;
routing the first signal component between the third resonator and a first terminal of a transformer;
routing the second signal component between the fourth resonator and a second terminal of the transformer; and
converting, using the transformer, between differential signaling of the first signal component and the second signal component and single-ended signaling of a second signal.

Example aspect 42: The method of example aspect 41, wherein:
the propagating of the first signal component comprises propagating the first signal component along a first path that includes the first resonator coupled to the first path in a series configuration and the third resonator coupled to the first path in a shunt configuration; and
the propagating of the second signal component comprises propagating the second signal component along a second path that includes the second resonator coupled to the second path in the series configuration and the fourth resonator coupled to the second path in the shunt configuration.

Example aspect 43: The method of example aspect 41 or 42, further comprising at least one of:
receiving the first signal from a common terminal of a diplexer; or
transmitting the first signal to the common terminal of the diplexer.

Example aspect 44: The method of any one of example aspects 41 to 43, wherein the propagating of the first signal component and the propagating of the second signal component comprise:
shifting a relative phase that separates the first signal component from the second signal component by approximately one hundred and eighty degrees (180°) between a common node and the first terminal and the second terminal of the transformer.

Example aspect 45: The method of any one of example aspects 41 to 44, wherein:
the propagating of the first signal component comprises filtering the first signal component using multiple first acoustic resonators of the first resonator, the multiple first acoustic resonators respectively having multiple first characteristics that differ from each other; and
the propagating of the second signal component comprises filtering the second signal component using multiple third acoustic resonators of the third resonator, the multiple third acoustic resonators respectively having multiple third characteristics that differ from each other, the multiple third characteristics being respectively substantially similar to the multiple first characteristics.

Example aspect 46: The method of any one of example aspects 41 to 45, wherein:
the routing of the first signal component comprises propagating the first signal component across a first terminal of a capacitor, the first terminal of the capacitor coupled to the first terminal of the transformer; and
the routing of the second signal component comprises propagating the second signal component across a second terminal of the capacitor, the second terminal of the capacitor coupled to the second terminal of the transformer.

Example aspect 47: The method of any one of example aspects 41 to 46, wherein the routing of the second signal component comprises:
propagating the second signal component across a terminal of an inductor that is coupled to the second terminal of the transformer.

Example aspect 48: An apparatus comprising:
a filter circuit comprising:
a first port that is single-ended;
a second port that is single-ended;
a transformer comprising a first terminal, a second terminal, and a third terminal, the third terminal coupled to the second port;
a first resonator coupled between the first port and the first terminal of the transformer;
a second resonator coupled between the first port and the second terminal of the transformer;
a third resonator coupled between the first terminal of the transformer and a ground;
a fourth resonator coupled between the second terminal of the transformer and the ground; and
an inductor coupled to the second terminal of the transformer.

Example aspect 49: The apparatus of example aspect 48, wherein:
the inductor is coupled between the second terminal of the transformer and the ground.

Example aspect 50: The apparatus of example aspect 48 or 49, wherein:
the filter circuit lacks another inductor being coupled between the first terminal of the transformer and the ground.

Example aspect 51: The apparatus of any one of example aspects 48 to 50, wherein:
the transformer comprises a fourth terminal; and
the fourth terminal of the transformer is coupled to the ground.

Example aspect 52: The apparatus of example aspect 51, wherein:
the second terminal of the transformer is closer to the fourth terminal of the transformer than the third terminal of the transformer.

Example aspect 53: The apparatus of any one of example aspects 48 to 52, wherein:
the inductor is configured to compensate at least partially for a capacitive coupling between two inductors of the transformer.

Example aspect 54: The apparatus of any one of example aspects 48 to 53, wherein:
the inductor comprises an asymmetric inductor relative to the first and second terminals of the transformer.

Example aspect 55: The apparatus of any one of example aspects 48 to 54, wherein the filter circuit comprises:
a capacitor coupled between the first terminal of the transformer and the second terminal of the transformer.

Example aspect 56: An apparatus comprising:
a filter circuit comprising:
- a transformer having a first inductor and a second inductor electromagnetically coupled to the first inductor, a first terminal of the second inductor coupled to an output port of the filter circuit, a second terminal of the second inductor coupled to a ground;
- a first resonator arrangement coupled between an input port of the filter circuit and a first terminal of the first inductor of the transformer;
- a second resonator arrangement coupled between the input port and a second terminal of the first inductor;
- a third resonator arrangement coupled between the first terminal of the first inductor and the ground; and
- a fourth resonator arrangement coupled between the second terminal of the first inductor and the ground.

Example aspect 57: The apparatus of example aspect 56, wherein the filter circuit further comprises:
a capacitor coupled between the first terminal of the first inductor and the second terminal of the first inductor.

Example aspect 58: The apparatus of example aspect 56 or 57, wherein the filter circuit further comprises:
a third inductor coupled to the second terminal of the first inductor.

Example aspect 59: The apparatus of example aspect 56 or 57, wherein the filter circuit further comprises:
a third inductor coupled to the first terminal of the first inductor.

Example aspect 60: The apparatus of any one of example aspects 56 to 59, wherein:
the first resonator arrangement is substantially similar to the fourth resonator arrangement; and
the second resonator arrangement is substantially similar to the third resonator arrangement.

Example aspect 61: An apparatus comprising:
a filter circuit comprising:
- a first port;
- a second port;
- a transformer comprising a first terminal, a second terminal, a third terminal, and a fourth terminal, the third terminal coupled to the second port, the fourth terminal coupled to a ground;
- a first resonator coupled between the first port and the first terminal of the transformer;
- a second resonator coupled between the first port and the second terminal of the transformer;
- a third resonator coupled between the first terminal of the transformer and the ground; and
- a fourth resonator coupled between the second terminal of the transformer and the ground.

Example aspect 62: An apparatus comprising:
a filter circuit comprising:
- a first port;
- a second port; and
- a filter core coupled between the first port and the second port, the filter core comprising:
  - at least one transformer;
  - a first resonator arrangement coupled to the at least one transformer, the first resonator arrangement comprising multiple acoustic resonators; and
  - a second resonator arrangement coupled to the at least one transformer, the second resonator arrangement comprising multiple acoustic resonators.

Example aspect 63: The apparatus of example aspect 62, wherein:
the multiple acoustic resonators of the first resonator arrangement are coupled together in series.

Example aspect 64: The apparatus of example aspect 62 or 63, wherein:
the multiple acoustic resonators of the first resonator arrangement comprise:
a first acoustic resonator having a first characteristic; and
a second acoustic resonator having a second characteristic; and
the first characteristic is different from the second characteristic.

Example aspect 65: The apparatus of example aspect 64, wherein:
the first characteristic comprises a resonant frequency of the first acoustic resonator; and
the second characteristic comprises a resonant frequency of the second acoustic resonator.

Example aspect 66: The apparatus of example aspect 64 or 65, wherein:
the first characteristic comprises a static capacitance of the first acoustic resonator; and
the second characteristic comprises a static capacitance of the second acoustic resonator.

Example aspect 67: The apparatus of any one of example aspects 62 to 66, wherein:
the multiple acoustic resonators of the first resonator arrangement are coupled together in parallel.

Example aspect 68: The apparatus of any one of example aspects 62 to 67, wherein:
the multiple acoustic resonators of the first resonator arrangement are coupled together in series; and
the multiple acoustic resonators of the second resonator arrangement are coupled together in series.

Example aspect 69: The apparatus of any one of example aspects 62 to 68, wherein:
the multiple acoustic resonators of the first resonator arrangement are coupled together in parallel; and
the multiple acoustic resonators of the second resonator arrangement are coupled together in parallel.

Example aspect 70: The apparatus of any one of example aspects 62 to 69, wherein the filter core comprises:
a third resonator arrangement coupled to the at least one transformer, the third resonator arrangement comprising multiple acoustic resonators; and
a fourth resonator arrangement coupled to the at least one transformer, the fourth resonator arrangement comprising multiple acoustic resonators.

Example aspect 71: The apparatus of example aspect 70, wherein:
the multiple acoustic resonators of the first resonator arrangement are coupled together in series;
the multiple acoustic resonators of the second resonator arrangement are coupled together in series;
the multiple acoustic resonators of the third resonator arrangement are coupled together in series; and
the multiple acoustic resonators of the fourth resonator arrangement are coupled together in series.

Example aspect 72: The apparatus of example aspect 70 or 71, wherein:
the multiple acoustic resonators of the first resonator arrangement each have a respective resonant frequency that is different from that of the one or more other acoustic resonators of the multiple acoustic resonators of the first resonator arrangement;
the multiple acoustic resonators of the second resonator arrangement each have a respective resonant frequency that is different from that of the one or more other acoustic resonators of the multiple acoustic resonators of the second resonator arrangement;

the multiple acoustic resonators of the third resonator arrangement each have a respective resonant frequency that is different from that of the one or more other acoustic resonators of the multiple acoustic resonators of the third resonator arrangement; and the multiple acoustic resonators of the fourth resonator arrangement each have a respective resonant frequency that is different from that of the one or more other acoustic resonators of the multiple acoustic resonators of the fourth resonator arrangement.

Example aspect 73: The apparatus of any one of example aspects 62 to 72, wherein:
the filter core comprises a bridge-type filter architecture.

Example aspect 74: The apparatus of any one of example aspects 62 to 73, wherein:
the filter core comprises a first filter core;
the filter circuit comprises a second filter core coupled between the first port and the second port; and
the first filter core and the second filter core are cascaded in series between the first port and the second port.

Example aspect 75: The apparatus of example aspect 74, wherein:
the filter circuit comprises an inductor;
the first filter core, the second filter core, and the inductor are coupled together in series between the first port and the second port; and
the inductor is coupled between the first filter core and the second filter core.

Example aspect 76: The apparatus of example aspect 75, wherein:
the filter circuit comprises an acoustic resonator; and
the acoustic resonator is coupled in parallel with the inductor.

Example aspect 77: The apparatus of example aspect 75, wherein:
the inductor comprises a first inductor;
the filter circuit comprises a second inductor, a first acoustic resonator, and a second acoustic resonator;
the first acoustic resonator is coupled in series with the first inductor; and
the second acoustic resonator is coupled in series with the second inductor.

Example aspect 78: The apparatus of any one of example aspects 62 to 77, wherein the filter circuit comprises:
an impedance inverter coupled between the first port and the second port.

Example aspect 79: The apparatus of example aspect 78, wherein:
the impedance inverter is coupled in series with respect to the first port and the second port; and
the impedance inverter is coupled in parallel with the filter core.

Example aspect 80: The apparatus of example aspect 78 or 79, wherein:
the impedance inverter comprises an inductor.

Example aspect 81: The apparatus of any one of example aspects 78 to 80, wherein:
the impedance inverter comprises a Pi network.

Example aspect 82: The apparatus of example aspect 81, wherein the Pi network comprises:
an inductor coupled between the first port and the second port;
a first capacitor coupled between the first port and a ground; and a second capacitor coupled between the second port and the ground.

Example aspect 83: The apparatus of any one of example aspects 78 to 82, wherein:
the impedance inverter comprises at least one terminal; and
the at least one terminal of the impedance inverter is coupled between a terminal of the at least one transformer and the second port.

Example aspect 84: The apparatus of example aspect 83, wherein:
the at least one terminal of the impedance inverter comprises a second terminal of the impedance inverter;
the impedance inverter comprises a first terminal and the second terminal;
the at least one transformer of the filter core comprises a second transformer of the filter core;
the filter core comprises a first transformer and the second transformer;
the first terminal of the impedance inverter is coupled between a terminal of the first transformer and the first port; and
the second terminal of the impedance inverter is coupled between the terminal of the second transformer and the second port.

Example aspect 85: The apparatus of any one of example aspects 62 to 84, wherein:
the multiple acoustic resonators of the first resonator arrangement are coupled together in series; and
the multiple acoustic resonators of the second resonator arrangement are coupled together in parallel.

Example aspect 86: The apparatus of any one of example aspects 62 to 85, wherein:
the filter core comprises:
a third resonator arrangement coupled to the at least one transformer, the third resonator arrangement comprising multiple acoustic resonators; and
a fourth resonator arrangement coupled to the at least one transformer, the fourth resonator arrangement comprising multiple acoustic resonators;
the multiple acoustic resonators of the third resonator arrangement are coupled together in series; and
the multiple acoustic resonators of the fourth resonator arrangement are coupled together in parallel.

Example aspect 87: The apparatus of any one of example aspects 62 to 86, wherein the filter core comprises:
a first inductor coupled in series with the multiple acoustic resonators of the first resonator arrangement; and
a second inductor coupled in parallel with the multiple acoustic resonators of the second resonator arrangement.

Example aspect 88: The apparatus of any one of example aspects 62 to 87, further comprising:
at least one radio-frequency front-end comprising the filter circuit.

Example aspect 89: The apparatus of example aspect 88, further comprising:
a wireless interface device comprising the at least one radio-frequency front-end;
a display screen; and
at least one processor operatively coupled to the display screen and at least a portion of the wireless interface device, the at least one processor configured to present one or more graphical images on the display screen based on one or more wireless signals communicated using the filter circuit of the wireless interface device.

Example aspect 90: An apparatus comprising:
a filter circuit comprising:
  a first port;
  a second port; and
  a filter core coupled between the first port and the second port, the filter core comprising:
    at least one transformer;
    first means for diversifying a first resonator arrangement; and
    second means for diversifying a second resonator arrangement.

Example aspect 91: An apparatus comprising:
a filter circuit comprising:
  a first port;
  a second port;
  a first filter core comprising a bridge-type filter architecture having multiple acoustic resonators, the first filter core coupled between the first port and the second port; and
  a second filter core comprising a bridge-type filter architecture having multiple acoustic resonators, the second filter core coupled between the first port and the second port,
  the first filter core and the second filter core cascaded in series between the first port and the second port.

Example aspect 92: The apparatus of example aspect 91, wherein:
  the filter circuit comprises an inductor;
  the first filter core, the second filter core, and the inductor are coupled together in series between the first port and the second port; and
  the inductor is coupled between the first filter core and the second filter core.

Example aspect 93: The apparatus of example aspect 92, wherein:
  the inductor is coupled in parallel with respect to the multiple acoustic resonators of the first filter core and the multiple acoustic resonators of the second filter core.

Example aspect 94: The apparatus of example aspect 93, wherein:
  the filter circuit comprises an acoustic resonator; and
  the acoustic resonator is coupled in parallel with the inductor.

Example aspect 95: The apparatus of example aspect 92, wherein:
  the inductor comprises a first inductor;
  the filter circuit comprises a second inductor;
  the first inductor is coupled in series with respect to the multiple acoustic resonators of the first filter core and the multiple acoustic resonators of the second filter core; and
  the second inductor is coupled in series with respect to the multiple acoustic resonators of the first filter core and the multiple acoustic resonators of the second filter core.

Example aspect 96: The apparatus of example aspect 95, wherein:
  the filter circuit comprises a first acoustic resonator and a second acoustic resonator;
  the first acoustic resonator is coupled in series with the first inductor; and
  the second acoustic resonator is coupled in series with the second inductor.

Example aspect 97: An apparatus comprising:
a filter circuit comprising:
  a first port;
  a second port;
  a first filter core comprising means for filtering with multiple acoustic resonators, the first filter core coupled between the first port and the second port; and
  a second filter core comprising means for filtering with multiple acoustic resonators, the second filter core coupled between the first port and the second port,
  the first filter core and the second filter core cascaded in series between the first port and the second port.

CONCLUSION

As used herein, the terms "couple," "coupled," or "coupling" refer to a relationship between two or more components that are in operative communication with each other to implement some feature or realize some capability that is described herein. The coupling can be realized using, for instance, a physical line, such as a metal trace or wire, or an electromagnetic coupling, such as with a transformer. A coupling can include a direct coupling or an indirect coupling. A direct coupling refers to connecting discrete circuit elements via a same node without an intervening element. An indirect coupling refers to connecting discrete circuit elements via one or more other devices or other discrete circuit elements, including two or more different nodes.

The term "port" (e.g., including a "first port" or a "filter port") represents at least a point of electrical connection at or proximate to the input or output of a component or between two or more components (e.g., active or passive circuit elements or parts). Although at times a port may be visually depicted in a drawing as a single point (or a circle), the port can represent an inter-connected portion of a physical circuit or network that has at least approximately a same voltage potential at or along the portion. In other words, a single-ended port can represent at least one point (e.g., a node) of multiple points along a conducting medium (e.g., a wire or trace) that exists between electrically connected components. In some cases, a "port" can represent at least one node that represents or corresponds to an input or an output of a component, such as a filter or part thereof. Similarly, a "terminal" or a "node" may represent one or more points with at least approximately a same voltage potential relative to an input or output of a component.

The terms "first," "second," "third," and other numeric-related indicators are used herein to identify or distinguish similar or analogous items from one another within a given context—such as a particular implementation, a single drawing figure, a given component, or a claim. Thus, a first item in one context may differ from a first item in another context. For example, an item identified as a "first port" in one context may be identified as a "second port" in another context. Similarly, a "first acoustic resonator" or a "first characteristic" in one claim may be recited as a "second acoustic resonator" or a "third characteristic," respectively, in a different claim.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Also, as used herein, a phrase referring to "at least one of" a list of items refers to any combination of those items, including single members.

For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description.

Although implementations for bridge-type filters have been described in language specific to certain features and/or methods, the subject of the appended claims is not necessarily limited to the specific features or methods described. Rather, the specific features and methods are disclosed as example implementations for bridge-type filters.

What is claimed is:

1. An apparatus comprising:
   a filter circuit comprising:
   a first port that is single-ended;
   a second port that is single-ended;
   a transformer comprising a first terminal, a second terminal, and a third terminal, the third terminal coupled to the second port;
   a first resonator coupled between the first port and the first terminal of the transformer, the first resonator comprising a first acoustic resonator having a first characteristic and a second acoustic resonator having a second characteristic, the first acoustic resonator coupled to the second acoustic resonator;
   a second resonator coupled between the first port and the second terminal of the transformer;
   a third resonator coupled between the first terminal of the transformer and a ground; and
   a fourth resonator coupled between the second terminal of the transformer and the ground, the fourth resonator comprising a third acoustic resonator having a third characteristic and a fourth acoustic resonator having a fourth characteristic, the third acoustic resonator coupled to the fourth acoustic resonator.

2. The apparatus of claim 1, wherein:
   the transformer comprises a fourth terminal; and
   the fourth terminal of the transformer is coupled to the ground.

3. The apparatus of claim 2, wherein:
   the transformer comprises a first inductor and a second inductor;
   the first inductor is coupled between the first terminal and the second terminal of the transformer; and
   the second inductor is coupled between the third terminal and the fourth terminal of the transformer.

4. The apparatus of claim 3, wherein:
   the first inductor comprises a first coil; and
   the second inductor comprises a second coil that is electromagnetically coupled to the first coil.

5. The apparatus of claim 2, wherein the filter circuit comprises a lattice-type filter.

6. The apparatus of claim 1, wherein the first resonator is coupled to the second resonator via a common node.

7. The apparatus of claim 6, wherein:
   the common node corresponds to a terminal of the first port; and
   another terminal of the first port is coupled to the ground.

8. The apparatus of claim 6, further comprising:
   a diplexer comprising:
   the filter circuit; and
   another filter circuit coupled to the filter circuit via the common node.

9. The apparatus of claim 1, wherein:
   the first resonator is substantially similar to the fourth resonator; and
   the second resonator is substantially similar to the third resonator.

10. The apparatus of claim 9, wherein:
    the first resonator has a substantially same structure as the fourth resonator; and
    the second resonator has a substantially same structure as the third resonator.

11. The apparatus of claim 9, wherein:
    a first impedance of the first resonator is substantially similar to a fourth impedance of the fourth resonator; and
    a second impedance of the second resonator is substantially similar to a third impedance of the third resonator.

12. The apparatus of claim 11, wherein:
    the first impedance is different from the second impedance and the third impedance.

13. The apparatus of claim 9, wherein:
    a first resonant frequency of the first resonator is substantially similar to a fourth resonant frequency of the fourth resonator; and
    a second resonant frequency of the second resonator is substantially similar to a third resonant frequency of the third resonator.

14. The apparatus of claim 13, wherein:
    the first resonant frequency is different from the second resonant frequency and the third resonant frequency.

15. The apparatus of claim 1, wherein:
    at least two resonators selected from a group of resonators including the first resonator, the second resonator, the third resonator, and the fourth resonator comprise at least two respective sets of multiple acoustic resonators.

16. The apparatus of claim 15, wherein each respective set of multiple acoustic resonators comprises multiple acoustic resonators coupled together in parallel.

17. The apparatus of claim 15, wherein each respective set of multiple acoustic resonators comprises multiple acoustic resonators coupled together in series.

18. The apparatus of claim 15, wherein at least two acoustic resonators of each respective set of multiple acoustic resonators has a different resonant frequency from one another.

19. The apparatus of claim 15, wherein at least two acoustic resonators of each respective set of multiple acoustic resonators has a different impedance from one another.

20. The apparatus of claim 1, wherein:
    the first characteristic is within ten percent (10%) of the third characteristic; and
    the second characteristic is within ten percent (10%) of the fourth characteristic.

21. The apparatus claim 1, wherein:
    each of the first characteristic, the second characteristic, the third characteristic, and the fourth characteristic is selected from a group of characteristics comprising an impedance and a resonant frequency.

22. The apparatus of claim 1, wherein:
    a value of the first characteristic is different from a value of the second characteristic.

23. The apparatus of claim 1, wherein:
    a value of the first characteristic is substantially similar to a value of the third characteristic; and
    a value of the second characteristic is substantially similar to a value of the fourth characteristic.

24. The apparatus of claim 1, wherein the filter circuit comprises:
a capacitor coupled between the first terminal of the transformer and the second terminal of the transformer.

25. The apparatus of claim 1, wherein the filter circuit comprises:
an inductor coupled to the second terminal of the transformer.

26. The apparatus of claim 25, wherein:
the inductor is coupled between the second terminal of the transformer and the ground.

27. The apparatus of claim 26, wherein:
the filter circuit lacks another inductor being coupled between the first terminal of the transformer and the ground.

28. The apparatus of claim 25, wherein:
the inductor comprises an asymmetric inductor relative to the first and second terminals of the transformer.

29. The apparatus of claim 1, wherein:
the first terminal and the second terminal of the transformer are coupled to a common inductor of the transformer.

30. An apparatus comprising:
at least one radio-frequency front-end comprising a filter circuit, the filter circuit comprising:
a first port that is single-ended;
a second port that is single-ended;
a transformer comprising a first terminal, a second terminal, and a third terminal, the third terminal coupled to the second port;
a first resonator coupled between the first port and the first terminal of the transformer;
a second resonator coupled between the first port and the second terminal of the transformer;
a third resonator coupled between the first terminal of the transformer and a ground; and
a fourth resonator coupled between the second terminal of the transformer and the ground.

31. The apparatus of claim 30, further comprising:
a wireless interface device comprising the at least one radio-frequency front-end;
a display screen; and
at least one processor operatively coupled to the display screen and at least a portion of the wireless interface device, the at least one processor configured to present one or more graphical images on the display screen based on one or more wireless signals communicated using the filter circuit of the wireless interface device.

32. An apparatus comprising:
a filter circuit comprising:
a first port;
a second port having a terminal that is coupled to a ground;
a transformer comprising a first terminal, a second terminal, and a third terminal, the third terminal coupled to another terminal of the second port;
first means for resonating coupled between the first port and the first terminal of the transformer, the first means for resonating comprising a first acoustic resonator having a first characteristic and a second acoustic resonator having a second characteristic, the first acoustic resonator coupled to the second acoustic resonator;
second means for resonating coupled between the first port and the second terminal of the transformer;
third means for resonating coupled between the first terminal of the transformer and the ground; and
fourth means for resonating coupled between the second terminal of the transformer and the ground, the fourth means for resonating comprising a third acoustic resonator having a third characteristic and a fourth acoustic resonator having a fourth characteristic, the third acoustic resonator coupled to the fourth acoustic resonator.

33. The apparatus of claim 32, wherein the first means for resonating comprises:
means for establishing a frequency response of the filter circuit using different resonant frequencies for the first characteristic of the first acoustic resonator and for the second characteristic of the second acoustic resonator.

34. The apparatus of claim 32, wherein the filter circuit comprises:
means for compensating for a non-ideal coupling coefficient of the transformer.

35. The apparatus of claim 32, wherein the filter circuit comprises:
means for compensating for a capacitive coupling between inductors of the transformer.

36. A method for filtering signals, the method comprising:
converting from a first signal to a first signal component and a second signal component;
propagating the first signal component through a first resonator and across a third resonator;
propagating the second signal component through a second resonator and across a fourth resonator;
routing the first signal component from the third resonator to a first terminal of a transformer;
routing the second signal component from the fourth resonator to a second terminal of the transformer; and
converting, using the transformer and responsive to the routing of the first signal component and the routing of the second signal component, from differential signaling that includes the first signal component and the second signal component to single-ended signaling of a second signal.

37. The method of claim 36, wherein:
the propagating of the first signal component comprises propagating the first signal component along a first path that includes the first resonator coupled to the first path in a series configuration and the third resonator coupled to the first path in a shunt configuration; and
the propagating of the second signal component comprises propagating the second signal component along a second path that includes the second resonator coupled to the second path in the series configuration and the fourth resonator coupled to the second path in the shunt configuration.

38. The method of claim 36, wherein the propagating of the first signal component and the propagating of the second signal component comprise:
shifting a relative phase that separates the first signal component from the second signal component by approximately one hundred and eighty degrees) (180°) between a common node and the first and second terminals of the transformer.

39. The method of claim 36, wherein:
the propagating of the first signal component comprises filtering the first signal component using multiple first acoustic resonators of the first resonator, the multiple first acoustic resonators respectively having multiple first characteristics that differ from each other; and
the propagating of the second signal component comprises filtering the second signal component using multiple third acoustic resonators of the third resonator, the multiple third acoustic resonators respectively having multiple third characteristics that differ from each other, the multiple third characteristics being respectively substantially similar to the multiple first characteristics.

40. The method of claim 36, wherein:
the routing of the first signal component comprises propagating the first signal component across a first terminal of a capacitor, the first terminal of the capacitor coupled to the first terminal of the transformer; and
the routing of the second signal component comprises propagating the second signal component across a second terminal of the capacitor, the second terminal of the capacitor coupled to the second terminal of the transformer.

41. The method of claim 36, wherein the routing of the second signal component comprises:
propagating the second signal component across a terminal of an inductor that is coupled to the second terminal of the transformer.

42. An apparatus comprising:
a filter circuit comprising:
  a transformer having a first inductor and a second inductor electromagnetically coupled to the first inductor, a first terminal of the second inductor coupled to an output port of the filter circuit, a second terminal of the second inductor coupled to a ground;
  a first resonator arrangement coupled between an input port of the filter circuit and a first terminal of the first inductor of the transformer, the first resonator arrangement comprising a first acoustic resonator having a first characteristic and a second acoustic resonator having a second characteristic, the first acoustic resonator coupled to the second acoustic resonator;
  a second resonator arrangement coupled between the input port and a second terminal of the first inductor;
  a third resonator arrangement coupled between the first terminal of the first inductor and the ground; and
  a fourth resonator arrangement coupled between the second terminal of the first inductor and the ground, the fourth resonator arrangement comprising a third acoustic resonator having a third characteristic and a fourth acoustic resonator having a fourth characteristic, the third acoustic resonator coupled to the fourth acoustic resonator.

43. The apparatus of claim 42, wherein the filter circuit further comprises:
a capacitor coupled between the first terminal of the first inductor and the second terminal of the first inductor.

44. The apparatus of claim 42, wherein the filter circuit further comprises:
a third inductor coupled to the second terminal of the first inductor.

45. The apparatus of claim 42, wherein the filter circuit further comprises:
a third inductor coupled to the first terminal of the first inductor.

46. The apparatus of claim 42, wherein:
the first resonator arrangement is substantially similar to the fourth resonator arrangement; and
the second resonator arrangement is substantially similar to the third resonator arrangement.

* * * * *

UNITED STATES PATENT AND TRADEMARK OFFICE
CERTIFICATE OF CORRECTION

| | | |
|---|---|---|
| PATENT NO. | : 12,231,112 B2 | Page 1 of 1 |
| APPLICATION NO. | : 17/934414 | |
| DATED | : February 18, 2025 | |
| INVENTOR(S) | : Edgar Schmidhammer et al. | |

It is certified that error appears in the above-identified patent and that said Letters Patent is hereby corrected as shown below:

On the Title Page

(71) "Applicant: RF360 EUROPE GMBH, Munich (DE)" is replaced with "Applicant: RF 360 Singapore Pte. Ltd".

Signed and Sealed this
Eighteenth Day of March, 2025

Coke Morgan Stewart
*Acting Director of the United States Patent and Trademark Office*